(12) United States Patent  
Arai

(10) Patent No.: US 6,940,152 B2  
(45) Date of Patent: Sep. 6, 2005

(54) SEMICONDUCTOR STORAGE DEVICE AND ITS MANUFACTURING METHOD

(75) Inventor: Masatoshi Arai, Ikoma (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 59 days.

(21) Appl. No.: 10/473,573

(22) PCT Filed: Feb. 5, 2003

(86) PCT No.: PCT/JP03/01201

§ 371 (c)(1),
(2), (4) Date: Oct. 1, 2003

(87) PCT Pub. No.: WO03/071606

PCT Pub. Date: Aug. 28, 2003

(65) Prior Publication Data

US 2004/0102004 A1 May 27, 2004

(30) Foreign Application Priority Data

Feb. 21, 2002 (JP) ...................... 2002-044202

(51) Int. Cl.[7] ............................................. H01L 23/58
(52) U.S. Cl. ...................................... 257/649; 257/538
(58) Field of Search ......................... 257/649, 68, 296, 257/213, 219, 249, 254, 288, 385, 387, 388, 399, 408, 549, 754, 755, 756, 538

(56) References Cited

U.S. PATENT DOCUMENTS 5,051,796 A 9/1991 Gill
6,069,058 A * 5/2000 Hong ........................... 438/436
6,166,958 A 12/2000 Naruke et al.
6,287,907 B1 9/2001 Ito et al.
6,380,598 B1 * 4/2002 Chan ............................ 257/390
6,455,884 B1 * 9/2002 Chan et al. ................... 257/296
6,656,803 B2 * 12/2003 Chan ............................ 438/284

FOREIGN PATENT DOCUMENTS

| JP | 60-3159 | 1/1985 |
| JP | 2-177564 | 7/1990 |
| JP | 03-217054 | 9/1991 |
| JP | 03-263874 | 11/1991 |
| JP | 05-326893 | 12/1993 |
| JP | 6-37284 | 2/1994 |
| JP | 11-330427 | 11/1999 |
| JP | 2000-260890 | 9/2000 |
| JP | 2002-43445 | 2/2002 |
| JP | 2002-110821 | 4/2002 |

* cited by examiner

Primary Examiner—David Nhu
(74) Attorney, Agent, or Firm—McDermott Will & Emery LLP

(57) ABSTRACT

A plurality of impurity diffusion layers working as bit lines are formed in surface portions of a semiconductor substrate, and a plurality of buried insulating films are formed above the plural impurity diffusion layers on the semiconductor substrate. Gate electrodes of memory devices include a plurality of first polysilicon films, which are formed between the buried insulating films with a trapping film formed below and have top faces at substantially the same level as top faces of the buried insulating films, and a second polysilicon film formed over the plural buried insulating films and the plural first polysilicon films for electrically connecting the plural first polysilicon films to one another.

15 Claims, 60 Drawing Sheets

FIG. 5
(a) 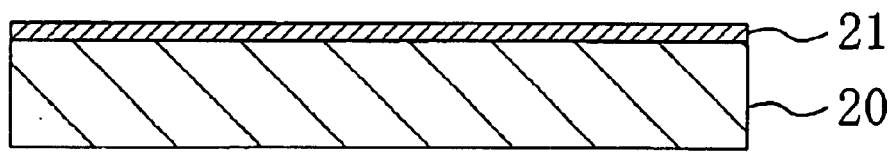
(b) 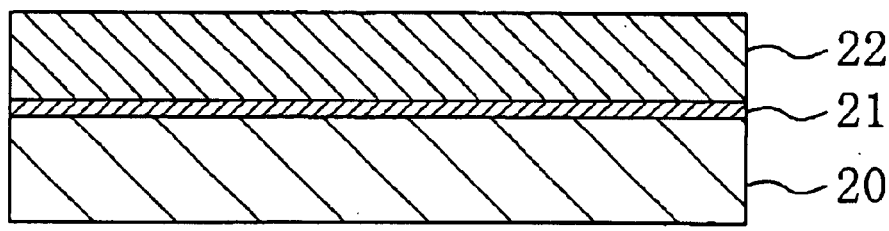
(c) 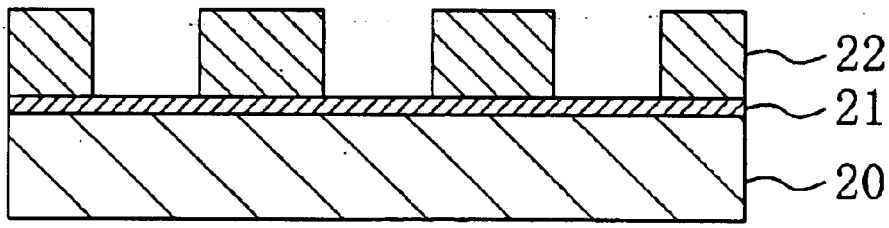
(d) 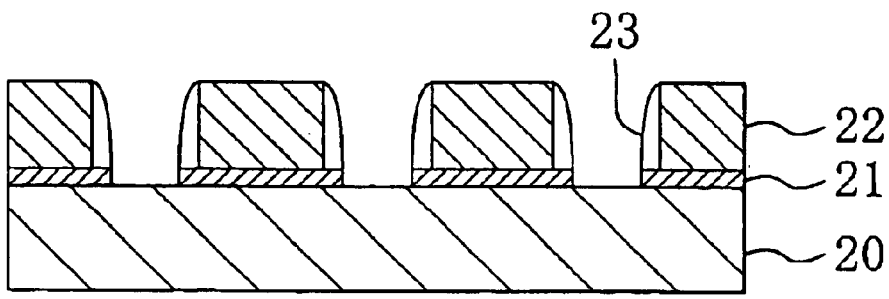

FIG. 17
(a) 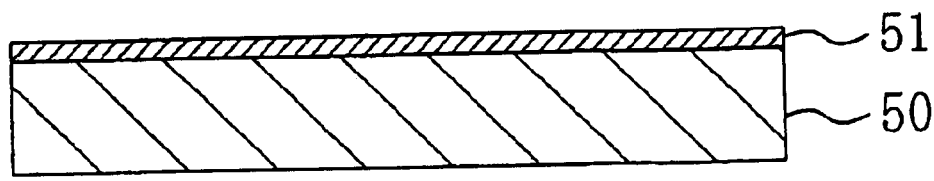
(b) 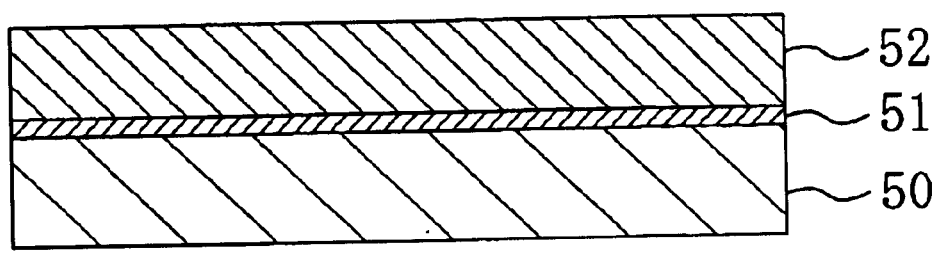
(c) 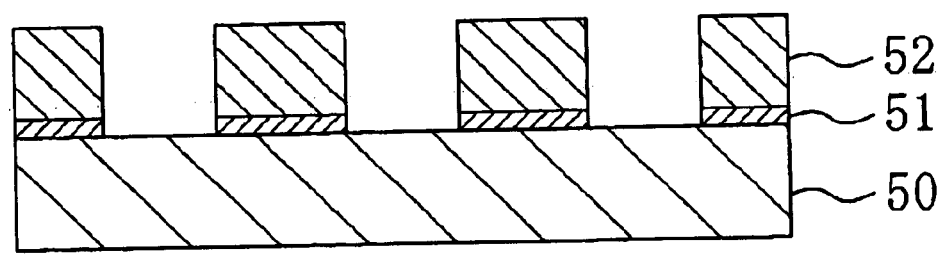
(d) 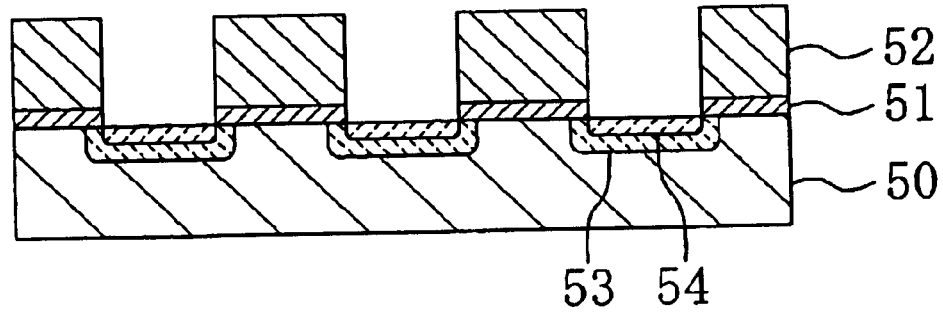

FIG. 39
(a) 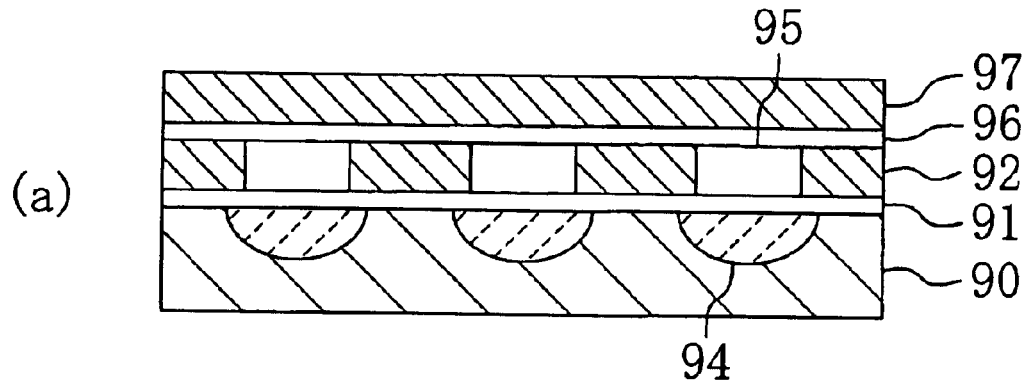
(b) 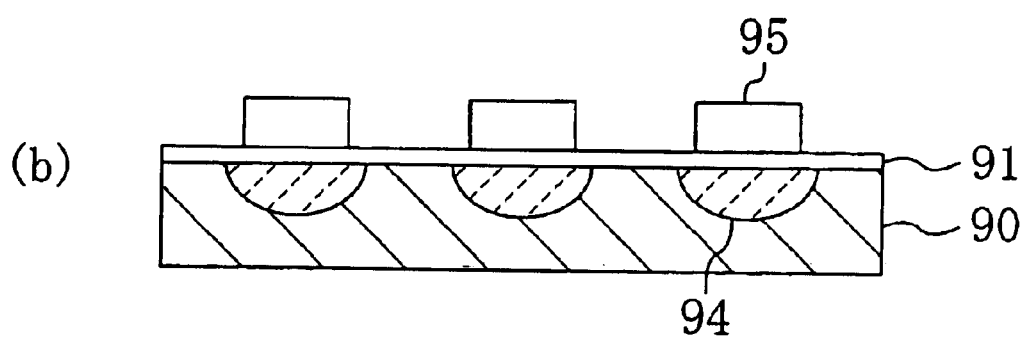
(c) 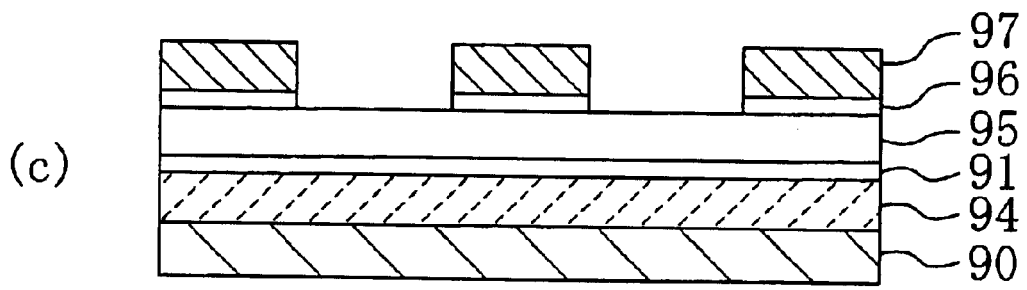
(d) 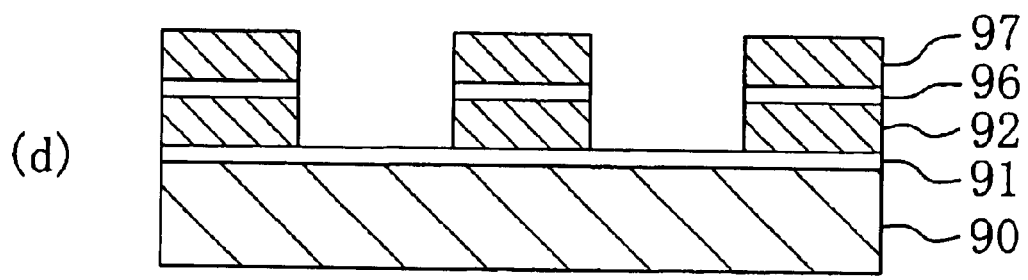

(PRIOR ART)

(PRIOR ART)

SEMICONDUCTOR STORAGE DEVICE AND ITS MANUFACTURING METHOD

TECHNICAL FIELD

The present invention relates to a nonvolatile semiconductor memory capable of high integration and a method for fabricating the same.

BACKGROUND ART

A variety of semiconductor memories have recently been proposed, and among these semiconductor memories, one having a bit line below an isolation region as described in, for example, Japanese Laid-Open Patent Publication No. 05-326893 is noticeable because it can be easily highly integrated.

Now, a semiconductor memory having a bit line below an isolation region and a method for fabricating the same will be described with reference to FIGS. 59(a) through 59(d) and 60.

First, after a trapping film 2 is deposited on a silicon substrate 1 as shown in FIG. 59(a), an impurity diffusion layer 4 working as a bit line is formed through impurity ion implantation into the silicon substrate 1 with a resist pattern 3 used as a mask as shown in FIG. 59(b). Thereafter, the trapping film 2 is selectively etched by using the resist pattern 3 as a mask, so as to remove a portion of the trapping film 2 disposed above the impurity diffusion layer 4.

Next, after removing the resist pattern 3 as shown in FIG. 59(c), a LOCOS isolation region 5 is formed through thermal oxidation.

Then, after depositing a polysilicon film 6 over the semiconductor substrate 1 as shown in FIG. 59(d), the polysilicon film 6 is selectively etched, resulting in obtaining a conventional semiconductor memory as shown in FIG. 60.

The conventional semiconductor memory has, however, mainly three problems as follows:

The first problem is that refinement is difficult because the LOCOS isolation region is used for isolating devices from one another. Specifically, when the LOCOS isolation region is employed, a bird's beak is caused at the end of the isolation region, and hence, an active region becomes small as compared with a mask dimension. Therefore, it is necessary to previously set a large mask dimension, which makes refinement difficult.

The second problem is that it is difficult to lower the resistance of the bit line because the impurity diffusion layer working as the bit line is provided below the LOCOS isolation region.

The third problem is that it is difficult to lower the resistance of a gate electrode because salicide technique is difficult to employ. Specifically, as shown in FIG. 60, the impurity diffusion layer 4 working as the bit line diffuses outside the LOCOS isolation region 5. Accordingly, if the salicide technique is employed under this condition, a silicide layer is unavoidably formed in a surface portion of the impurity diffusion layer 4, so that bit lines may be short-circuited through the silicide layer. Therefore, the salicide technique is difficult to employ.

DISCLOSURE OF THE INVENTION

In consideration of the aforementioned problems, an object of the invention is realizing refinement of a nonvolatile semiconductor memory by avoiding a LOCOS isolation region from being formed on an impurity diffusion layer working as a bit line.

The first semiconductor memory of this invention includes a pair of impurity diffusion layers spaced from each other and formed in surface portions of a semiconductor substrate; a trapping film formed in a portion sandwiched between the pair of impurity diffusion layers on the semiconductor substrate; a gate electrode formed on the trapping film; and a pair of insulating films formed on the pair of impurity diffusion layers with the gate electrode sandwiched therebetween.

Since the first semiconductor memory includes the pair of insulating films formed on the pair of impurity diffusion layers so as to sandwich the gate electrode, there is no need to provide LOCOS isolation regions on both sides of a memory device composed of a gate electrode and a trapping film. Therefore, refinement of a semiconductor memory can be realized.

The second semiconductor memory of this invention includes a plurality of impurity diffusion layers formed in surface portions of a semiconductor substrate in the shape of stripes and working as bit lines; a plurality of buried insulating films formed above the plurality of impurity diffusion layers on the semiconductor substrate and extending along a bit line direction; and gate electrodes of memory devices formed on the semiconductor substrate and extending along a word line direction, and the gate electrodes include a plurality of first conducting films, which are formed between the plurality of buried insulating films on the semiconductor substrate with a trapping film formed below the gate electrodes and have top faces thereof at substantially the same level as top faces of the plurality of buried insulating films, and a second conducting film formed over the plurality of buried insulating films and the plurality of first conducting films for electrically connecting the plurality of first conducting films to one another.

In the second semiconductor memory, the buried insulating films extending along the bit line direction are provided above the impurity diffusion layers working as the bit lines, and the first conducting films included in the gate electrodes are isolated from one another by the buried insulating films. Therefore, there is no need to provide a LOCOS isolation region between memory devices each composed of a gate electrode and a trapping film. Although the first conducting films are isolated from one another by the buried insulating films, the first conducting films are electrically connected to one another through the second conducing film, and hence, there arises no problem.

Accordingly, the refinement of a semiconductor memory can be realized by the second semiconductor memory.

In the first or second semiconductor memory, the trapping film is preferably made of a multilayer film composed of a silicon oxide film, a silicon nitride film and a silicon oxide film successively deposited on the semiconductor substrate.

Thus, the characteristic of the semiconductor memory can be definitely improved.

The third semiconductor memory of this invention includes a plurality of impurity diffusion layers formed in surface portions of a semiconductor substrate in the shape of stripes and working as bit lines; a plurality of buried insulating films formed above the plurality of impurity diffusion layers on the semiconductor substrate and extending along a bit line direction; a plurality of floating electrodes made of first conducting films that are formed between the plurality of buried insulating films on the semiconductor substrate with a tunnel insulating film formed below and have top faces substantially at the same level as top faces of the plurality of buried insulating films; an inter-electrode insulating film formed over the plurality of buried insulating films and the plurality of floating electrodes and extending along a word line direction; and gate electrodes of memory devices made of a second conducting film that is formed on the inter-electrode insulating film and extends along the word line direction.

In the third semiconductor memory, the buried insulating films extending along the bit line direction are provided above the impurity diffusion layers working as the bit lines, and the first conducting films used for forming the floating gates are isolated from one another by the buried insulating films. Therefore, there is no need to provide a LOCOS isolation region between memory devices each composed of a floating electrode, an inter-electrode insulating film and a gate electrode. Although the first conducting films are isolated from one another by the buried insulating films, the first conducting films are electrically connected to one another through the second conducting film, and hence, there arises no problem.

Accordingly, the refinement of a semiconductor memory can be realized by the third semiconductor memory.

The second or third semiconductor memory preferably further includes sidewall insulating films formed on side faces of the first conducting films.

Thus, the short channel effect derived from diffusion of an impurity implanted into the impurity diffusion layers can be suppressed, so as to reduce the gate length.

In this case, metal films are preferably formed between the plurality of impurity diffusion layers and the plurality of buried insulating films and between every pair of the sidewall insulating films opposing each other.

Thus, the metal films can be formed on the impurity diffusion layers working as the bit lines, and hence, the resistance of the bit lines can be lowered.

In the second or third semiconductor memory, each of the plurality of impurity diffusion layers preferably includes a high concentration impurity diffusion layer formed at a center and low concentration impurity diffusion layers formed on both sides of the high concentration impurity diffusion layer.

Thus, the short channel effect derived from the diffusion of an impurity implanted into the high concentration impurity diffusion layers can be suppressed, so as to reduce the gate length.

In the second or third semiconductor memory, a silicide layer is preferably formed in a surface portion of the second conducting film.

Thus, the resistance of the gate electrodes can be lowered.

The second or third semiconductor memory preferably further includes sidewall insulating films formed on side faces of the plurality of buried insulating films.

Thus, salicide technique can be performed while covering portions on the surface of the semiconductor substrate outside the impurity diffusion layers with the sidewall insulating films. Therefore, short-circuit between the impurity diffusion layers working as the bit lines through the silicide layer can be avoided, and the resistance of the bit lines can be lowered.

The second or third semiconductor memory preferably further includes insulating films buried between the plurality of buried insulating films.

Thus, the salicide technique can be performed while covering the portions on the surface of the semiconductor substrate outside the impurity diffusion layers with the insulating films. Therefore, the short-circuit between the impurity diffusion layers working as the bit lines through the silicide layer can be definitely avoided.

In the second or third semiconductor memory, the second conducting film is preferably a metal film.

Thus, the resistance of the gate electrodes can be lowered.

In the second or third semiconductor memory, a transistor included in a logic circuit is preferably provided on the semiconductor substrate, and a gate electrode of the transistor preferably has a multilayer structure composed of one of the plurality of first conducting films and the second conducting film.

Thus, the gate electrode of the transistor included in the logic circuit can be formed without increasing the number of procedures.

In the second or third semiconductor memory, in the case where the gate electrode of the transistor has the multilayer structure composed of the first conducting film and the second conducting film, a silicide layer is preferably formed in a surface portion of the second conducting film.

Thus, the resistance of the gate electrode of the transistor included in the logic circuit can be lowered.

In the second or third semiconductor memory, in the case where the gate electrode of the transistor has the multilayer structure composed of the first conducting film and the second conducting film, the second conducting film is preferably a metal film.

Thus, the resistance of the gate electrode of the transistor included in the logic circuit can be lowered.

In the second or third semiconductor memory, a transistor included in a logic circuit is preferably provided on the semiconductor substrate, and a gate electrode of the transistor is preferably made of the second conducting film alone.

Thus, the gate electrode of the transistor included in the logic circuit can be refined.

The first method for fabricating a semiconductor memory of this invention includes the steps of forming a trapping film in a memory device formation region on a semiconductor substrate; depositing a first conducting film on the trapping film; patterning the first conducting film by using a first mask pattern extending along a bit line direction; forming impurity diffusion layers working as bit lines by implanting an impurity into the semiconductor substrate by using, as a mask, the first mask pattern or patterns of the first conducting film; forming buried insulating films between the patterns of the first conducting film on the semiconductor substrate; depositing a second conducting film on the patterns of the first conducting film and the buried insulating films; and patterning the second conducting film and the patterns of the first conducting film by using a second mask pattern extending along a word line direction, whereby forming gate electrodes of memory devices each made of a pattern of the second conducting film and a pattern of the first conducting film.

In the first method for fabricating a semiconductor memory, the buried insulating films extending along the bit line direction are provided above the impurity diffusion layers working as the bit lines, and the patterns of the first conducting film used for forming the gate electrodes are isolated from one another by the buried insulating films. Therefore, there is no need to provide a LOCOS isolation region between the memory devices each composed of a gate electrode and a trapping film. Although the patterns of the first conducting film are isolated from one another by the buried insulating films, the patterns of the first conducting film are electrically connected to one another through the second conducting film, and hence, there arises no problem.

Accordingly, refinement of a semiconductor memory can be realized by the first method for fabricating a semiconductor memory.

The second method for fabricating a semiconductor memory of this invention includes the steps of forming a trapping film in a memory device formation region on a semiconductor substrate; depositing a first conducting film on the trapping film; patterning the first conducting film by using a first mask pattern extending along a bit line direction; forming first sidewall insulating films on side faces of patterns of the first conducting film; forming impurity diffusion layers working as bit lines by implanting an impurity into the semiconductor substrate by using, as a mask, the patterns of the first conducting film and the first sidewall insulating films; making the impurity diffusion layers overlap the patterns of the first conducting film by annealing the semiconductor substrate; forming, on the semiconductor substrate, buried insulating films between the first sidewall insulating films opposing each other; depositing a second conducting film on the patterns of the first conducting film and the buried insulating films; and patterning the second conducting film and the patterns of the first conducting film by using a second mask pattern extending along a word line direction, whereby forming gate electrodes of memory devices each made of a pattern of the second conducting film and a pattern of the first conducting film.

In the second method for fabricating a semiconductor memory, the buried insulating films extending along the bit line direction are provided above the impurity diffusion layers working as the bit lines, and the patterns of the first conducting film used for forming the gate electrodes are isolated from one another by the buried insulating films. Therefore, there is no need to provide a LOCOS isolation region between the memory devices each composed of a gate electrode and a trapping film. Although the patterns of the first conducting film are isolated from one another by the buried insulating films, the patterns of the first conducting film are electrically connected to one another through the second conducting film, and hence, there arises no problem.

Also, this method includes the step of forming the first sidewall insulating films on the side faces of the patterns of the first conducting film included in the gate electrodes, and therefore, the short channel effect derived from the diffusion of the impurity implanted into the impurity diffusion layers can be avoided, so as to reduce the gate length.

Accordingly, further refinement of a semiconductor memory can be realized by the second method for fabricating a semiconductor memory.

The third method for fabricating a semiconductor memory of this invention includes the steps of forming a trapping film in a memory device formation region on a semiconductor substrate; depositing a first conducting film on the trapping film; patterning the first conducting film by using a first mask pattern extending along a bit line direction; forming low concentration impurity diffusion layers by implanting an impurity into the semiconductor substrate by using patterns of the first conducting film as a mask; forming first sidewall insulating films on side faces of the patterns of the first conducting film; forming high concentration impurity diffusion layers working as bit lines by implanting an impurity into the semiconductor substrate by using, as a mask, the patterns of the first conducting film and the first sidewall insulating films; forming, on the semiconductor substrate, buried insulating films between the first sidewall insulating films opposing each other; depositing a second conducting film on the patterns of the first conducting film and the buried insulating films; and patterning the second conducting film and the patterns of the first conducting film by using a second mask pattern extending along a word line direction, whereby forming gate electrodes of memory devices each made of a pattern of the second conducting film and a pattern of the first conducting film.

In the third method for fabricating a semiconductor memory, the buried insulating films extending along the bit line direction are provided above the impurity diffusion layers working as the bit lines, and the patterns of the first conducting film included in the gate electrodes are isolated from one another by the buried insulating films. Therefore, there is no need to provide a LOCOS isolation region between the memory devices each composed of a gate electrode and a trapping film. Although the patterns of the first conducting film are isolated from one another by the buried insulating films, the patterns of the first conducting film are electrically connected to one another through the second conducting film, and hence, there arises no problem.

Also, the low concentration impurity diffusion layers can be definitely formed on both sides of the high concentration impurity diffusion layer working as a bit line, and therefore, the short channel effect derived from the diffusion of the impurity implanted into the high concentration impurity diffusion layer can be suppressed, so as to reduce the gate length.

Accordingly, further refinement of a semiconductor memory can be realized by the third method for fabricating a semiconductor memory.

In the second or third method for fabricating a semiconductor memory, in the step of forming buried insulating films, the buried insulating films are preferably formed on the semiconductor substrate with a metal film formed below the buried insulating films.

Thus, the metal film can be formed on the impurity diffusion layers working as the bit lines, so as to lower the resistance of the bit lines.

In the first or second method for fabricating a semiconductor memory, in the step of forming impurity diffusion layers, the impurity is preferably implanted into the semiconductor substrate through the trapping film.

Thus, the surface of the semiconductor substrate can be protected by the trapping film during the implantation of the impurity.

The first or second method for fabricating a semiconductor memory may further include, between the step of patterning the first conducting film and the step of forming impurity diffusion layers, a step of patterning the trapping film by using, as a mask, the first mask pattern or the patterns of the first conducting film, and in the step of forming impurity diffusion layers, the impurity may be implanted into the semiconductor substrate not through the trapping film.

In the third method for fabricating a semiconductor memory, in the step of forming low concentration impurity diffusion layers, the impurity is preferably implanted into the semiconductor substrate through the trapping film.

Thus, the surface of the semiconductor substrate can be protected by the trapping film during the implantation of the impurity for forming the low concentration impurity diffusion layers, and therefore, the semiconductor substrate is less damaged.

In the third method for fabricating a semiconductor memory, in the step of forming low concentration impurity diffusion layers, the impurity is preferably implanted into the semiconductor substrate after removing at least part of a portion of the trapping film exposed from the patterns of the first conducting film.

Thus, acceleration energy employed in the ion implantation for forming the low concentration impurity diffusion layers can be lowered.

In the third method for fabricating a semiconductor memory, in the case where the impurity is implanted into the semiconductor substrate through the trapping film in the step of forming low concentration impurity diffusion layers, in the step of forming high concentration impurity diffusion layers, the impurity is preferably implanted into the semiconductor substrate through the trapping film.

Thus, the surface of the semiconductor substrate can be protected by the trapping film also during the impurity implantation for forming the high concentration impurity diffusion layers.

In the case where the impurity is implanted into the semiconductor substrate through the trapping film in the step of forming low concentration impurity diffusion layers, the third method for fabricating a semiconductor memory may further include, between the step of forming low concentration impurity diffusion layers and the step of forming high concentration impurity diffusion layers, a step of patterning the trapping film by using, as a mask, the first mask pattern or the patterns of the first conducting film, and in the step of forming high concentration impurity diffusion layers, the impurity may be implanted into the semiconductor substrate not through the trapping film.

The third method for fabricating a semiconductor memory may further include, between the step of patterning the first conducting film and the step of forming low concentration impurity diffusion layers, a step of patterning the trapping film by using, as a mask, the first mask pattern or the patterns of the first conducting film, and in the step of forming low concentration impurity diffusion layers, the impurity may be implanted into the semiconductor substrate not through the trapping film.

In any of the first through third methods for fabricating a semiconductor memory, in forming the gate electrodes, silicide layers are preferably formed in surface portions of patterns of the second conducting film.

Thus, the resistance of the gate electrodes can be lowered.

In any of the first through third methods for fabricating a semiconductor memory, in the case where the silicide layers are formed in the surface portions of the patterns of the second conducting film in forming the gate electrodes, silicide layers are preferably formed in surface portions of the patterns of the second conducting film after forming second sidewall insulating films on side faces of the buried insulating films.

Thus, the salicide technique can be performed while covering portions on the surface of the semiconductor substrate outside the impurity diffusion layers with the second sidewall insulating films, and therefore, short-circuit between the impurity diffusion layers working as the bit lines through the silicide layer can be avoided.

In any of the first through third methods for fabricating a semiconductor memory, in the case where the second sidewall insulating films are formed on the side faces of the buried insulating films in forming the gate electrodes, the semiconductor memory preferably includes a transistor included in a logic circuit and provided on the semiconductor substrate, and in forming the second sidewall insulating films on the side faces of the buried insulating films, the second sidewall insulating films are preferably formed on side faces of a gate electrode of the transistor included in the logic circuit.

Thus, the sidewall insulating films can be formed on the side faces of the gate electrode of the transistor included in the logic circuit without increasing the number of procedures.

In any of the first through third methods for fabricating a semiconductor memory, in forming the gate electrodes, silicide layers are preferably formed in surface portions of patterns of the second conducting film after burying insulating films between the buried insulating films.

Thus, the salicide technique is employed while completely covering the portions on the surface of the semiconductor substrate outside the impurity diffusion layers with the insulating films, and therefore, the short-circuit between the impurity diffusion layers working as the bit lines through the silicide layer can be definitely avoided.

In the second or third method for fabricating a semiconductor memory, the second conducting film is preferably a metal film.

Thus, the resistance of the gate electrodes can be lowered.

In the second or third method for fabricating a semiconductor memory, in the case where the second conducting film is a metal film, the semiconductor memory preferably includes a transistor included in a logic circuit and provided on the semiconductor substrate, and a gate electrode of the transistor included in the logic circuit preferably has a multilayer structure composed of a pattern of the first conducting film and a pattern of the metal film.

Thus, the gate electrode of the transistor included in the logic circuit can be formed in a polymetal structure without increasing the number of procedures.

In any of the first through third methods for fabricating a semiconductor memory, the semiconductor memory preferably includes a transistor included in a logic circuit and provided on the semiconductor substrate, and a gate electrode of the transistor included in the logic circuit is preferably made of a pattern of the second conducting film alone.

Thus, the gate electrode of the transistor included in the logic circuit can be refined.

In any of the first through third methods for fabricating a semiconductor memory, the semiconductor memory preferably includes a transistor included in a logic circuit and provided on the semiconductor substrate, and in forming the gate electrodes, a gate electrode of the transistor included in the logic circuit composed of a pattern of the second conducting film and a pattern of the first conducting film is preferably formed by patterning the second conducting film and the patterns of the first conducting film in a logic circuit formation region on the semiconductor substrate.

Thus, the gate electrode of the transistor included in the logic circuit can be formed without increasing the number of procedures.

The fourth method for fabricating a semiconductor memory of this invention includes the steps of forming a tunnel insulating film in a memory device formation region on a semiconductor substrate; depositing a first conducting film on the tunnel insulating film; patterning the first conducting film by using a first mask pattern extending along a bit line direction; forming impurity diffusion layers working as bit lines by implanting an impurity into the semiconductor substrate by using, as a mask, the first mask pattern or patterns of the first conducting film; forming buried insulating films between the patterns of the first conducting film on the semiconductor substrate; depositing an inter-electrode insulating film on the patterns of the first conducting film and the buried insulating films; depositing a second conducting film on the inter-electrode insulating film; and patterning the second conducting film, the inter-electrode insulating film and the patterns of the first conducting film by using a second mask pattern extending along a word line direction, whereby forming gate electrodes of memory devices each made of a pattern of the second conducting film and floating electrodes each made of a pattern of the first conducting film.

In the fourth method for fabricating a semiconductor memory, the buried insulating films extending along the bit line direction are provided above the impurity diffusion layers working as the bit lines, and the patterns of the first conducting film used for forming the floating electrodes are isolated from one another by the buried insulating films. Therefore, there is no need to provide a LOCOS isolation region between the memory devices each composed of a floating electrode, an inter-electrode insulating film and a gate electrode. Although the patterns of the first conducting film are isolated from one another by the buried insulating films, the patterns of the first conducting film are electrically connected to one another through the second conducting film, and hence, there arises no problem.

Accordingly, refinement of a semiconductor memory can be realized by the fourth method for fabricating a semiconductor memory.

The fifth method for fabricating a semiconductor memory of this invention includes the steps of forming a tunnel insulating film on a memory device formation region on a semiconductor substrate; depositing a first conducting film on the tunnel insulating film; patterning the first conducting film by using a first mask pattern extending along a bit line direction; forming first sidewall insulating films on side faces of patterns of the first conducting film; forming impurity diffusion layers working as bit lines by implanting an impurity into the semiconductor substrate by using, as a mask, the patterns of the first conducting film and the first sidewall insulating films; making the impurity diffusion layers overlap the patterns of the first conducting film by annealing the semiconductor substrate; forming buried insulating films between the first sidewall insulating films opposing each other on the semiconductor substrate; depositing an inter-electrode insulating film on the patterns of the first conducting film and the buried insulating films; depositing a second conducting film on the inter-electrode insulating film; and patterning the second conducting film, the inter-electrode insulating film and the patterns of the first conducting film by using a second mask pattern extending along a word line direction, whereby forming gate electrodes of memory devices each made of a pattern of the second conducting film and floating electrodes each made of a pattern of the first conducting film.

In the fifth method for fabricating a semiconductor memory, the buried insulating films extending along the bit line direction are provided above the impurity diffusion layers working as the bit lines, and the patterns of the first conducting film used for forming the floating electrodes are isolated from one another by the buried insulating films. Therefore, there is no need to provide a LOCOS isolation region between the memory devices each composed of a floating electrode, an inter-electrode insulating film and a gate electrode. Although the patterns of the first conducting film are isolated from one another by the buried insulating films, the patterns of the first conducting film are electrically connected to one another through the second conducting film, and hence, there arises no problem.

Also, since this method includes the step of forming the first sidewall insulating films on the side faces of the patterns of the first conducting film used for forming the floating electrodes, the short channel effect derived from the diffusion of the impurity implanted into the impurity diffusion layers can be suppressed, so as to reduce the gate length.

Accordingly, further refinement of a semiconductor memory can be realized by the fifth method for fabricating a semiconductor memory.

The sixth method for fabricating a semiconductor memory of this invention includes the steps of forming a tunnel insulating film in a memory device formation region on a semiconductor substrate; depositing a first conducting film on the tunnel insulating film; patterning the first conducting film by using a first mask pattern extending along a bit line direction; forming low concentration impurity diffusion layers by implanting an impurity into the semiconductor substrate by using, as a mask, patterns of the first conducting film; forming first sidewall insulating films on side faces of the patterns of the first conducting film; forming high concentration impurity diffusion layers working as bit lines by implanting an impurity into the semiconductor substrate by using, as a mask, the patterns of the first conducting film and the first sidewall insulating films; forming buried insulating films between the first sidewall insulating films opposing each other on the semiconductor substrate; depositing an inter-electrode insulating film on the patterns of the first conducting film and the buried insulating films; depositing a second conducting film on the inter-electrode insulating film; and patterning the second conducting film, the inter-electrode insulating film and the patterns of the first conducting film by using a second mask pattern extending along a word line direction, whereby forming gate electrodes of memory devices each made of a pattern of the second conducting film and floating electrodes each made of a pattern of the first conducting film.

In the sixth method for fabricating a semiconductor memory, the buried insulating films extending along the bit line direction are provided above the high impurity diffusion layers working as the bit lines, and the patterns of the first conducting film used for forming the floating electrodes are isolated from one another by the buried insulating films. Therefore, there is no need to provide a LOCOS isolation region between the memory devices each composed of a floating electrode, an inter-electrode insulating film and a gate electrode. Although the patterns of the first conducting film are isolated from one another by the buried insulating films, the patterns of the first conducting film are electrically connected to one another through the second conducting film, and hence, there arises no problem.

Also, since this method includes the step of forming the low concentration impurity diffusion layers on both sides of each high concentration impurity diffusion layer, the short channel effect derived from the diffusion of the impurity implanted into the high concentration impurity diffusion layer can be suppressed, so as to reduce the gate length.

Accordingly, further refinement of a semiconductor memory can be realized by the sixth method for fabricating a semiconductor memory.

In the fourth or fifth method for fabricating a semiconductor memory, in the step of forming buried insulating films, the buried insulating films are preferably formed on the semiconductor substrate with a metal film formed below the buried insulating films.

Thus, the metal film can be formed on the impurity diffusion layers working as the bit lines, so as to lower the resistance of the bit lines.

In the fourth or fifth method for fabricating a semiconductor memory, in the step of forming impurity diffusion layers, the impurity is preferably implanted into the semiconductor substrate through the tunnel insulating film.

Thus, the surface of the semiconductor substrate can be protected by the tunnel insulating film during the impurity implantation.

The fourth or fifth method for fabricating a semiconductor memory may further include, between the step of patterning the first conducting film and the step of forming impurity diffusion layers, a step of patterning the tunnel insulating film by using, as a mask, the first mask pattern or patterns of the first conducting film, and in the step of forming impurity diffusion layers, the impurity may be implanted into the semiconductor substrate not through the tunnel insulating film.

In the sixth method for fabricating a semiconductor memory, in the step of forming low concentration impurity diffusion layers, the impurity is preferably implanted into the semiconductor substrate through the tunnel insulating film.

Thus, the surface of the semiconductor substrate can be protected by the tunnel insulating film during the impurity implantation for forming the low concentration impurity diffusion layers, and therefore, the semiconductor substrate is less damaged.

In the sixth method for fabricating a semiconductor memory, in the step of forming low concentration impurity diffusion layers, the impurity is preferably implanted into the semiconductor substrate after removing at least part of a portion of the tunnel insulating film exposed from the patterns of the first conducting film.

Thus, the acceleration energy employed in the ion implantation for forming the low concentration impurity diffusion layers can be lowered.

In the sixth method for fabricating a semiconductor memory, in the case where the impurity is implanted into the semiconductor substrate through the tunnel insulating film in the step of forming the low concentration impurity layers, in the step of forming high concentration impurity diffusion layers, the impurity is preferably implanted into the semiconductor substrate through the tunnel insulating film.

Thus, the surface of the semiconductor substrate can be protected by the tunnel insulating film also during the impurity implantation for forming the high concentration impurity diffusion layers.

The sixth method for fabricating a semiconductor memory may further include, between the step of forming low concentration impurity diffusion layers and the step of forming high concentration impurity diffusion layers, a step of patterning the tunnel insulating film by using, as a mask, the first mask pattern or the patterns of the first conducting film, and in the step of forming high concentration impurity diffusion layers, the impurity may be implanted into the semiconductor substrate not through the tunnel insulating film.

The sixth method for fabricating a semiconductor memory may further include, between the step of patterning the first conducting film and the step of forming low concentration impurity diffusion layers, a step of patterning the trapping film by using, as a mask, the first mask pattern or patterns of the first conducting film, and in the step of forming low concentration impurity diffusion layers, the impurity may be implanted into the semiconductor substrate not through the trapping film.

In any of the fourth through sixth methods for fabricating a semiconductor memory, in forming the gate electrodes, silicide layers are preferably formed in surface portions of patterns of the second conducting film.

Thus, the resistance of the gate electrodes can be lowered.

In any of the fourth through sixth methods for fabricating a semiconductor memory, in forming the gate electrodes, silicide layers are preferably formed in surface portions of patterns of the second conducting film after forming second sidewall insulating films on side faces of the buried insulating films.

Thus, the salicide technique is employed while covering portions on the surface of the semiconductor substrate outside the impurity diffusion layers with the sidewall insulating films, and therefore, short-circuit between the impurity diffusion layers working as the bit lines through the silicide layer can be avoided.

In any of the fourth through sixth methods for fabricating a semiconductor memory, in the case where the second sidewall insulating films are formed on the side faces of the buried insulating films in forming the gate electrodes, the semiconductor memory preferably includes a transistor included in a logic circuit and provided on the semiconductor substrate, and in forming the second sidewall insulating films on the side faces of the buried insulating films, the second sidewall insulating films are preferably formed on side faces of a gate electrode of the transistor included in the logic circuit.

Thus, the sidewall insulating films can be formed on the side face of the gate electrode of the transistor included in the logic circuit without increasing the number of procedures.

In any of the fourth through sixth methods for fabricating a semiconductor memory, in forming the gate electrodes, silicide layers are preferably formed in surface portions of patterns of the second conducting film after burying insulating films between the buried insulating films.

Thus, the salicide technique is employed while completely covering the portions on the surface of the semiconductor substrate outside the impurity diffusion layers with the insulating films, and therefore, the short-circuit between the impurity diffusion layers working as the bit lines through the silicide layer can be definitely avoided.

In any of the fourth through sixth methods for fabricating a semiconductor memory, the semiconductor memory preferably includes a transistor included in a logic circuit and provided on the semiconductor substrate, and a gate electrode of the transistor included in the logic circuit is preferably made of a pattern of the second conducting film alone.

Thus, the gate electrode of the transistor included in the logic circuit can be formed without increasing the number of procedures.

BRIEF DESCRIPTION OF DRAWINGS

FIGS. 5(a) through 5(d) are cross-sectional views for showing procedures in a method for fabricating a semiconductor memory according to Embodiment 2.

FIGS. 17(a) through 17(d) are cross-sectional views for showing procedures in a method for fabricating a semiconductor memory according to Embodiment 5.

FIG. 39(a) is a cross-sectional view taken on line XXIXA—XXIXA of FIG. 38, FIG. 39(b) is a cross-sectional view taken on line XXIXB—XXIXB of FIG. 38, FIG. 39(c) is a cross-sectional view taken on line XXIXC—XXIXC of FIG. 38 and FIG. 39(d) is a cross-sectional view taken on line XXIXD—XXIXD of FIG. 38.

BEST MODE FOR CARRYING OUT THE INVENTION

Now, a semiconductor memory and a method for fabricating the same according to each of preferred embodiments of the invention will be described. An n-channel type transistor and a p-channel type transistor are generally formed in a logic circuit region, and these transistors are different in the kind of impurities, and therefore, merely an n-channel type transistor alone is shown in each of drawings referred to below.

(Embodiment 1)

Figure 3:
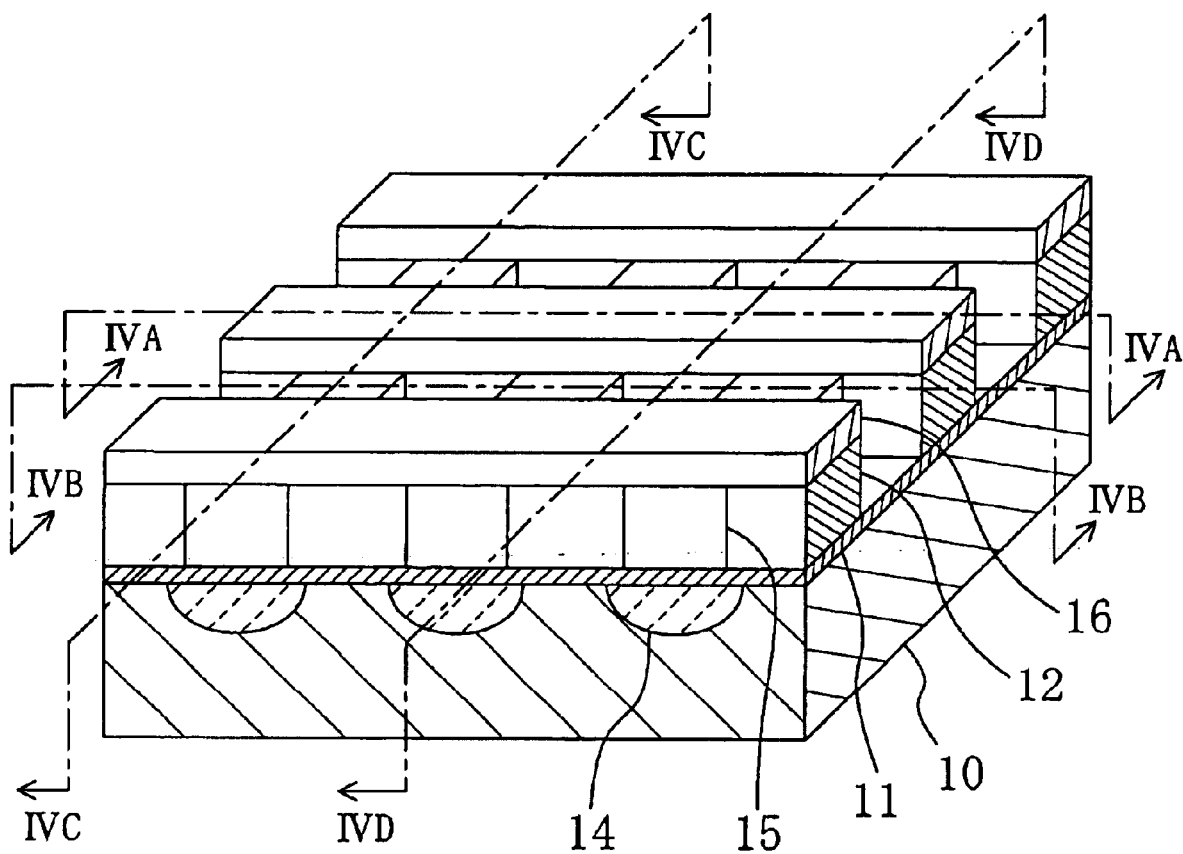
FIG. 3 is a perspective cross-sectional view of a semiconductor memory according to Embodiment 1.
Figure 4:
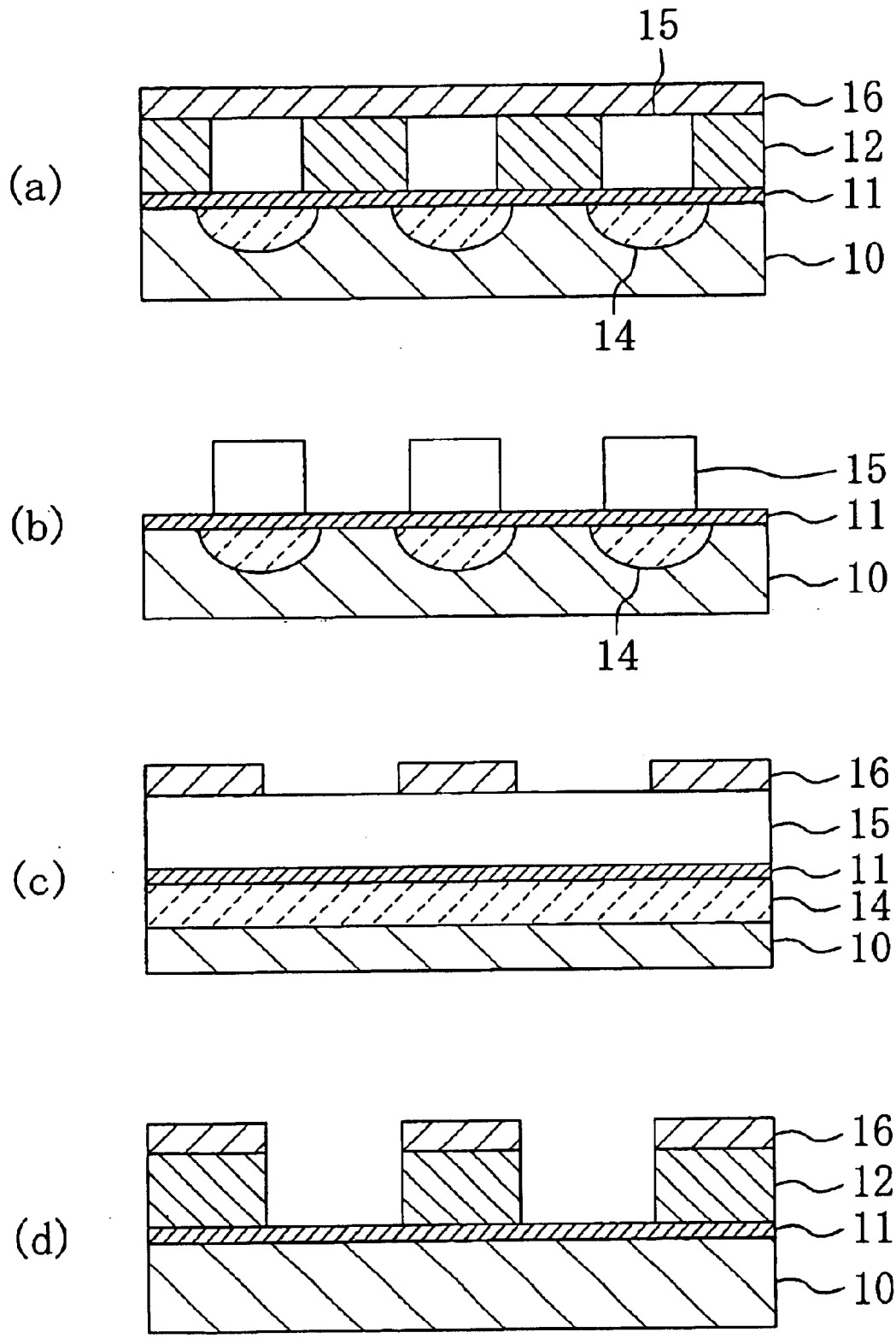
FIG. 4(a) is a cross-sectional view taken on line IVA—IVA of FIG. 3.
FIG. 4(b) is a cross-sectional view taken on line IVB—IVB of FIG. 3.
FIG. 4(c) is a cross-sectional view taken on line IVC—IVC of FIG. 3
FIG. 4(d) is a cross-sectional view taken on line IVD—IVD of FIG. 3.

A semiconductor memory and a method for fabricating the same according to Embodiment 1 of the invention will now be described with reference to FIGS. 1(a) through 1(c), 2(a) through 2(c), 3 and 4(a) through 4(d). FIG. 4(a) shows the cross-sectional structure taken on line IVA—IVA of FIG. 3, FIG. 4(b) shows the cross-sectional structure taken on line IVB—IVB of FIG. 3, FIG. 4(c) shows the cross-sectional structure taken on line IVC—IVC of FIG. 3 and FIG. 4(d) shows the cross-sectional structure taken on line IVD—IVD of FIG. 3.

Figure 1:
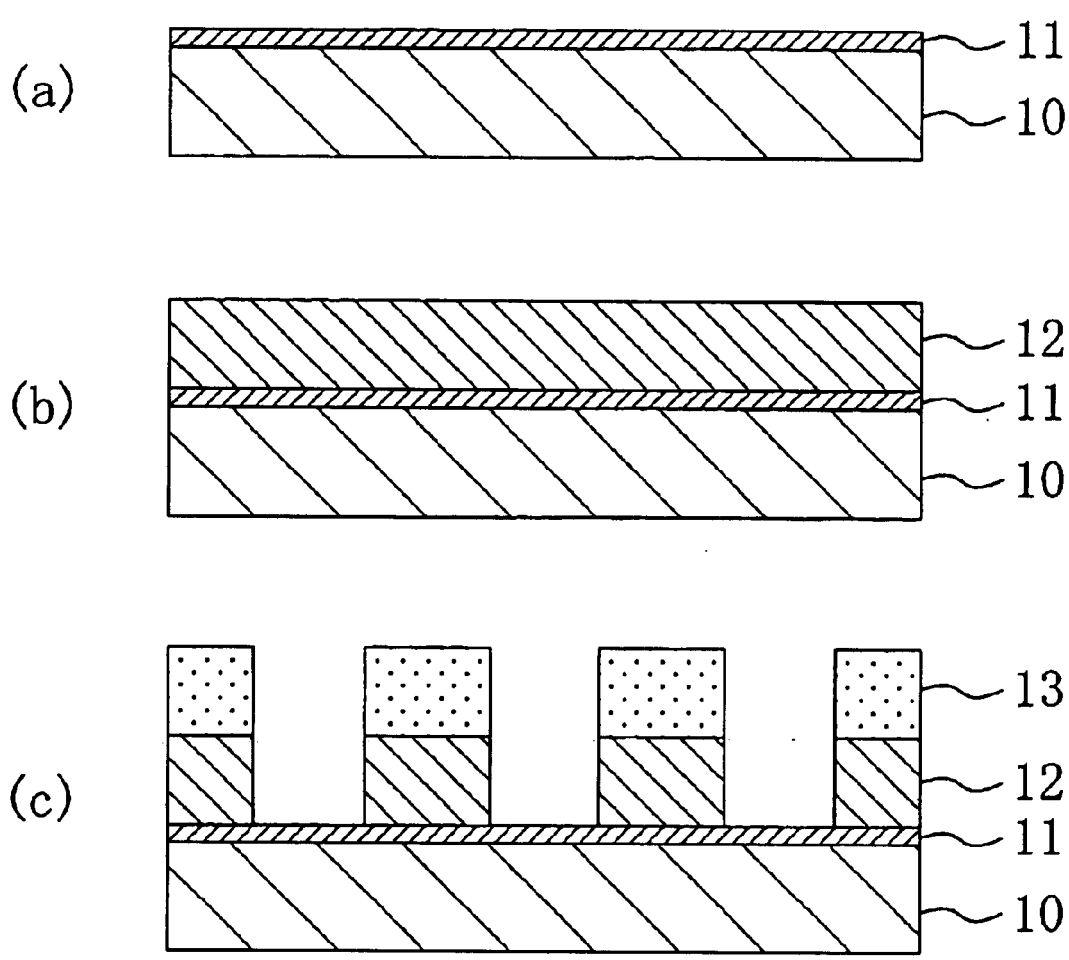
FIGS. 1(a) through 1(c) are cross-sectional views for showing procedures in a method for fabricating a semiconductor memory according to Embodiment 1.

First, as shown in FIG. 1(a), a trapping film 11 that is made of a multilayer film composed of, for example, a silicon oxide film, a silicon nitride film and a silicon oxide film, includes a charge capturing site and has a thickness of 30 nm in total is deposited in a memory device formation region on a semiconductor substrate 10 of a silicon substrate. Then, as shown in FIG. 1(b), a first polysilicon film 12 that is doped with $1\times10^{20}$ cm$^{-3}$ through $1\times10^{21}$ cm$^{-3}$ of phosphorus and has a thickness of 150 nm through 300 nm is deposited on the trapping film 11.

Next, as shown in FIG. 1(c), the first polysilicon film 12 is selectively etched by using, as a mask, a first resist pattern 13 extending along the bit line direction, so as to pattern the first polysilicon film 12. In this etching, the trapping film 11 is preferably allowed to remain in order to protect the surface of the semiconductor substrate 10 in impurity implantation successively performed.

Figure 2:
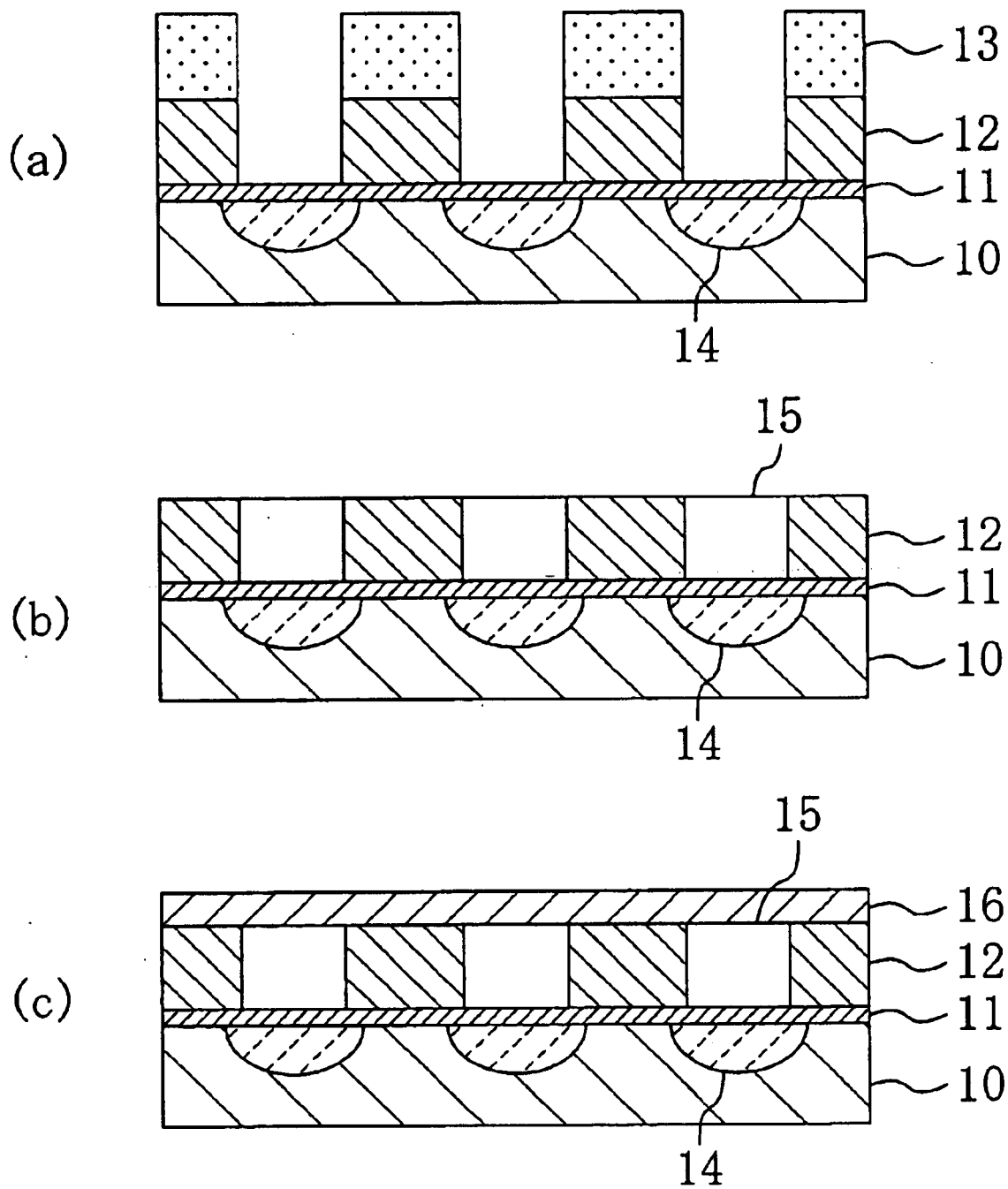
FIGS. 2(a) through 2(c) are cross-sectional views for showing other procedures in the method for fabricating a semiconductor memory according to Embodiment 1.

Then, as shown in FIG. 2(a), ions of an n-type impurity are implanted into the semiconductor substrate 10 at, for example, $1\times10^{15}$ cm$^{-2}$ through $1\times10^{16}$ cm$^{-2}$ by using the first resist pattern 13 as a mask, so as to form an n-type high concentration impurity diffusion layer 14 working as a bit line.

Next, as shown in FIG. 2(b), after depositing a silicon oxide film over the semiconductor substrate 10, the silicon oxide film is subjected to, for example, CMP or etch back, so as to remove a portion of the silicon oxide film present on the pattern of the first polysilicon film 12. Thus, a buried insulating film 15 is formed between the patterns of the first polysilicon film 12 and on the high concentration impurity diffusion layer 14. In this case, the top faces of the pattern of the first polysilicon film 12 and the buried insulating film 15 are at substantially the same level.

Then, as shown in FIG. 2(c), a second polysilicon film 16 doped with, for example, $1\times10^{20}$ cm$^{-3}$ through $1\times10^{21}$ cm$^{-3}$ of phosphorus and having a thickness of 50 nm through 200 nm is deposited on the pattern of the first polysilicon film 12 and the buried insulating film 15.

Next, the second polysilicon film 16 and the pattern of the first polysilicon film 12 are selectively etched by using, as a mask, a second resist pattern (omitted in the drawings) extending along the word line direction. Thus, as shown in FIGS. 3 and 4(a) through 4(d), a gate electrode composed of a pattern of the second polysilicon film 16 and a pattern of the first polysilicon film 12 is formed.

According to Embodiment 1, the buried insulating film 15 extending along the bit line direction is provided above the high concentration impurity diffusion layer 14 working as the bit line, and the patterns of the first polysilicon film 12 included in the gate electrodes are isolated from one another by the buried insulating film 15. Therefore, there is no need to provide a LOCOS isolation region between memory devices each composed of the gate electrode and the trapping film 11.

Also, although the patterns of the first polysilicon film 12 are isolated from one another by the buried insulating film 15, the patterns of the first polysilicon film 12 are electrically connected to one another through the second polysilicon film 16, and therefore, there arises no particular problem.

Accordingly, refinement of a semiconductor memory can be realized by Embodiment 1.

Although the multilayer film composed of a silicon oxide film, a silicon nitride film and a silicon oxide film is used as the trapping film 11 having the charge capturing site in Embodiment 1, a single-layer film of a nitrided silicon oxide film, a single-layer film of a silicon nitride film or a multilayer film composed of a silicon oxide film and a silicon nitride film deposited in this order on the semiconductor substrate 10 may be used instead.

Although the trapping film 11 has a thickness of 30 nm, the thickness is particularly preferably approximately 20 nm because the trapping film 11 with a smaller thickness can attain a better transistor characteristic.

Although the multilayer film composed of the first polysilicon film 12 and the second polysilicon film 16 is used as the gate electrode, a single-layer film of a polysilicon film, an amorphous silicon film, a refractory metal film with a melting point of 600° C. or more, a single-layer film of a metal silicide film, or a multilayer film of any of these films can be used instead.

Although a silicon oxide film is used as the buried insulating film 15, a single-layer film of a fluorine-containing silicon oxide film or a porous film, or a multilayer film of these films may be used instead. When the buried insulating film 15 includes a fluorine-containing silicon oxide film or a porous film, the capacitance between interconnects can be lowered, so as to attain a higher speed of the transistor.

Also, although the first resist pattern 13 is used as the mask for forming the high concentration impurity diffusion layer 14 in Embodiment 1, the patterns of the first polysilicon film 12 may be used instead with the first resist pattern 13 removed. Thus, the n-type impurity is implanted also into the gate electrode, and therefore, the resistance of the gate electrode can be further lowered.

Furthermore, although a polysilicon film doped with an impurity is deposited as each of the first polysilicon film 12 and the second polysilicon film 16 in Embodiment 1, instead, a polysilicon film not doped with an impurity can be first deposited so as to be doped with an impurity afterward.

Moreover, although an n-type memory device is formed in Embodiment 1, a p-type memory device may be formed instead.

(Embodiment 2)

Figure 7:
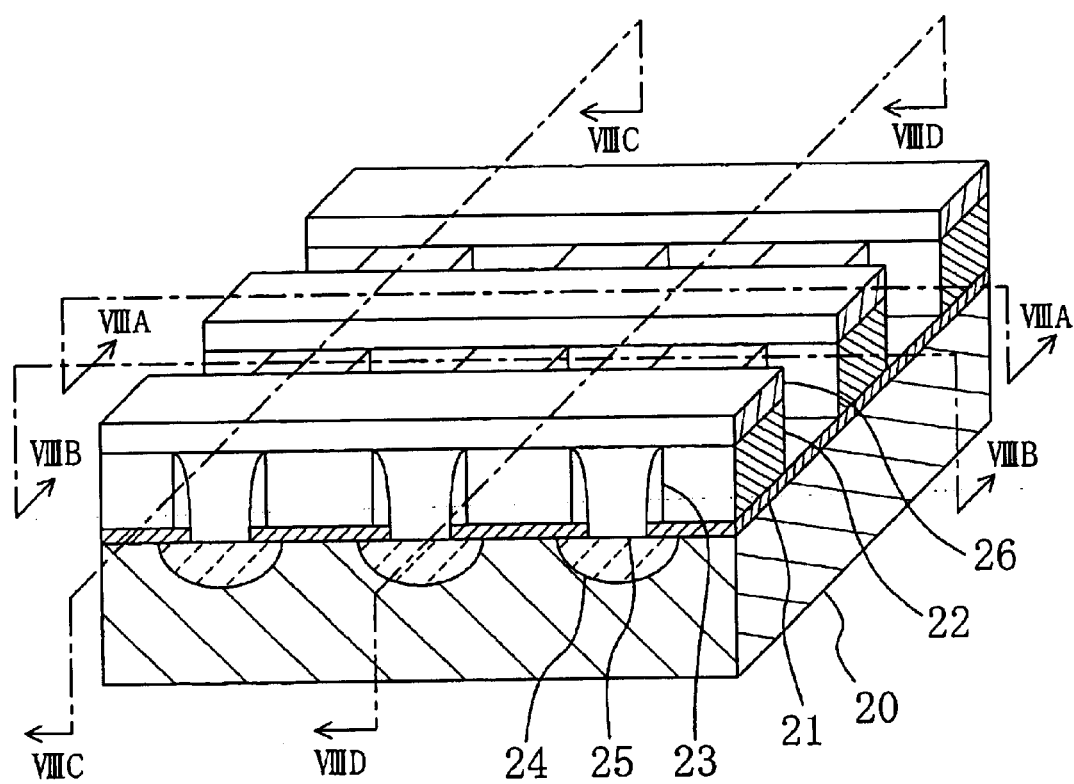
FIG. 7 is a perspective cross-sectional view of a semiconductor memory according to Embodiment 2.
Figure 8:
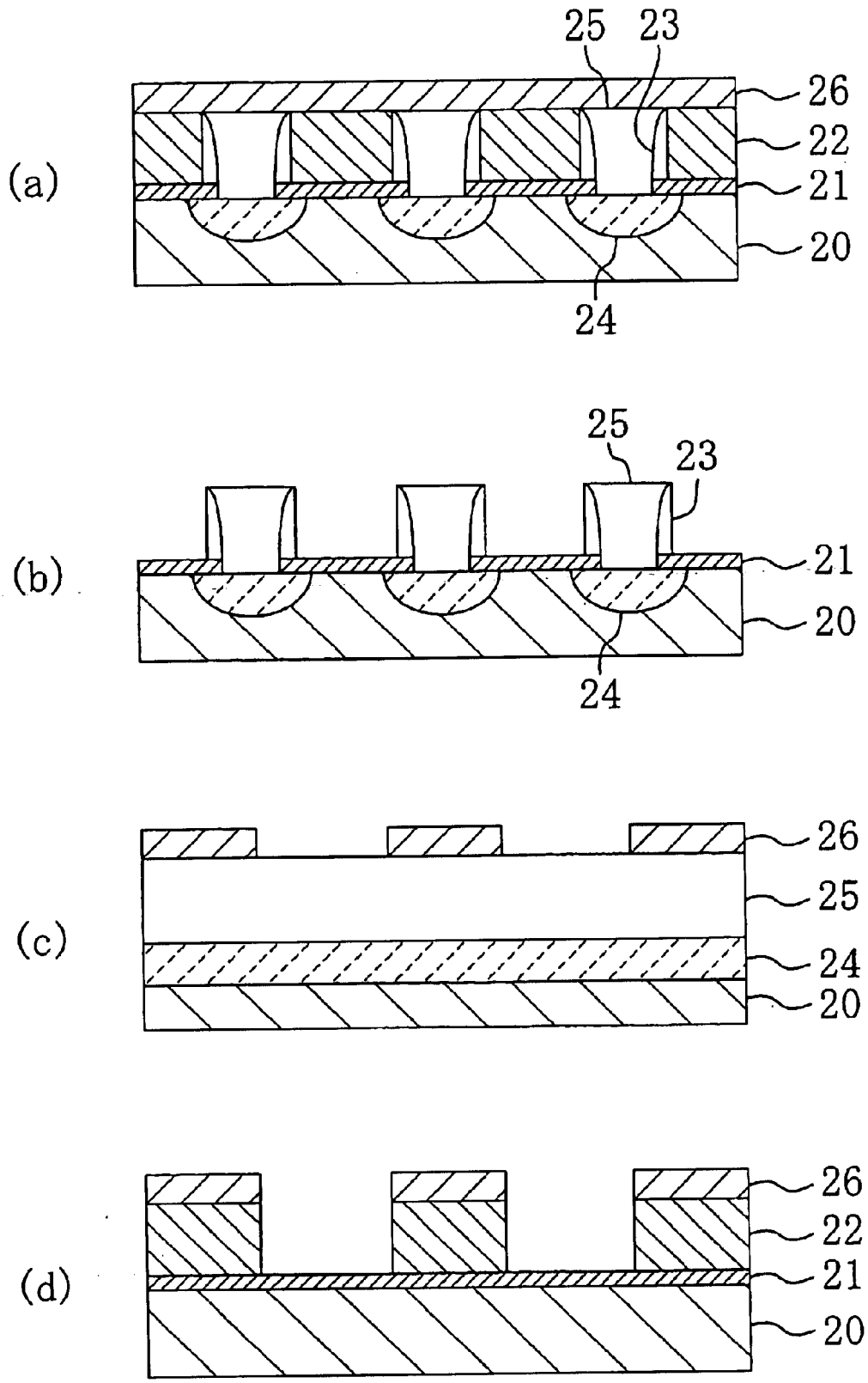
FIG. 8(a) is a cross-sectional view taken on line VIIIA—VIIIA of FIG. 7.
FIG. 8(b) is a cross-sectional view taken on line VIIIB—VIIIB of FIG. 7.
FIG. 8(c) is a cross-sectional view taken on line VIIIC—VIIIC of FIG. 7
FIG. 8(d) is a cross-sectional view taken on line VIIID—VIIID of FIG. 7.

A semiconductor memory and a method for fabricating the same according to Embodiment 2 of the invention will now be described with reference to FIGS. 5(a) through 5(d), 6(a) through 6(d), 7 and 8(a) through 8(d). FIG. 8(a) shows the cross-sectional structure taken on line VIIIA—VIIIA of FIG. 7, FIG. 8(b) shows the cross-sectional structure taken on line VIIIB—VIIIB of FIG. 7, FIG. 8(c) shows the cross-sectional structure taken on line VIIIC—VIIIC of FIG. 7 and FIG. 8(d) shows the cross-sectional structure taken on line VIIID—VIIID of FIG. 7.

First, as shown in FIG. 5(a), a trapping film 21 that is made of a multilayer film composed of, for example, a silicon oxide film, a silicon nitride film and a silicon oxide film and has a thickness of 30 nm in total is deposited in a memory device formation region on a semiconductor substrate 20 of a silicon substrate. Then as shown in FIG. 5(b), a first polysilicon film 22 that is doped with, for example, $1 \times 10^{20}$ cm$^{-3}$ through $1 \times 10^{21}$ cm$^{-3}$ of phosphorus and has a thickness of 150 nm through 300 nm is deposited on the trapping film 21.

Next, as shown in FIG. 5(c), the first polysilicon film 22 is selectively etched by using, as a mask, a first resist pattern (omitted in the drawings) extending along the bit line direction, so as to pattern the first polysilicon film 22.

Then, as shown in FIG. 5(d), after depositing a silicon oxide film with a thickness of, for example, 50 nm through 200 nm over the semiconductor substrate 20, the silicon oxide film is etched back, so as to form a sidewall insulating film 23 on the side faces of the pattern of the first polysilicon film 22. In this case, a portion of the trapping film 21 exposed from the first polysilicon film 22 and the sidewall insulating film 23 is generally removed through the etching but this portion of the trapping film 21 may be allowed to remain. When the trapping film 21 thus remains, the semiconductor substrate 20 is less damaged during the etching.

Figure 6:
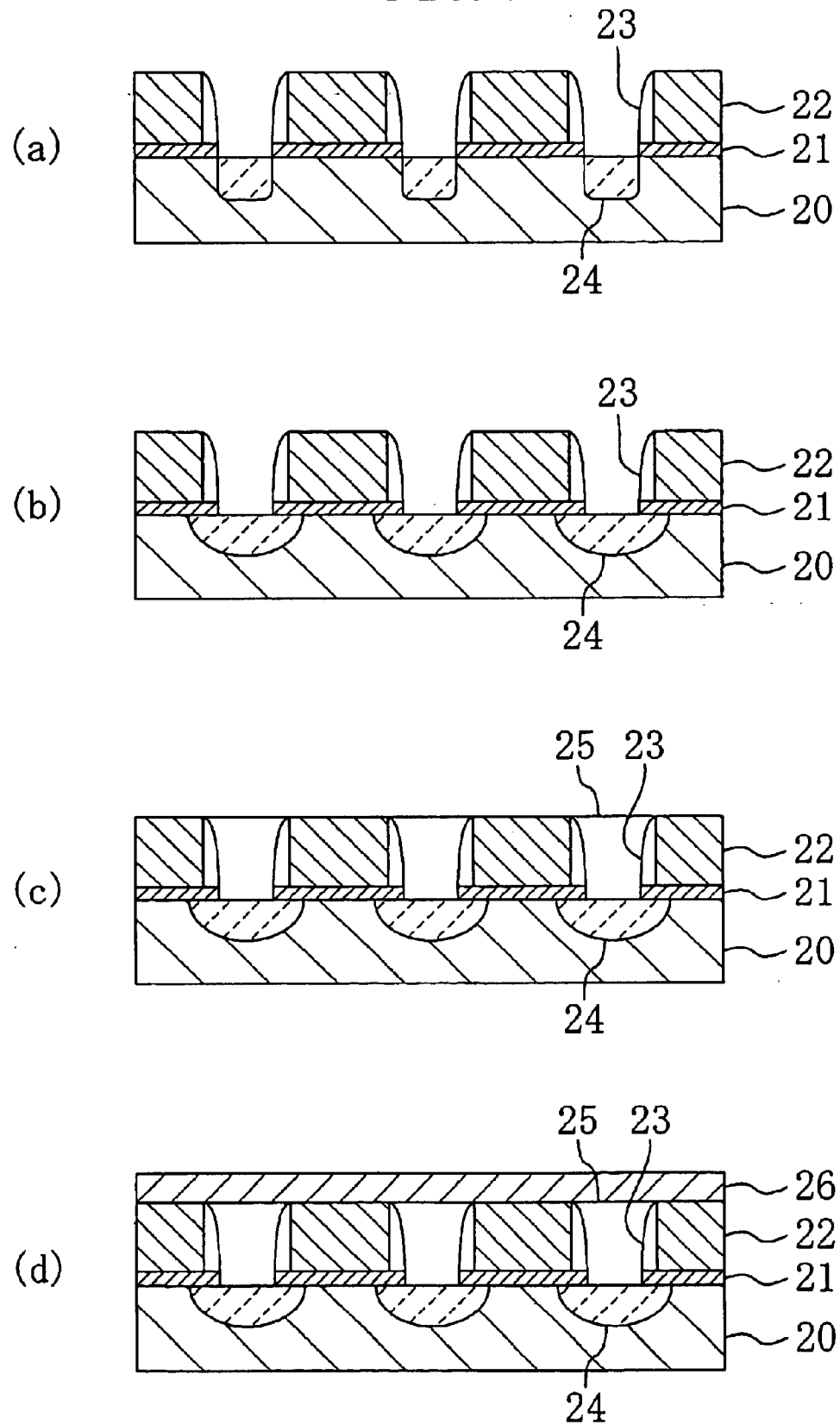
FIGS. 6(a) through 6(d) are cross-sectional views for showing other procedures in the method for fabricating a semiconductor memory according to Embodiment 2.

Then, as shown in FIG. 6(a), ions of an n-type impurity are implanted into the semiconductor substrate 20 at, for example, $1 \times 10^{15}$ cm$^{-2}$ through $1 \times 10^{16}$ cm$^{-2}$ by using the pattern of the first polysilicon film 22 and the sidewall insulating film 23 as a mask, so as to form an n-type high concentration impurity diffusion layer 24 working as a bit line.

Next, as shown in FIG. 6(b), the semiconductor substrate 20 is subjected to annealing at, for example, 850° C. through 950° C., so as to make the high concentration impurity diffusion layer 24 overlap the pattern of the first polysilicon film 22. This annealing can be performed through batch processing using an electric furnace or rapid thermal annealing (RTA) using a lamp.

Then, as shown in FIG. 6(c), after depositing a silicon oxide film over the semiconductor substrate 20, the silicon oxide film is subjected to, for example, the CMP or etch back, so as to remove a portion of the silicon oxide film present on the pattern of the first polysilicon film 22. Thus, a buried insulating film 25 is formed between the sidewall insulating films 23 opposing each other and on the high concentration impurity diffusion layer 24. In this case, the top faces of the pattern of the first polysilicon film 22 and the buried insulating film 25 are at substantially the same level.

Next, as shown in FIG. 6(d), a second polysilicon film 26 doped with, for example, $1 \times 10^{20}$ cm$^{-3}$ through $1 \times 10^{21}$ cm$^{-3}$ of phosphorus and having a thickness of 50 nm through 200 nm is deposited on the pattern of the first polysilicon film 22 and the buried insulating film 25.

Then, the second polysilicon film 26 and the pattern of the first polysilicon film 22 are selectively etched by using, as a mask, a second resist pattern (omitted in the drawings) extending along the word line direction. Thus, a gate electrode made of a pattern of the second polysilicon film 26 and a pattern of the first polysilicon film 22 is formed as shown in FIGS. 7 and 8(a) through 8(d).

According to Embodiment 2, since the sidewall insulating film 23 is formed on the side face of the pattern of the first polysilicon film 22 included in the gate electrode, not only the same effect as that attained in Embodiment 1 can be attained but also the short channel effect derived from diffusion of the impurity implanted into the high concentration impurity diffusion layer 24 can be suppressed. Therefore, the gate length can be reduced.

Accordingly, further refinement of a semiconductor memory can be realized by Embodiment 2.

Although a polysilicon film doped with an impurity is deposited as each of the first polysilicon film 22 and the second polysilicon film 26 in Embodiment 2, instead, a polysilicon film not doped with an impurity can be first deposited so as to be doped with an impurity afterward.

Also, each of the first polysilicon film 22 and the second polysilicon film 26 of Embodiment 2 may be replaced with an amorphous silicon film.

Moreover, although an n-type memory device is formed in Embodiment 2, a p-type memory device may be formed instead.

(Embodiment 3)

Figure 11:
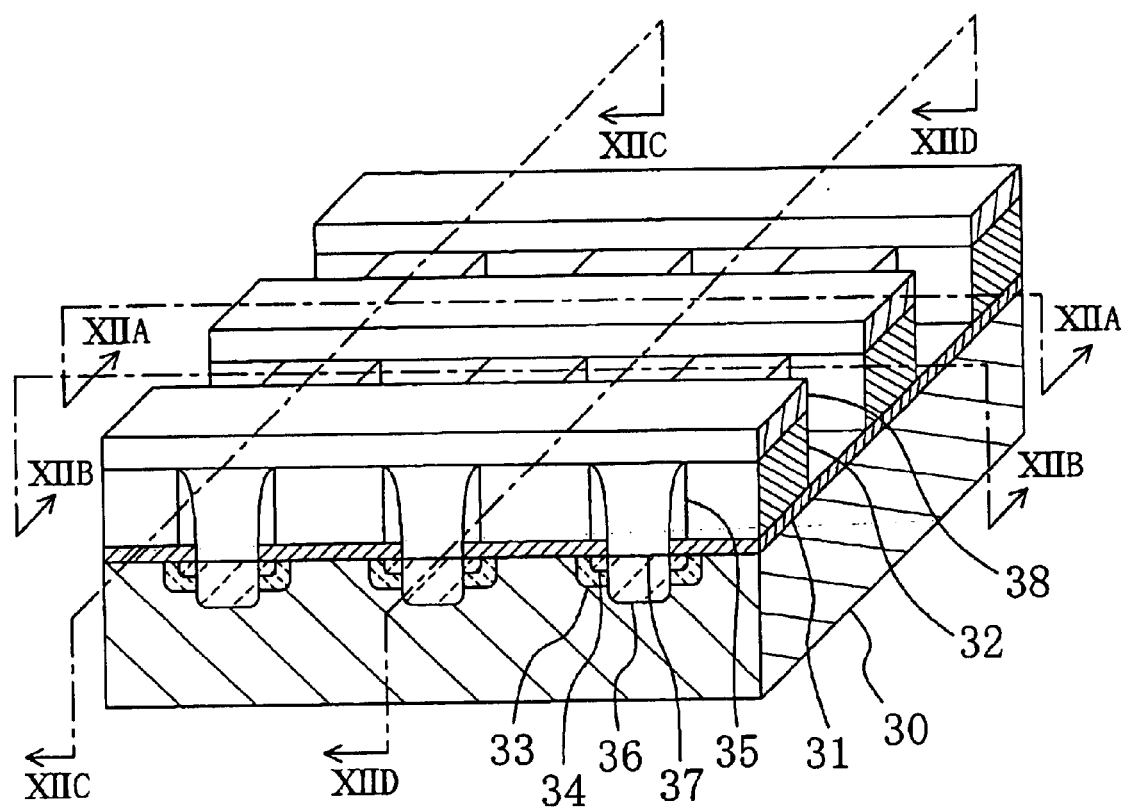
FIG. 11 is a perspective cross-sectional view of a semiconductor memory according to Embodiment 3.
Figure 12:
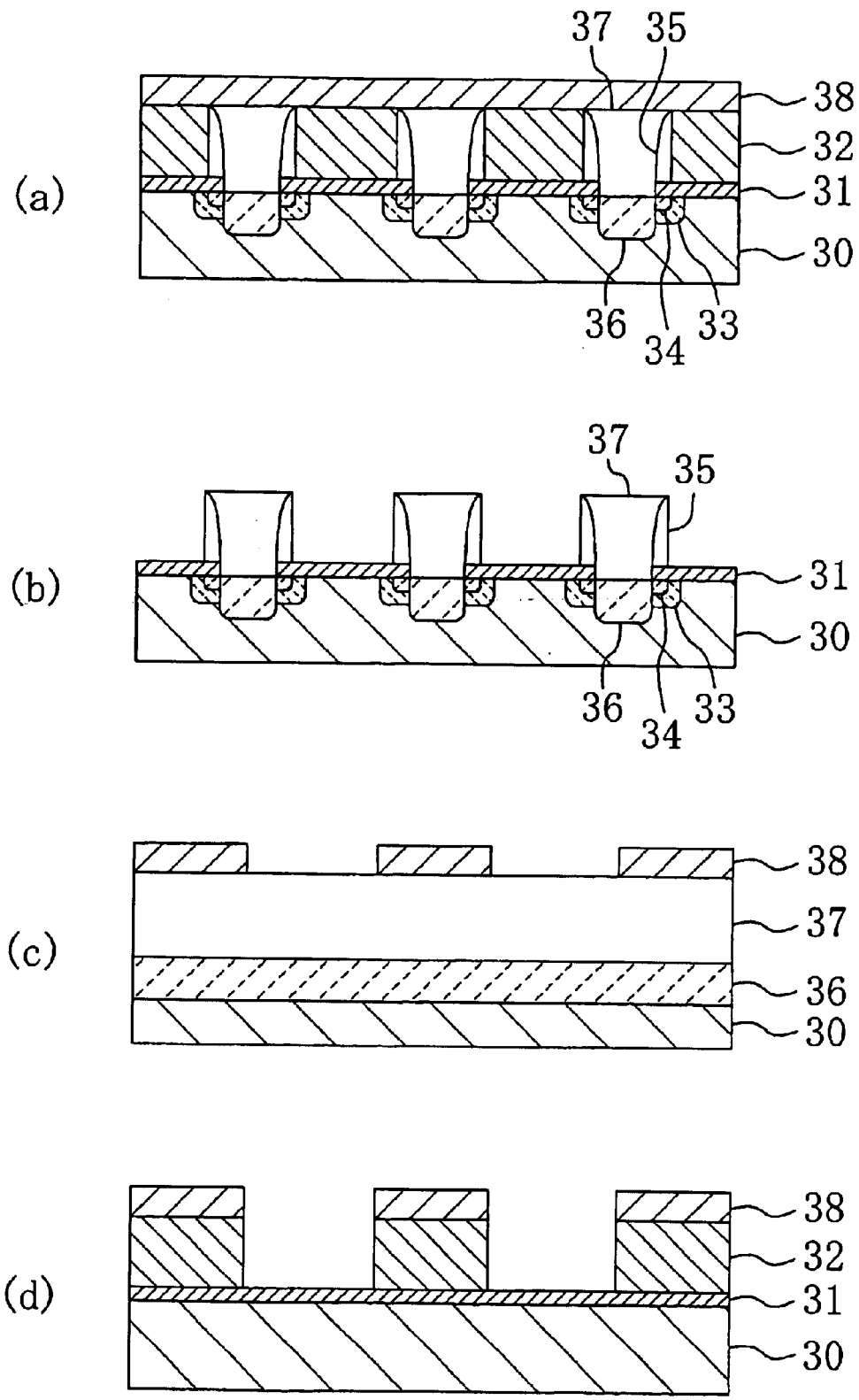
FIG. 12(a) is a cross-sectional view taken on line XIIA—XIIA of FIG. 11.
FIG. 12(b) is a cross-sectional view taken on line XIIB—XIIB of FIG. 11.
FIG. 12(c) is a cross-sectional view taken on line XIIC—XIIC of FIG. 11
FIG. 12(d) is a cross-sectional view taken on line XIID—XIID of FIG. 11.

A semiconductor memory and a method for fabricating the same according to Embodiment 3 of the invention will now be described with reference to FIGS. 9(a) through 9(d), 10(a) through 10(d), 11 and 12(a) through 12(d). FIG. 12(a) shows the cross-sectional structure taken on line XIIA—XIIA of FIG. 11, FIG. 12(b) shows the cross-sectional structure taken on line XIIB—XIIB of FIG. 11, FIG. 12(c) shows the cross-sectional structure taken on line XIIC—XIIC of FIG. 11 and FIG. 12(d) shows the cross-sectional structure taken on line XIID—XIID of FIG. 11.

Figure 9:
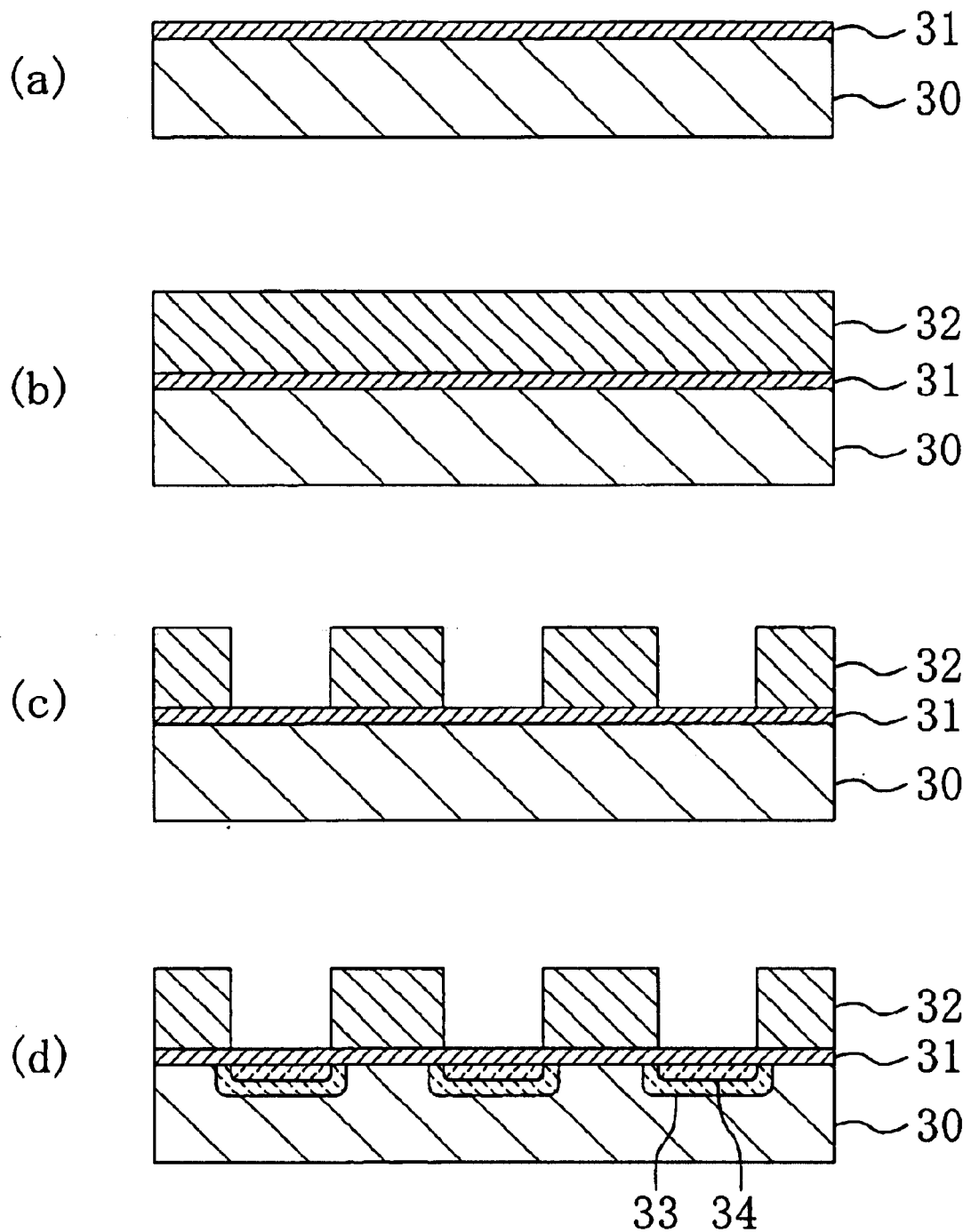
FIGS. 9(a) through 9(d) are cross-sectional views for showing procedures in a method for fabricating a semiconductor memory according to Embodiment 3.

First, as shown in FIG. 9(a), a trapping film 31 that is made of a multilayer film composed of, for example, a silicon oxide film, a silicon nitride film and a silicon oxide film and has a thickness of 30 nm in total is deposited in a memory device formation region on a semiconductor substrate 30 of a silicon substrate. Then, as shown in FIG. 9(b), a first polysilicon film 32 that is doped with, for example, $1 \times 10^{20}$ cm$^{-3}$ through $1 \times 10^{21}$ cm$^{-3}$ of phosphorus and has a thickness of 150 nm through 300 nm is deposited on the trapping film 31.

Next, as shown in FIG. 9(c), the first polysilicon film 32 is selectively etched by using, as a mask, a first resist pattern (omitted in the drawings) extending along the bit line direction, so as to pattern the first polysilicon film 32. In this etching, the trapping film 31 is preferably allowed to remain in order to protect the surface of the semiconductor substrate 30 in impurity implantation successively performed.

Then, as shown in FIG. 9(d), ions of a p-type impurity such as boron are implanted into the semiconductor substrate 30 at 20 keV through 50 keV and $1 \times 10^{12}$ cm$^{-2}$ through $1 \times 10^{13}$ cm$^{-2}$ by using the first resist pattern as a mask, so as to form a p-type impurity diffusion layer 33. Thereafter, ions of an n-type impurity such as arsenic are implanted into the semiconductor substrate 30 at 20 keV through 50 keV and $1 \times 10^{14}$ cm$^{-2}$ through $1 \times 10^{15}$ cm$^{-2}$ by using the first resist pattern used as a mask, so as to form an n-type low concentration impurity diffusion layer 34. Either of the implantation of the p-type impurity and the implantation of the n-type impurity may be performed prior.

Figure 10:
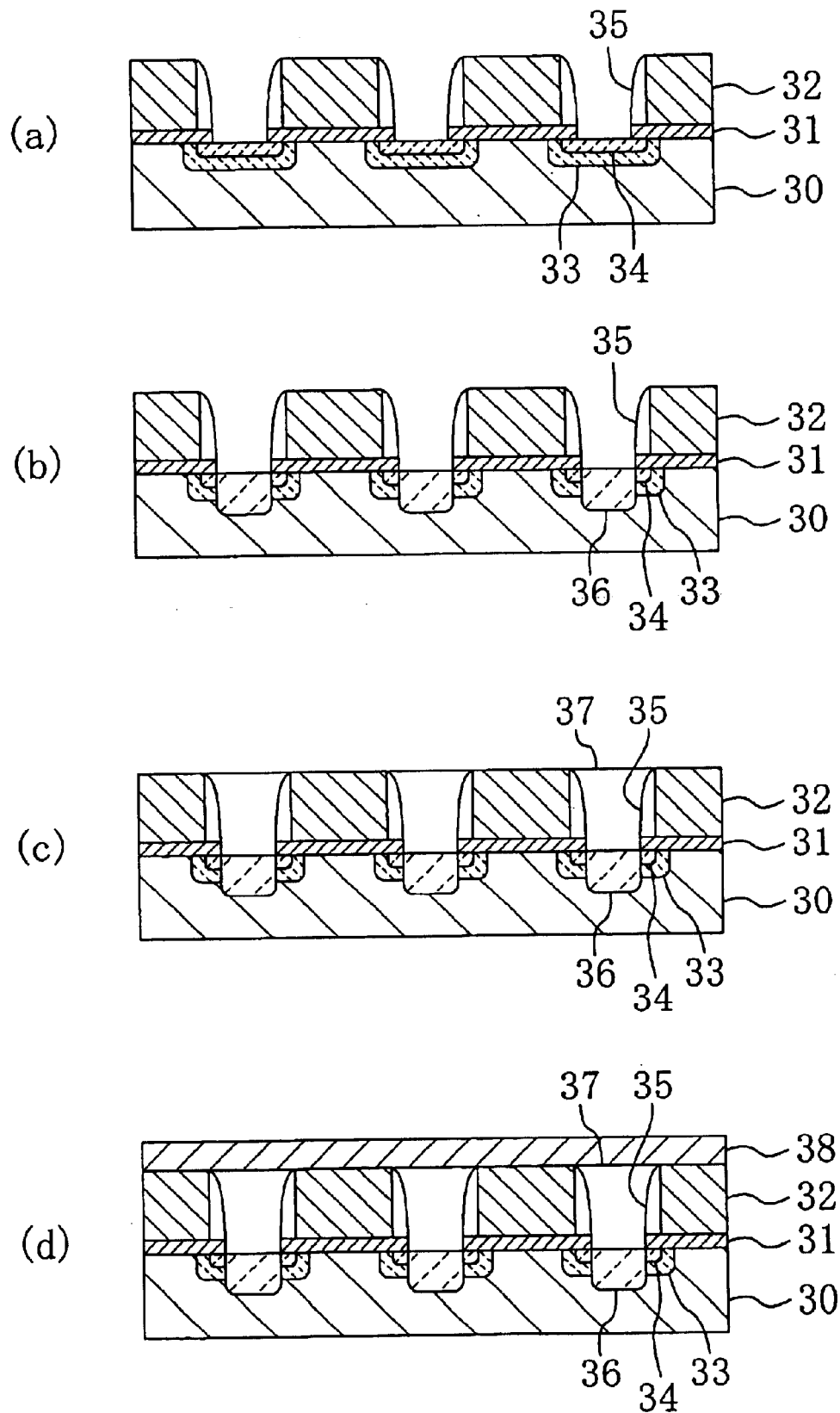
FIGS. 10(a) through 10(d) are cross-sectional views for showing other procedures in the method for fabricating a semiconductor memory according to Embodiment 3.

Next, as shown in FIG. 10(a), after depositing a silicon oxide film with a thickness of, for example, 50 nm through 200 nm over the semiconductor substrate 30, the silicon oxide film is etched back, so as to form a sidewall insulating film 35 on the side face of the pattern of the first polysilicon film 32.

Then, as shown in FIG. 10(b), ions of an n-type impurity are implanted into the semiconductor substrate 30 at, for example, $1 \times 10^{15}$ cm$^{-2}$ through $1 \times 10^{16}$ cm$^{-2}$ by using the pattern of the first polysilicon film 32 and the sidewall insulating film 35 as a mask, so as to form an n-type high concentration impurity diffusion layer 36 working as a bit line.

Next, as shown in FIG. 10(c), after depositing a silicon oxide film over the semiconductor substrate 30, the silicon oxide film is subjected to, for example, the CMP or etch back, so as to remove a portion of the silicon oxide film present on the pattern of the first polysilicon film 32. Thus, a buried insulating film 37 is formed between the sidewall insulating films 35 opposing each other and on the high concentration impurity diffusion layer 36. In this case, the top faces of the pattern of the first polysilicon film 32 and the buried insulating film 37 are at substantially the same level.

Then, as shown in FIG. 10(d), a second polysilicon film 38 doped with, for example, $1 \times 10^{20}$ cm$^{-3}$ through $1 \times 10^{21}$ cm$^{-3}$ of phosphorus and having a thickness of 50 nm through 200 nm is deposited on the pattern of the first polysilicon film 32 and the buried insulating film 37.

Next, the second polysilicon film 38 and the pattern of the first polysilicon film 32 are selectively etched by using, as a mask, a second resist pattern (omitted in the drawings) extending along the word line direction. Thus, as shown in FIGS. 11 and 12(a) through 12(d), a gate electrode made of a pattern of the second polysilicon film 38 and a pattern of the first polysilicon film 32 is formed.

According to Embodiment 3, the sidewall insulating film 35 is formed on the side face of the gate electrode after forming the low concentration impurity diffusion layer 34, and thereafter, the high concentration impurity diffusion layer 36 is formed by implanting the n-type impurity by using the pattern of the first polysilicon film 32 and the sidewall insulating film 35 as a mask, namely, the semiconductor memory has an LDD structure. Therefore, not only the same effect as that attained by Embodiment 1 can be attained but also the short channel effect derived from the diffusion of the impurity implanted into the high concentration impurity diffusion layer 36 can be suppressed. Therefore, the gate length can be reduced.

Also, although the first resist pattern not shown is used as the mask for forming the p-type impurity diffusion layer 33 and the n-type low concentration impurity diffusion layer 34 in Embodiment 3, the pattern of the first polysilicon film 32 may be used instead.

Furthermore, although a polysilicon film doped with an impurity is deposited as each of the first polysilicon film 32 and the second polysilicon film 38 in Embodiment 3, instead, a polysilicon film not doped with an impurity can be first deposited so as to be doped with an impurity afterward.

Also, each of the first polysilicon film 32 and the second polysilicon film 38 of Embodiment 3 may be replaced with an amorphous silicon film.

Moreover, although an n-type memory device is formed in Embodiment 3, a p-type memory device may be formed instead.

(Embodiment 4)

Figure 15:
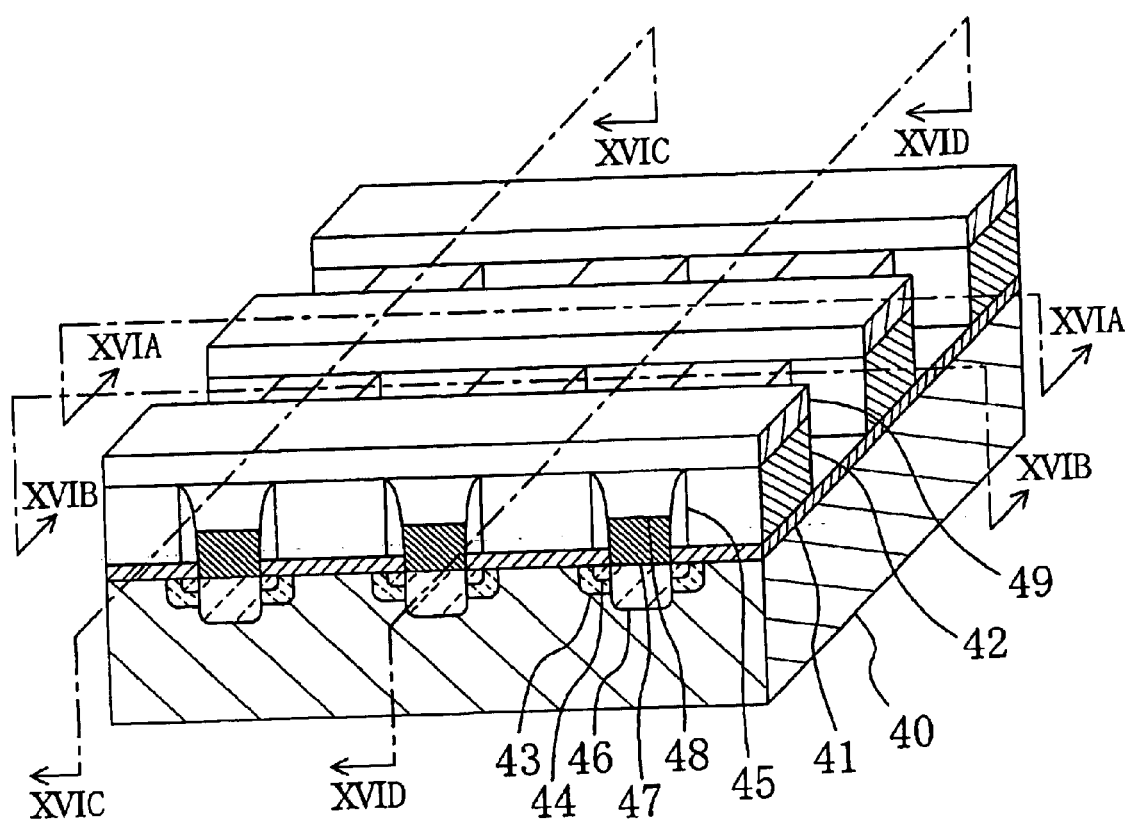
FIG. 15 is a perspective cross-sectional view of a semiconductor memory according to Embodiment 4.
Figure 16:
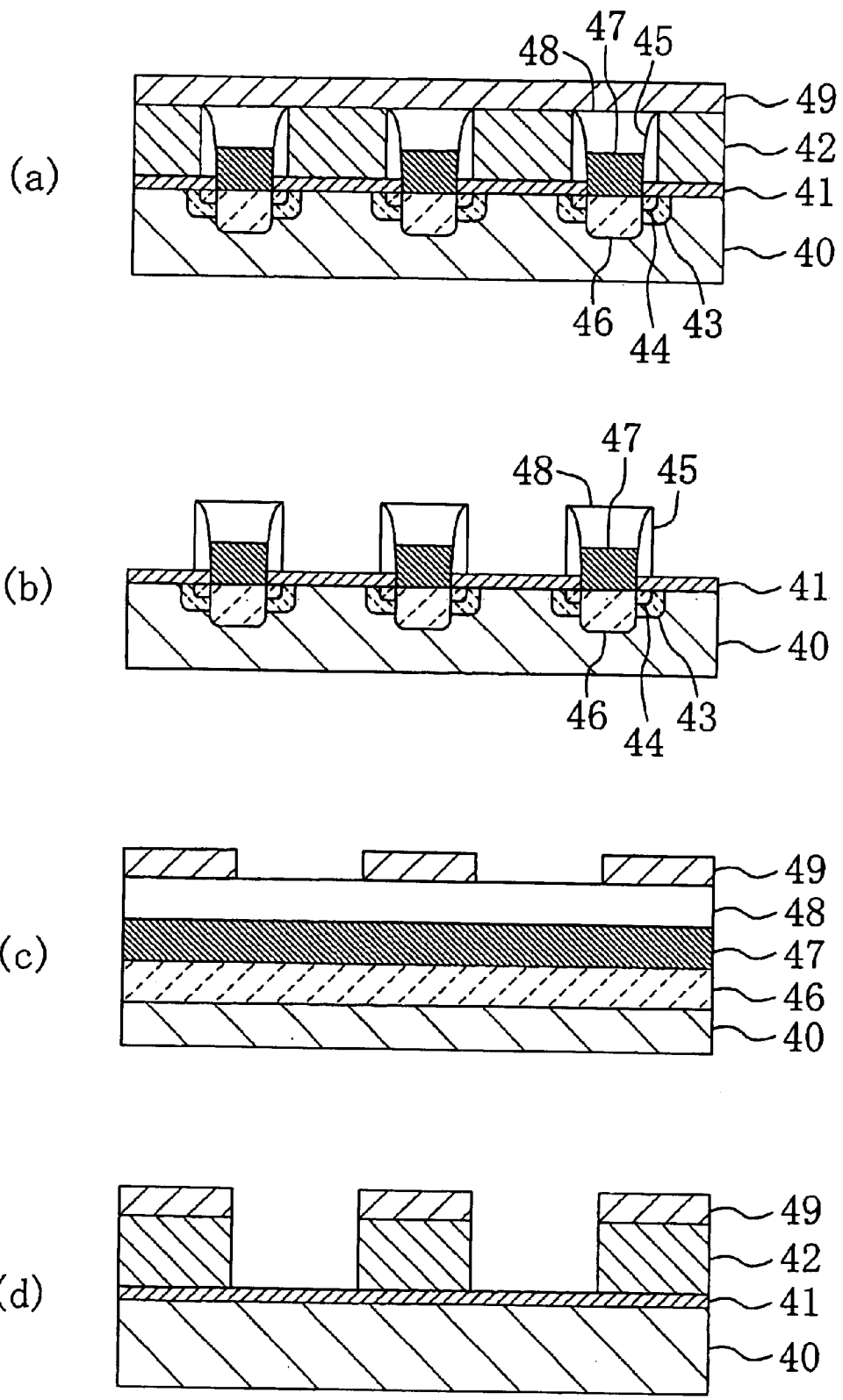
FIG. 16(a) is a cross-sectional view taken on line XVIA—XVIA of FIG. 15.
FIG. 16(b) is a cross-sectional view taken on line XVIB—XVIB of FIG. 15.
FIG. 16(c) is a cross-sectional view taken on line XVIC—XVIC of FIG. 15
FIG. 16(d) is a cross-sectional view taken on line XVID—XVID of FIG. 15.

A semiconductor memory and a method for fabricating the same according to Embodiment 4 of the invention will now be described with reference to FIGS. 13(a) through 13(e), 14(a) through 14(d), 15 and 16(a) through 16(d). FIG. 16(a) shows the cross-sectional structure taken on line XVIA—XVIA of FIG. 15, FIG. 16(b) shows the cross-sectional structure taken on line XVIB—XVIB of FIG. 15, FIG. 16(c) shows the cross-sectional structure taken on line XVIC—XVIC of FIG. 15 and FIG. 16(d) shows the cross-sectional structure taken on line XVID—XVID of FIG. 15.

Figure 13:
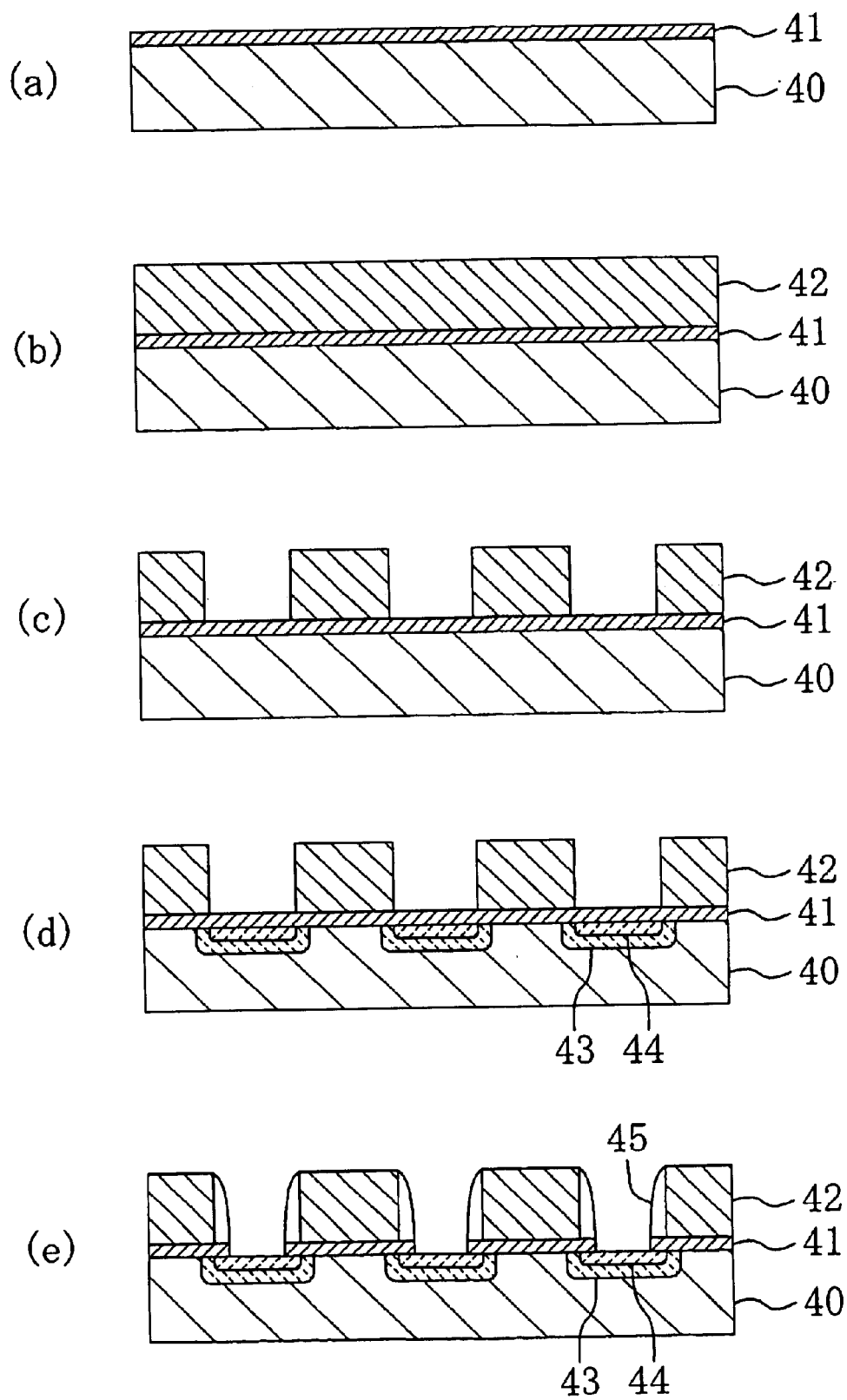
FIGS. 13(a) through 13(e) are cross-sectional views for showing procedures in a method for fabricating a semiconductor memory according to Embodiment 4.

First, as shown in FIG. 13(a), a trapping film 41 that is made of a multilayer film composed of, for example, a silicon oxide film, a silicon nitride film and a silicon oxide film and has a thickness of 30 nm in total is deposited in a memory device formation region on a semiconductor substrate 40 of a silicon substrate. Then, as shown in FIG. 13(b), a first polysilicon film 42 that is doped with, for example, $1 \times 10^{20}$ cm$^{-3}$ through $1 \times 10^{21}$ cm$^{-3}$ of phosphorus and has a thickness of 150 nm through 300 nm is deposited on the trapping film 41.

Next, as shown in FIG. 13(c), the first polysilicon film 42 is selectively etched by using, as a mask, a first resist pattern (omitted in the drawings) extending along the bit line direction, so as to pattern the first polysilicon film 42. In this etching, the trapping film 42 is preferably allowed to remain in order to protect the surface of the semiconductor substrate 40 in impurity implantation successively performed.

Then, as shown in FIG. 13(d), ions of a p-type impurity such as boron are implanted into the semiconductor substrate 40 at 20 keV through 50 keV and $1 \times 10^{12}$ cm$^{-2}$ through $1 \times 10^{13}$ cm$^{-2}$ by using the first resist pattern as a mask, so as to form a p-type impurity diffusion layer 43. Thereafter, ions of an n-type impurity such as arsenic are implanted into the semiconductor substrate 40 at 20 keV through 50 keV and $1 \times 10^{14}$ cm$^{-2}$ through $1 \times 10^{15}$ cm$^{-2}$ by using the first resist pattern as a mask, so as to form an n-type low concentration impurity diffusion layer 44.

Next, as shown in FIG. 13(e), after depositing a silicon oxide film with a thickness of, for example, 50 nm through 200 nm over the semiconductor substrate 40, the silicon oxide film is etched back, so as to form a sidewall insulating film 45 on the side face of the pattern of the first polysilicon film 42.

Figure 14:
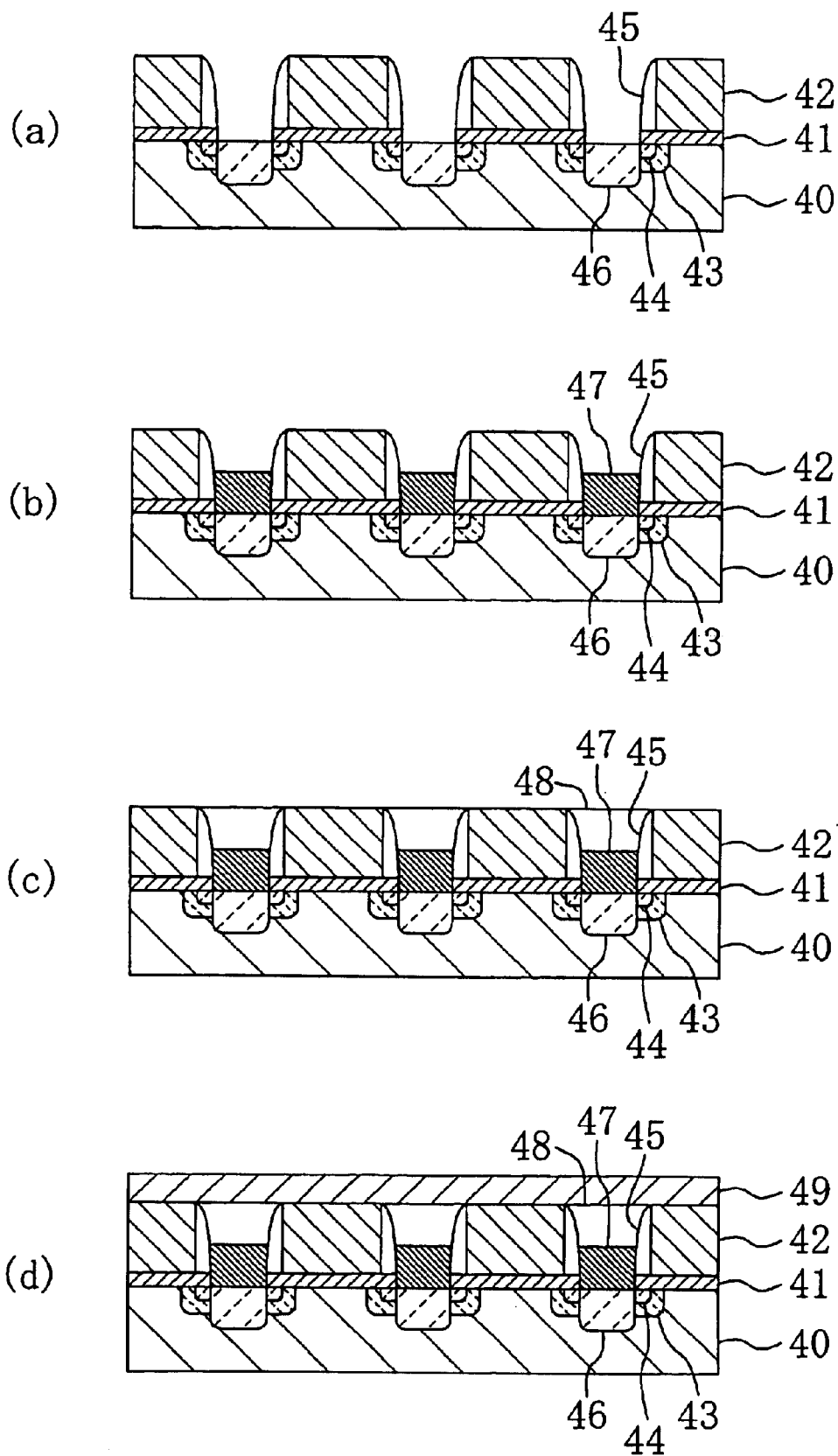
FIGS. 14(a) through 14(d) are cross-sectional views for showing other procedures in the method for fabricating a semiconductor memory according to Embodiment 4.

Then, as shown in FIG. 14(a), ions of an n-type impurity are implanted into the semiconductor substrate 40 at, for example, $1 \times 10^{15}$ cm$^{-2}$ through $1 \times 10^{16}$ cm$^{-2}$ by using the pattern of the first polysilicon film 42 and the sidewall insulating film 45 as a mask, so as to form an n-type high concentration impurity diffusion layer 46 working as a bit line.

Next, as shown in FIG. 14(b), after depositing a tungsten film over the semiconductor substrate 40, the tungsten film is etched back, so as to form, between the sidewall insulating films 45 opposing each other and on the high concentration impurity diffusion layer 46, a metal film 47 having the top face at a level lower than the top face of the pattern of the first polysilicon film 42. In this case, the metal film 47 preferably has a melting point of approximately 400° C. or more. Also, the top face of the metal film 47 is preferably at approximately a half height of the top face of the pattern of the first polysilicon film 42. This is because, when the metal film 47 has a too large thickness, there is a fear of short-circuit between the metal film 47 and the pattern of the first polysilicon film 42, and when the metal film 47 has a too small thickness, there is a fear of elimination of the metal film 47 in etching subsequently performed.

Next, as shown in FIG. 14(c), after depositing a silicon oxide film over the semiconductor substrate 40, the silicon oxide film is subjected to, for example, the CMP or etch back, so as to remove a portion of the silicon oxide film present on the pattern of the first polysilicon film 42. Thus, a buried insulating film 48 is formed between the sidewall insulating films 45 opposing each other and on the metal film 47. In this case, the top faces of the pattern of the first polysilicon film 42 and the buried insulating film 48 are at substantially the same level.

Then, as shown in FIG. 14(d), a second polysilicon film 49 doped with, for example, $1 \times 10^{20}$ cm$^{-3}$ through $1 \times 10^{21}$ cm$^{-3}$ of phosphorus and having a thickness of 50 nm through 200 nm is deposited on the pattern of the first polysilicon film 42 and the buried insulating film 48.

Next, the second polysilicon film 49 and the pattern of the first polysilicon film 42 are selectively etched by using, as a mask, a second resist pattern (omitted in the drawings) extending along the word line direction. Thus, as shown in FIGS. 15 and 16(a) through 16(d), a gate electrode made of a pattern of the second polysilicon film 49 and a pattern of the first polysilicon film 42 is formed.

According to Embodiment 4, since the metal film 47 is provided between the sidewall insulating films 45 opposing each other and on the high concentration impurity diffusion layer 46 working as a bit line, the resistance of the bit line can be lowered.

Although the first resist pattern not shown is used as the mask for forming the p-type impurity diffusion layer 43 and the n-type low concentration impurity diffusion layer 44 in Embodiment 4, the pattern of the first polysilicon film 42 may be used instead.

Furthermore, although a polysilicon film doped with an impurity is deposited as each of the first polysilicon film 42 and the second polysilicon film 49 in Embodiment 4, instead, a polysilicon film not doped with an impurity can be first deposited so as to be doped with an impurity afterward.

Also, each of the first polysilicon film 42 and the second polysilicon film 49 of Embodiment 4 may be replaced with an amorphous silicon film.

Moreover, although an n-type memory device is formed in Embodiment 4, a p-type memory device may be formed instead.

(Embodiment 5)

Figure 19:
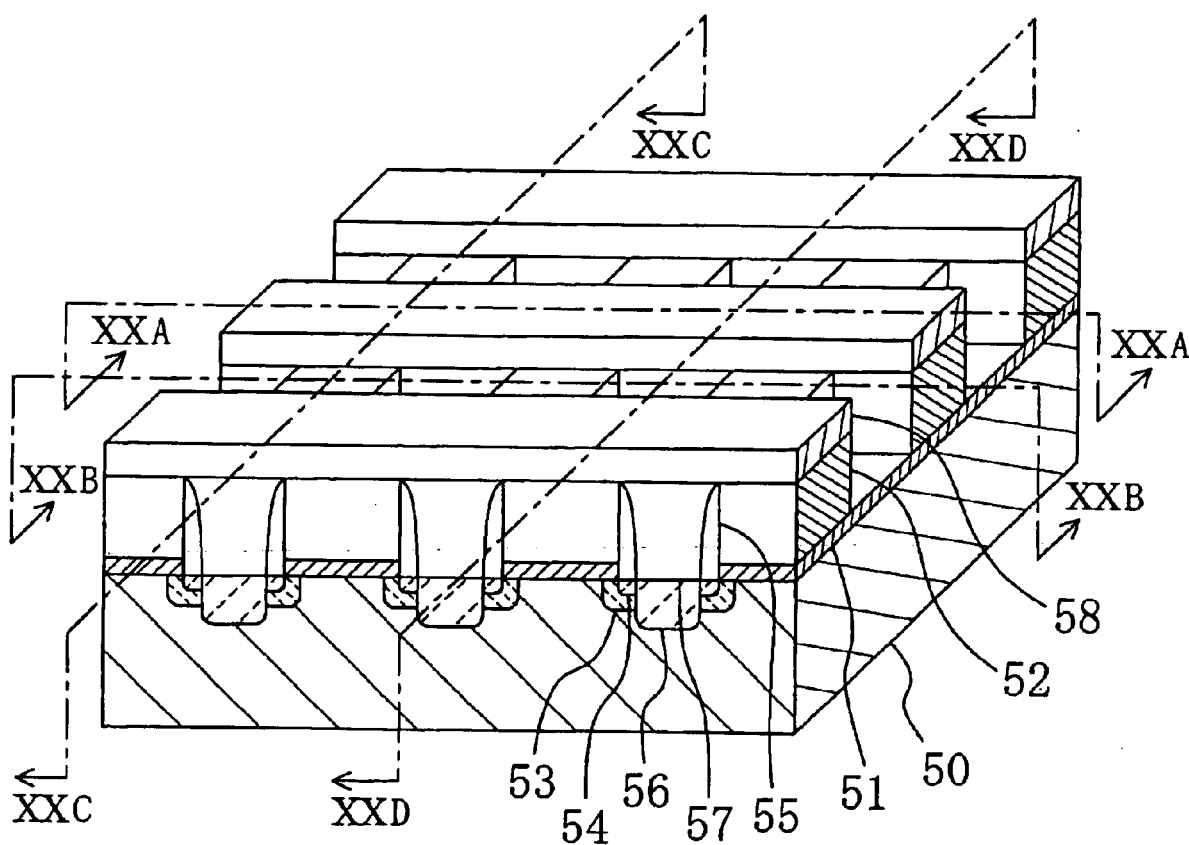
FIG. 19 is a perspective cross-sectional view of a semiconductor memory according to Embodiment 5.
Figure 20:
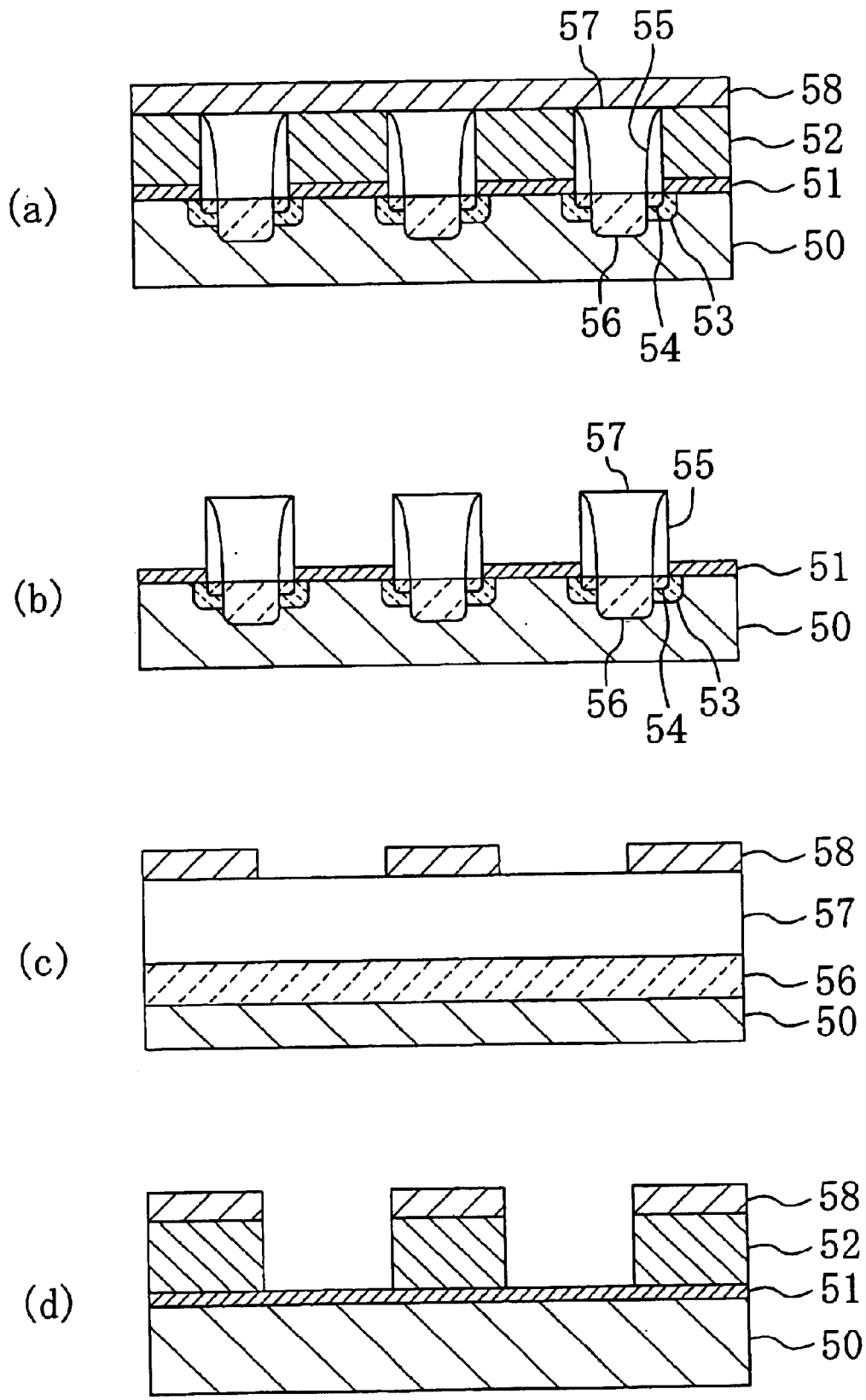
FIG. 20(a) is a cross-sectional view taken on line XXA—XXA of FIG. 19.
FIG. 20(b) is a cross-sectional view taken on line XXB—XXB of FIG. 19.
FIG. 20(c) is a cross-sectional view taken on line XXC—XXC of FIG. 19
FIG. 20(d) is a cross-sectional view taken on line XXD—XXD of FIG. 19.

A semiconductor memory and a method for fabricating the same according to Embodiment 5 of the invention will now be described with reference to FIGS. 17(a) through 17(d), 18(a) through 18(d), 19 and 20(a) through 20(d). FIG. 20(a) shows the cross-sectional structure taken on line XXA—XXA of FIG. 19, FIG. 20(b) shows the cross-sectional structure taken on line XXB—XXB of FIG. 19, FIG. 20(c) shows the cross-sectional structure taken on line XXC—XXC of FIG. 19 and FIG. 20(d) shows the cross-sectional structure taken on line XXD—XXD of FIG. 19.

First, as shown in FIG. 17(a), a trapping film 51 that is made of a multilayer film composed of, for example, a silicon oxide film, a silicon nitride film and a silicon oxide film and has a thickness of 30 nm in total is deposited in a memory device formation region on a semiconductor substrate 50 of a silicon substrate. Then, as shown in FIG. 17(b), a first polysilicon film 52 that is doped with, for example, $1 \times 10^{20}$ cm$^{-3}$ through $1 \times 10^{21}$ cm$^{-3}$ of phosphorus and has a thickness of 150 nm through 300 nm is deposited on the trapping film 51.

Next, the first polysilicon film 52 and the trapping film 51 are selectively etched by using, as a mask, a first resist pattern (omitted in the drawings) extending along the bit line direction, so as to pattern the first polysilicon film 52 and the trapping film 51.

Then, as shown in FIG. 17(d), ions of a p-type impurity such as boron are implanted into the semiconductor substrate 50 at 20 keV through 50 keV and $1 \times 10^{12}$ cm$^{-2}$ through $1 \times 10^{13}$ cm$^{-2}$ by using the pattern of the first polysilicon film 52 as a mask, so as to form a p-type impurity diffusion layer 53. Thereafter, ions of an n-type impurity such as arsenic are implanted into the semiconductor substrate 50 at 20 keV through 50 keV and $1 \times 10^{14}$ cm$^{-2}$ through $1 \times 10^{15}$ cm$^{-2}$ by using the pattern of the first polysilicon film 52 as a mask, so as to from an n-type low concentration impurity diffusion layer 54.

Figure 18:
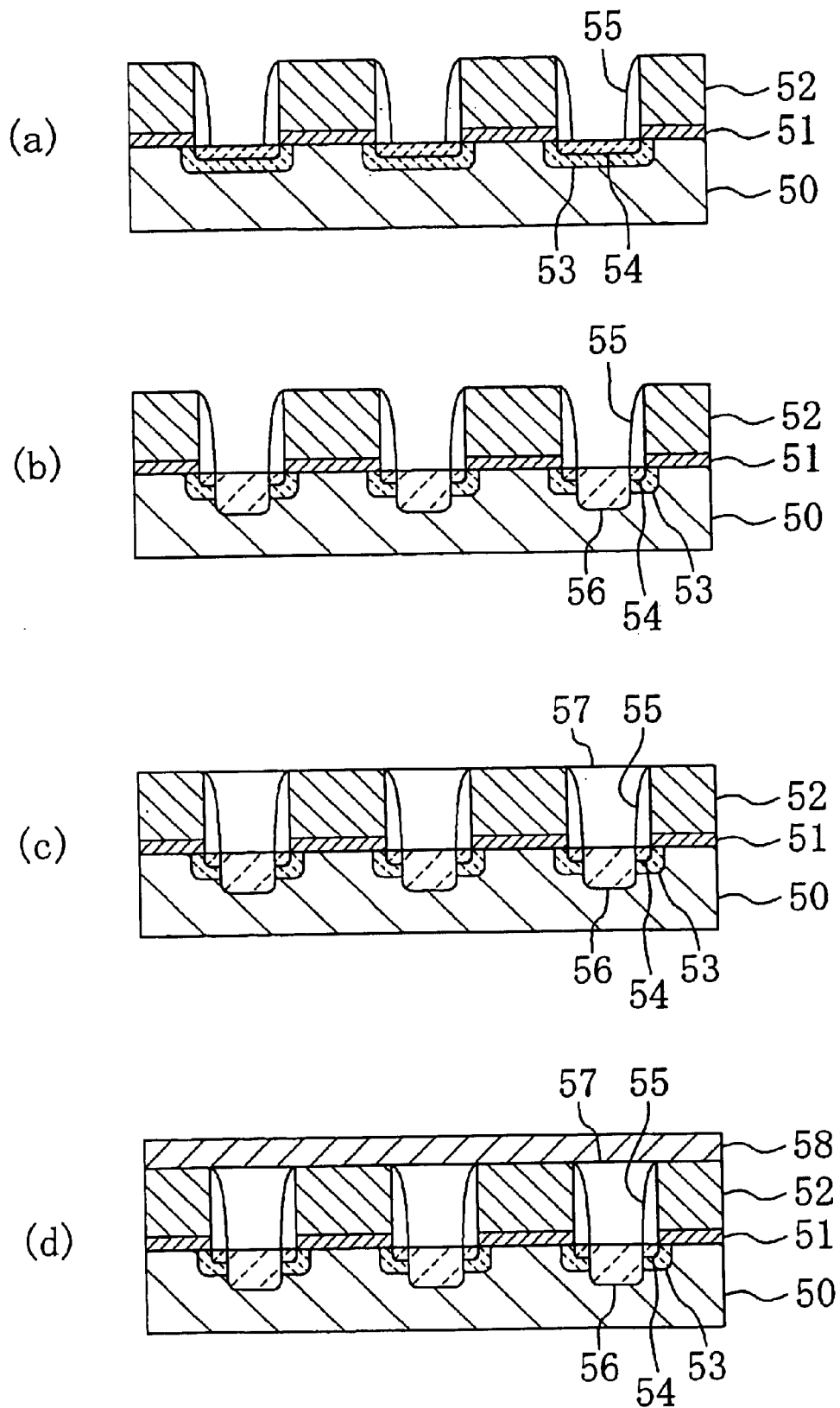
FIGS. 18(a) through 18(d) are cross-sectional views for showing other procedures in the method for fabricating a semiconductor memory according to Embodiment 5.

Next, as shown in FIG. 18(a), after depositing a silicon oxide film with a thickness of, for example, 50 nm through 200 nm over the semiconductor substrate 50, the silicon oxide film is etched back, so as to form a sidewall insulating film 55 on the side face of the pattern of the first polysilicon film 52.

Then, as shown in FIG. 18(b), ions of an n-type impurity are implanted into the semiconductor substrate 50 at, for example, $1 \times 10^{15}$ cm$^{-2}$ through $1 \times 10^{16}$ cm$^{-2}$ by using the pattern of the first polysilicon film 52 and the sidewall insulating film 55 as a mask, so as to form an n-type high concentration impurity diffusion layer 56 working as a bit line.

Next, as shown in FIG. 18(c), after depositing a silicon oxide film over the semiconductor substrate 50, the silicon oxide film is subjected to, for example, the CMP or etch back, so as to remove a portion of the silicon oxide film present on the pattern of the first polysilicon film 52. Thus, a buried insulating film 57 is formed between the sidewall insulating films 55 opposing each other and on the high concentration impurity diffusion layer 56. In this case, the top faces of the pattern of the first polysilicon film 52 and the buried insulating film 57 are at substantially the same level.

Then, as shown in FIG. 18(d), a second polysilicon film 58 doped with, for example, $1 \times 10^{20}$ cm$^{-3}$ through $1 \times 10^{21}$ cm$^{-3}$ of phosphorus and having a thickness of 50 nm through 200 nm is deposited on the pattern of the first polysilicon film 52 and the buried insulating film 57.

Next, the second polysilicon film 58 and the pattern of the first polysilicon film 52 are selectively etched by using, as a mask, a second resist pattern (omitted in the drawings) extending along the word line direction. Thus, as shown in FIGS. 19 and 20(a) through 20(d), a gate electrode made of a pattern of the second polysilicon film 58 and a pattern of the first polysilicon film 52 is formed.

According to Embodiment 5, the n-type low concentration impurity diffusion layer 54 is formed by implanting the impurity ions after exposing the semiconductor substrate 50 in a portion to be used as the bit line by patterning the first polysilicon film 52 and the trapping film 51. Therefore, as compared with the case where the ion implantation is performed with the trapping film 51 remaining (see FIG. 9(d)), the acceleration energy of the ion implantation can be lowered. In other words, in the case where the trapping film made of the multilayer film composed of a silicon oxide film, a silicon nitride film and a silicon oxide film and having a thickness of 30 nm remains as in Embodiment 3, the acceleration energy of 60 keV or more is necessary. However, when the trapping film has been removed, the acceleration energy can be lowered to the lower limit of the acceleration energy of the ion implanter (which is currently approximately 10 keV).

Although the n-type low concentration impurity diffusion layer 54 is formed through the ion implantation in Embodiment 5, it may be formed through a plasma doping method or a solid state diffusion method instead.

Also, although a polysilicon film doped with an impurity is deposited as each of the first polysilicon film 52 and the second polysilicon film 58 in Embodiment 5, instead, a polysilicon film not doped with an impurity can be first deposited so as to be doped with an impurity afterward.

Furthermore, each of the first polysilicon film 52 and the second polysilicon film 58 of Embodiment 5 may be replaced with an amorphous silicon film.

Moreover, although an n-type memory device is formed in Embodiment 5, a p-type memory device may be formed instead.

(Embodiment 6)

Figure 24:
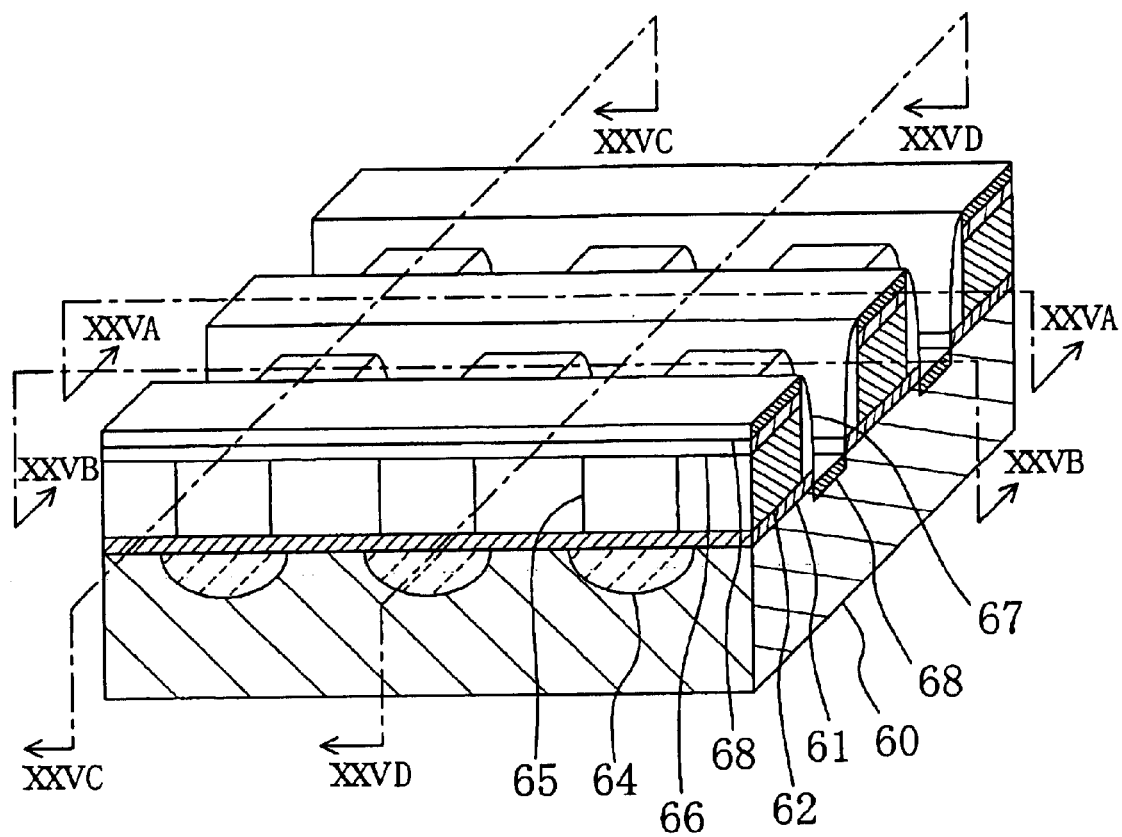
FIG. 24 is a perspective cross-sectional view of a semiconductor memory according to Embodiment 6.
Figure 25:
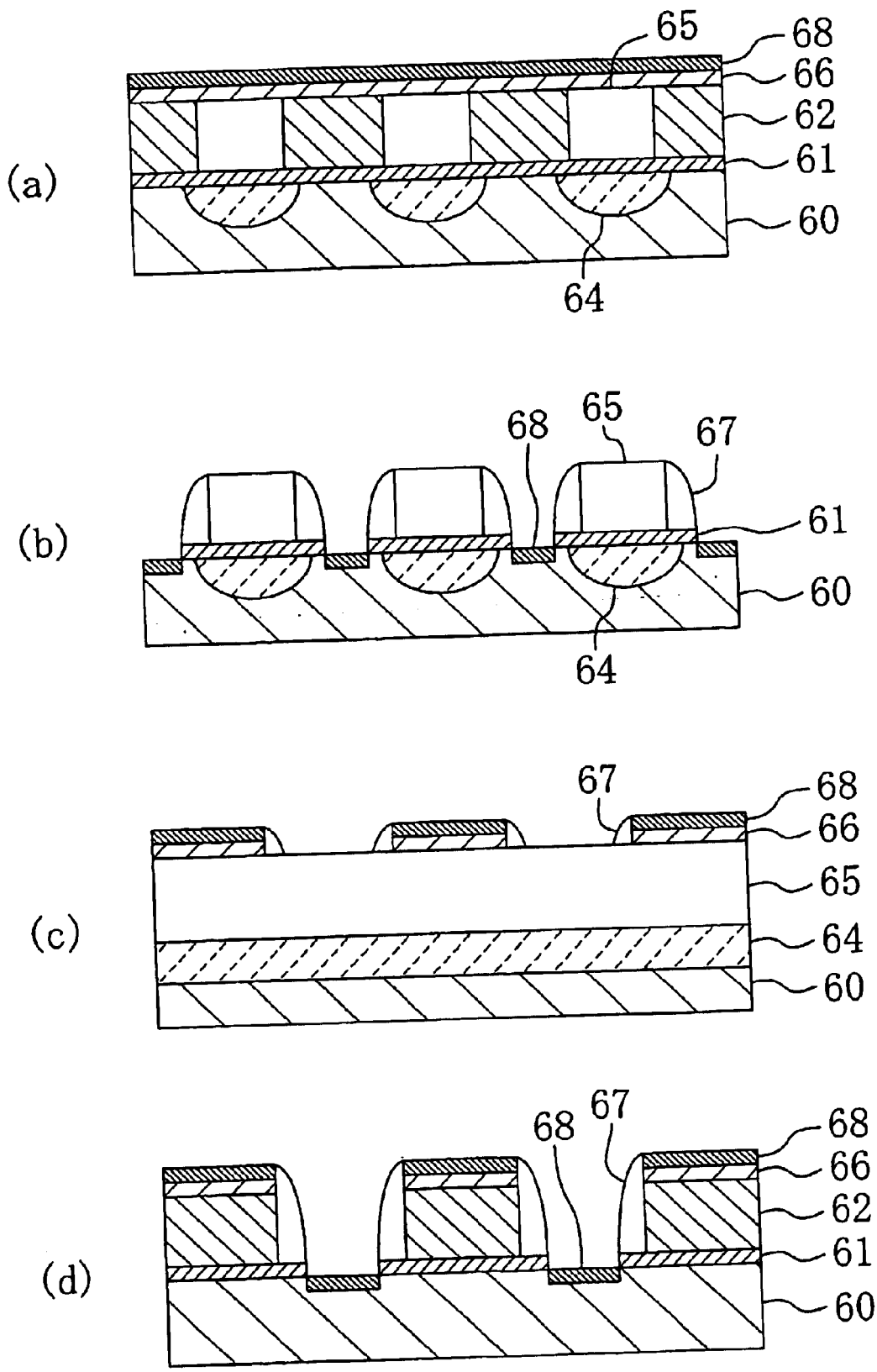
FIG. 25(a) is a cross-sectional view taken on line XXVA—XXVA of FIG. 24.
FIG. 25(b) is a cross-sectional view taken on line XXVB—XXVB of FIG. 24.
FIG. 25(c) is a cross-sectional view taken on line XXVC—XXVC of FIG. 24
FIG. 25(d) is a cross-sectional view taken on line XXVD—XXVD of FIG. 24.

A semiconductor memory and a method for fabricating the same according to Embodiment 6 of the invention will now be described with reference to FIGS. 21(a) through 21(d), 22(a) through 22(d), 23(a) through 23(d), 24 and 25(a) through 25(d). FIG. 25(a) shows the cross-sectional structure taken on line XXVA—XXVA of FIG. 24, FIG. 25(b) shows the cross-sectional structure taken on line XXVB—XXVB of FIG. 24, FIG. 25(c) shows the cross-sectional structure taken on line XXVC—XXVC of FIG. 24 and FIG. 25(d) shows the cross-sectional structure taken on line XXVD—XXVD of FIG. 24.

Figure 21:
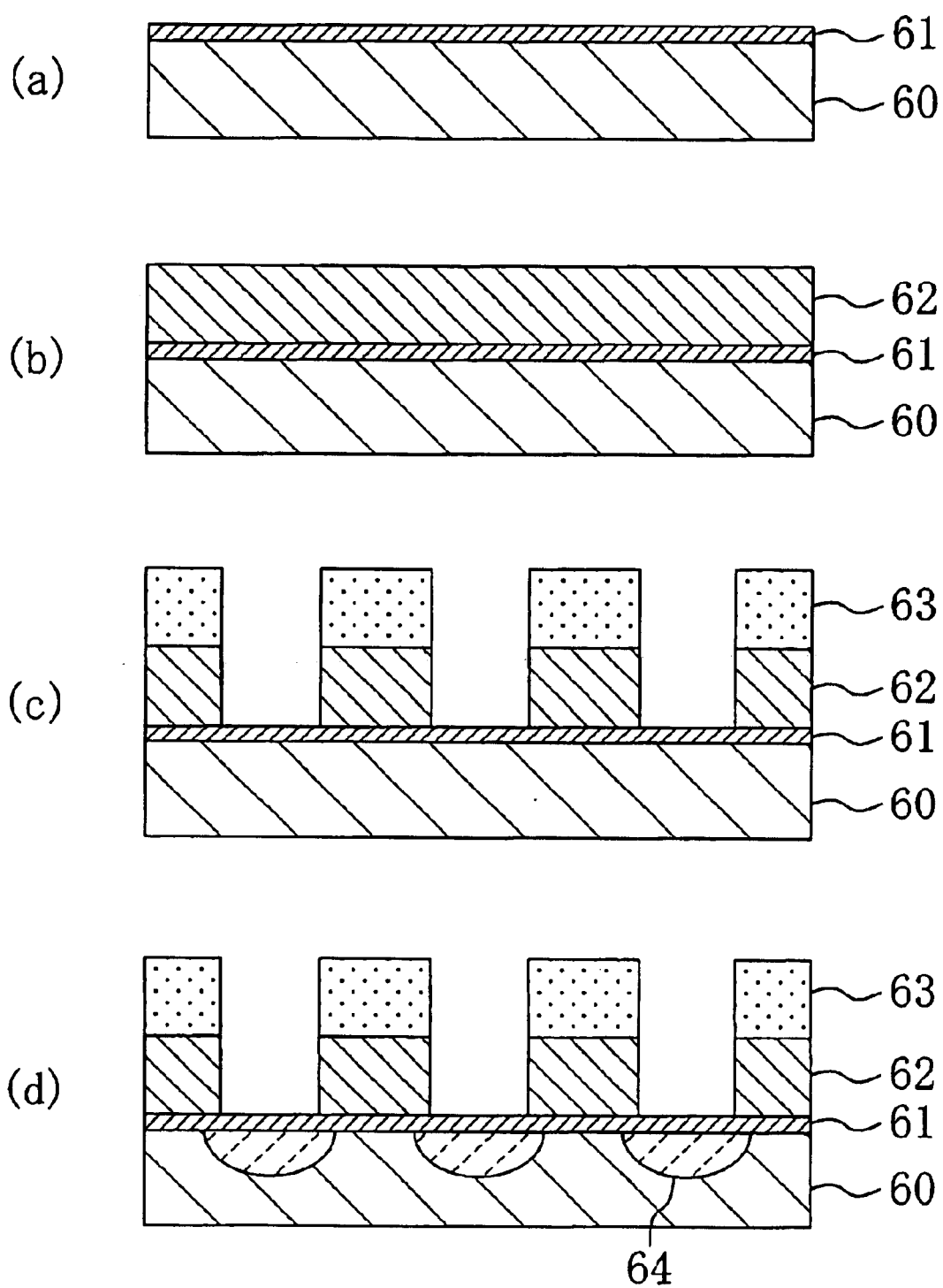
FIGS. 21(a) through 21(d) are cross-sectional views for showing procedures in a method for fabricating a semiconductor memory according to Embodiment 6.

First, as shown in FIG. 21(a), a trapping film 61 that is made of a multilayer film composed of, for example, a silicon oxide film, a silicon nitride film and a silicon oxide film and has a thickness of 30 nm in total is deposited in a memory device formation region on a semiconductor substrate 60 of a silicon substrate. Then, as shown in FIG. 21(b), a first polysilicon film 62 that is doped with, for example, $1 \times 10^{20}$ cm$^{-3}$ through $1 \times 10^{21}$ cm$^{-3}$ of phosphorus and has a thickness of 150 nm through 300 nm is deposited on the trapping film 61.

Next, as shown in FIG. 21(c), the first polysilicon film 62 is selectively etched by using, as a mask, a first resist pattern 63 extending along the bit line direction, so as to pattern the first polysilicon film 62. In this etching, the trapping film 61 is preferably allowed to remain for protecting the surface of the semiconductor substrate 60 in impurity implantation subsequently performed.

Then, as shown in FIG. 21(d), ions of an n-type impurity are implanted into the semiconductor substrate 60 at, for example, $1 \times 10^{15}$ cm$^{-2}$ through $1 \times 10^{16}$ cm$^{-2}$ by using the first resist pattern 63 as a mask, so as to form an n-type high concentration impurity diffusion layer 64 working as a bit line.

Figure 22:
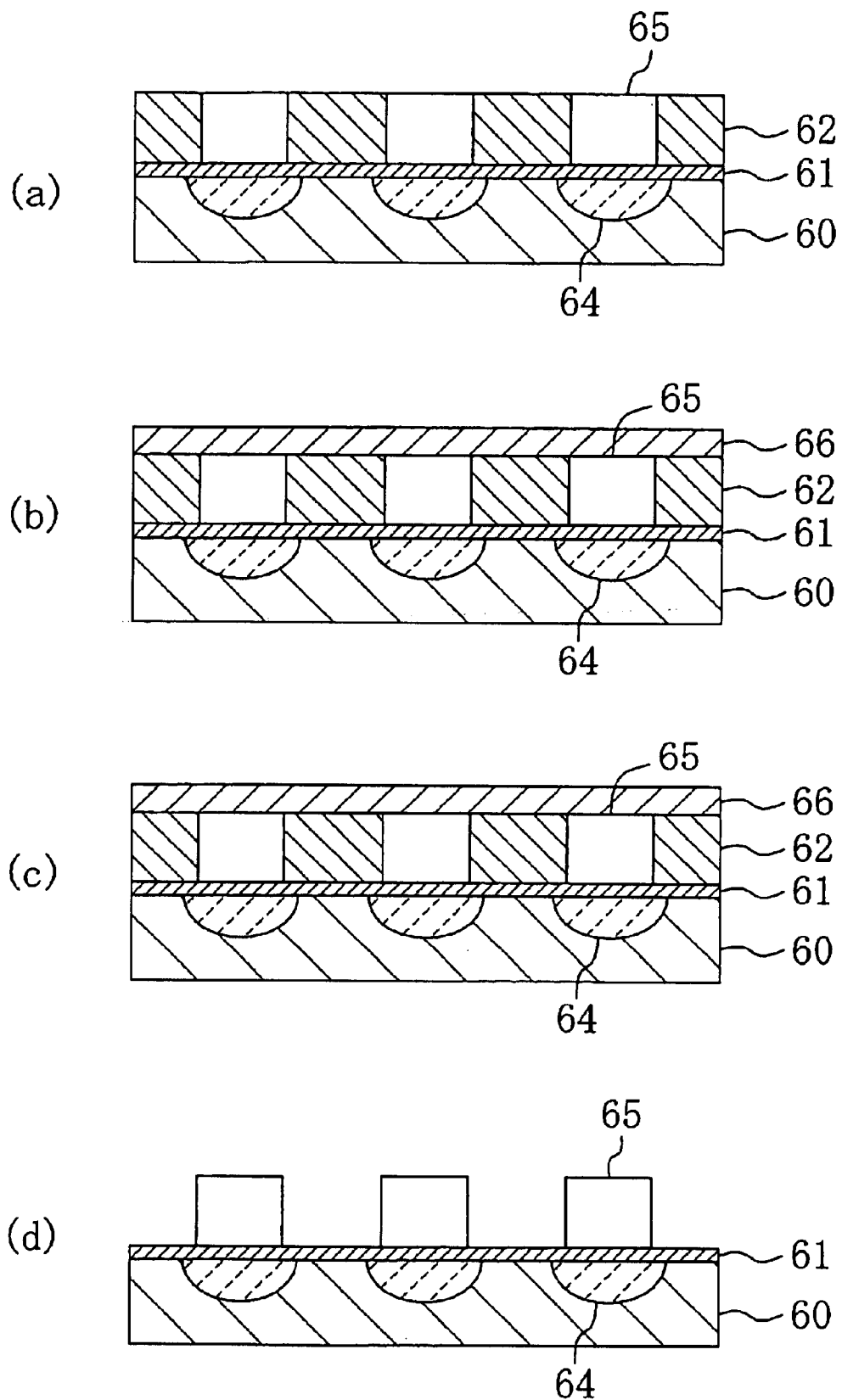
FIGS. 22(a) through 22(d) are cross-sectional views for showing other procedures in the method for fabricating a semiconductor memory according to Embodiment 6.

Next, as shown in FIG. 22(a), after depositing a silicon oxide film over the semiconductor substrate 60, the silicon oxide film is subjected to, for example, the CMP or etch back, so as to remove a portion of the silicon oxide film present on the pattern of the first polysilicon film 62. Thus, a buried insulating film 65 is formed between the patterns of the first polysilicon film 62 and on the high concentration impurity diffusion layer 64. In this case, the top faces of the pattern of the first polysilicon film 62 and the buried insulating film 65 are at substantially the same level.

Then, as shown in FIG. 22(b), a second polysilicon film 66 doped with, for example, $1 \times 10^{20}$ cm$^{-3}$ through $1 \times 10^{21}$ cm$^{-3}$ of phosphorus and having a thickness of 50 nm through 200 nm is deposited on the pattern of the first polysilicon film 62 and the buried insulating film 65.

Next, as shown in FIGS. 22(c) and 22(d), the second polysilicon film 66 and the pattern of the first polysilicon film 62 are selectively etched by using, as a mask, a second resist pattern (omitted in the drawings) extending along the word line direction. It is noted that FIG. 22(c) shows the cross-sectional structure taken on line XXVA—XXVA of FIG. 24 and FIG. 22(d) shows the cross-sectional structure taken on line XXVB—XXVB of FIG. 24.

Figure 23:
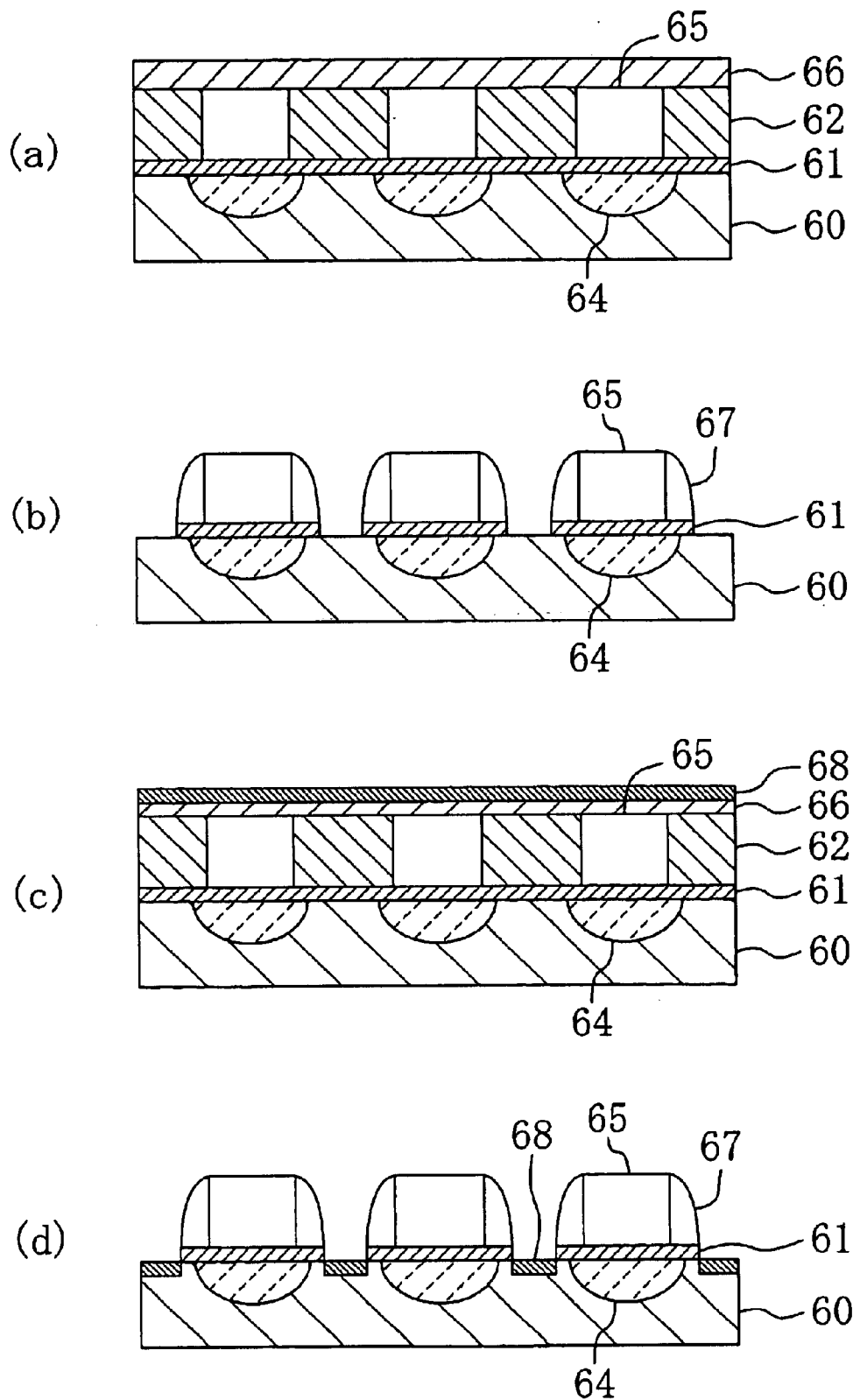
FIGS. 23(a) through 23(d) are cross-sectional views for showing other procedures in the method for fabricating a semiconductor memory according to Embodiment 6.

Then, as shown in FIGS. 23(a) and 23(b), after depositing a silicon oxide film over the semiconductor substrate 60, the silicon oxide film is etched back, so as to form a sidewall insulating film 67 on the side faces of the buried insulating film 65 and the patterns of the first and second polysilicon films 62 and 66 (see FIGS. 25(c) and 25(d)). In this manner, a portion of the semiconductor substrate 60 outside the high concentration impurity diffusion layer 64 is covered with the buried insulating film 65 and the sidewall insulating film 67. It is noted that FIG. 23(a) shows the cross-sectional structure taken on line XXVA—XXVA of FIG. 24 and FIG. 23(b) shows the cross-sectional structure taken on line XXVB—XXVB of FIG. 24.

Next, as shown in FIGS. 23(c) and 23(d), after depositing a cobalt film over the semiconductor substrate 60, the annealing is performed, so as to form a silicide layer 68 in a surface portion of the pattern of the second polysilicon film 66 and in a surface portion of the semiconductor substrate 60 exposed from the buried insulating film 65 and the sidewall insulating film 67. Thus, as shown in FIGS. 24 and 25(a) through 25(d), a gate electrode made of a pattern of the second polysilicon film 66 having the silicide layer 68 in the surface portion thereof and a pattern of the first polysilicon film 62 is formed.

According to Embodiment 6, since the silicide layer 68 is formed in the surface portion of the second polysilicon film 66 included in the gate electrode, the resistance of the gate electrode can be lowered.

In this case, the silicide layer 68 is formed after covering the portion of the semiconductor substrate 60 outside the high concentration impurity diffusion layer 64 with the buried insulating film 65 and the sidewall insulating film 67 by forming the sidewall insulating film 67 on the side face of the buried insulating film 65. Therefore, the high concentration impurity diffusion layers 64 can be prevented from short-circuited through the silicide layer 68 formed in the surface portion of the semiconductor substrate 60 (see FIG. 25(b)).

Although the first resist pattern 63 is used as the mask for forming the high concentration impurity diffusion layer 64 in Embodiment 6, the pattern of the first polysilicon film 62 may be used instead with the first resist pattern 63 removed.

Also, although a polysilicon film doped with an impurity is deposited as each of the first polysilicon film 62 and the second polysilicon film 66 in Embodiment 6, instead, a polysilicon film not doped with an impurity can be first deposited so as to be doped with an impurity afterward.

Furthermore, each of the first polysilicon film 62 and the second polysilicon film 66 of Embodiment 6 maybe replaced with an amorphous silicon film.

Furthermore, although the silicide layer 68 is formed by depositing the cobalt film, the cobalt film may be replaced with a single-layer film of a titanium film, a nickel film or a platinum film, or a multilayer film composed of any of these films.

Moreover, although an n-type memory device is formed in Embodiment 6, a p-type memory device may be formed instead.

(Embodiment 7)

Figure 29:
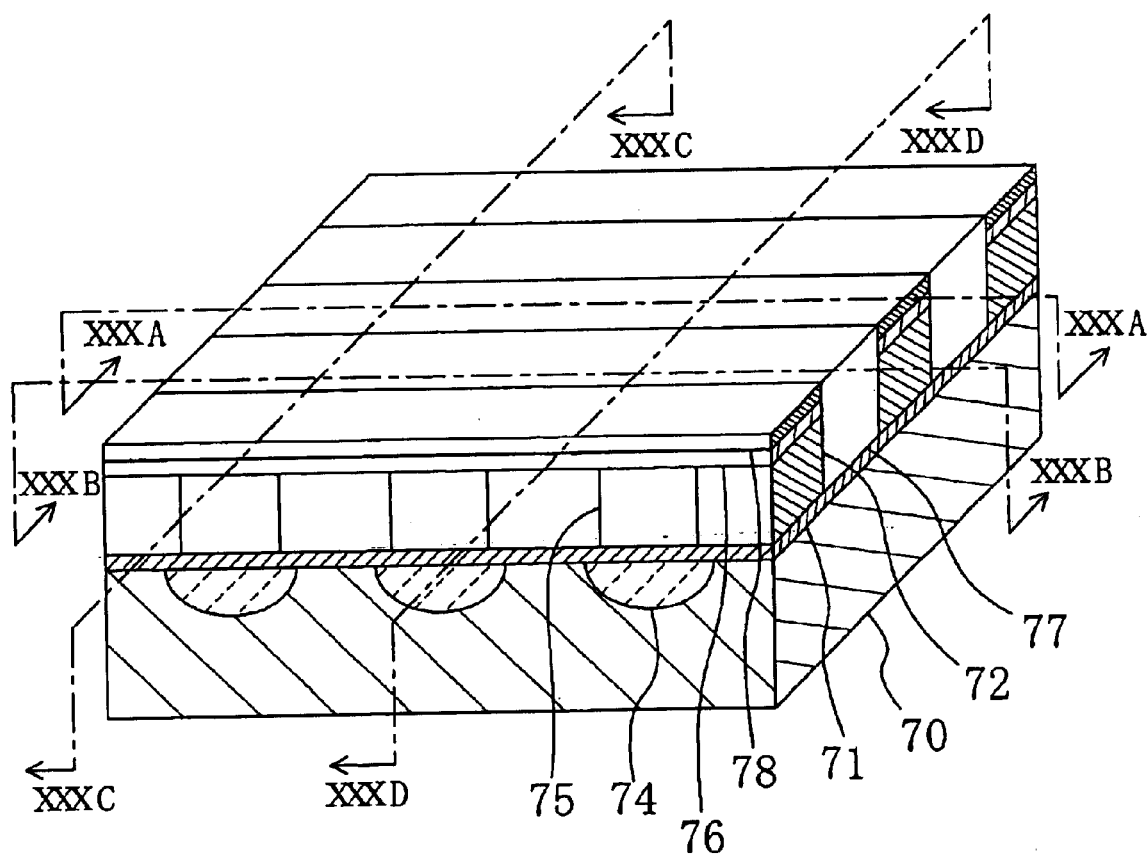
FIG. 29 is a perspective cross-sectional view of a semiconductor memory according to Embodiment 7.
Figure 30:
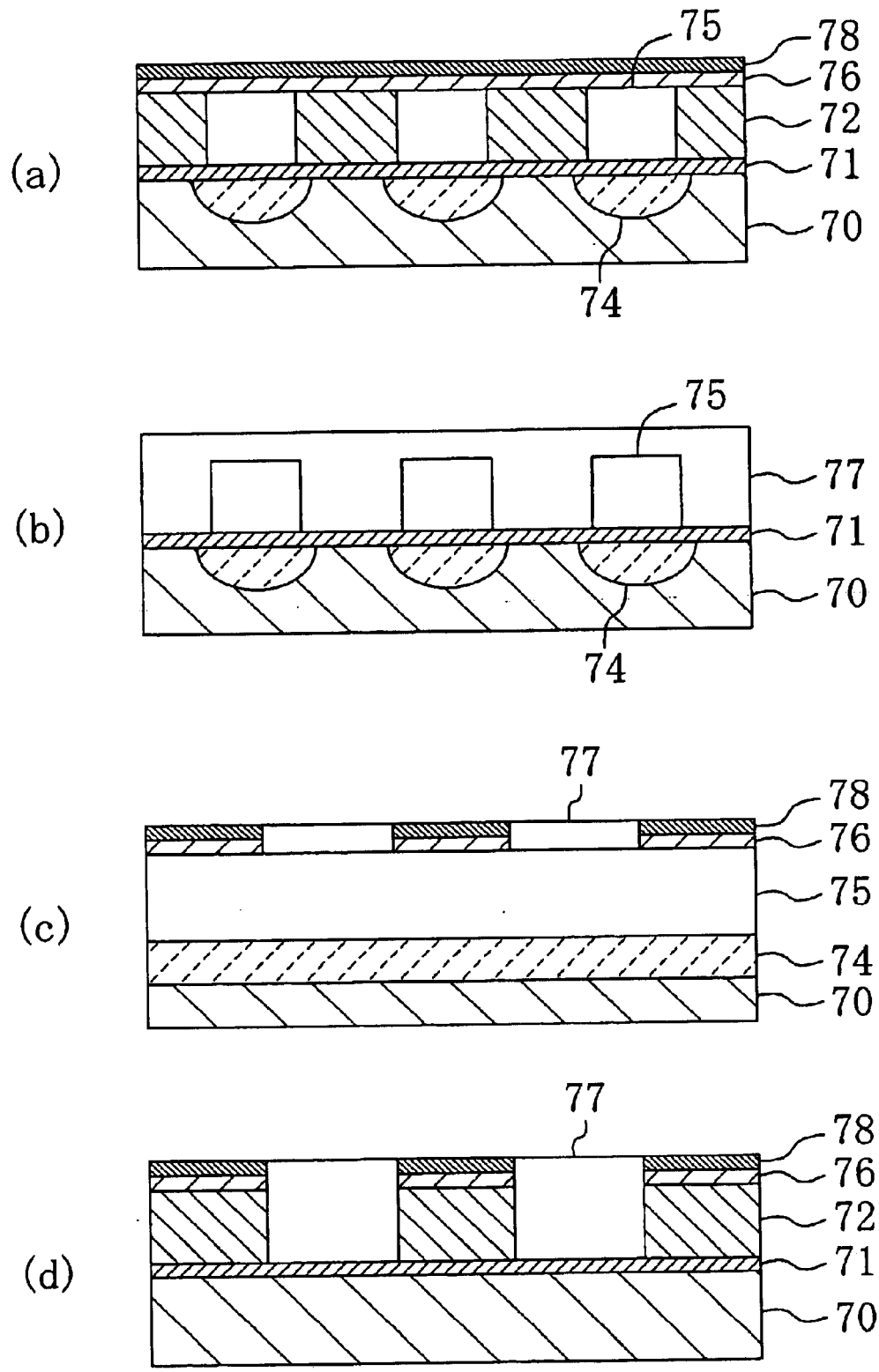
FIG. 30(a) is a cross-sectional view taken on line XXXA—XXXA of FIG. 29.
FIG. 30(b) is a cross-sectional view taken on line XXXB—XXXB of FIG. 29.
FIG. 30(c) is a cross-sectional view taken on line XXXC—XXXC of FIG. 29
FIG. 30(d) is a cross-sectional view taken on line XXXD—XXXD of FIG. 29.

A semiconductor memory and a method for fabricating the same according to Embodiment 7 of the invention will now be described with reference to FIGS. 26(a) through 26(d), 27(a) through 27(d), 28(a) through 28(d), 29 and 30(a) through 30(d). FIG. 30(a) shows the cross-sectional structure taken on line XXXA—XXXA of FIG. 29, FIG. 30(b) shows the cross-sectional structure taken on line XXXB—XXXB of FIG. 29, FIG. 30(c) shows the cross-sectional structure taken on line XXXC—XXXC of FIG. 29 and FIG. 30(d) shows the cross-sectional structure taken on line XXXD—XXXD of FIG. 29.

Figure 26:
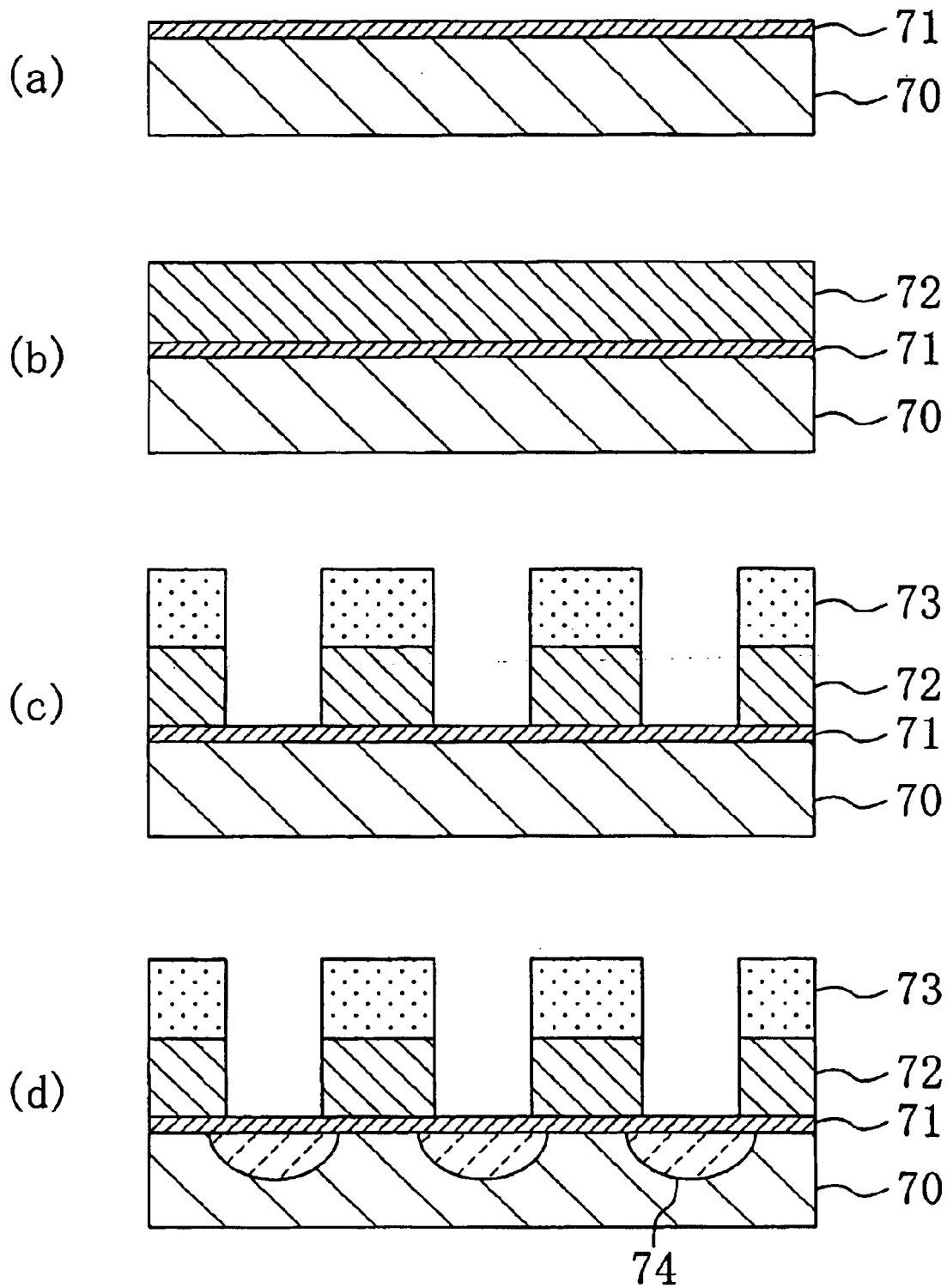
FIGS. 26(a) through 26(d) are cross-sectional views for showing procedures in a method for fabricating a semiconductor memory according to Embodiment 7.

First, as shown in FIG. 26(a), a trapping film 71 that is made of a multilayer film composed of, for example, a silicon oxide film, a silicon nitride film and a silicon oxide film and has a thickness of 30 nm in total is deposited in a memory device formation region on a semiconductor substrate 70 of a silicon substrate. Then, as shown in FIG. 26(b), a first polysilicon film 72 that is doped with, for example, $1 \times 10^{20}$ cm$^{-3}$ through $1 \times 10^{21}$ cm$^{-3}$ of phosphorus and has a thickness of 150 nm through 300 nm is deposited on the trapping film 71.

Next, as shown in FIG. 26(c), the first polysilicon film 72 is selectively etched by using, as a mask, a first resist pattern 73 extending along the bit line direction, so as to pattern the first polysilicon film 72.

Then, as shown in FIG. 26(d), ions of an n-type impurity are implanted into the semiconductor substrate 70 at, for example, $1 \times 10^{15}$ cm$^{-2}$ through $1 \times 10^{16}$ cm$^{-2}$ by using the first resist pattern 73 as a mask, so as to form an n-type high concentration impurity diffusion layer 74 working as a bit line.

Figure 27:
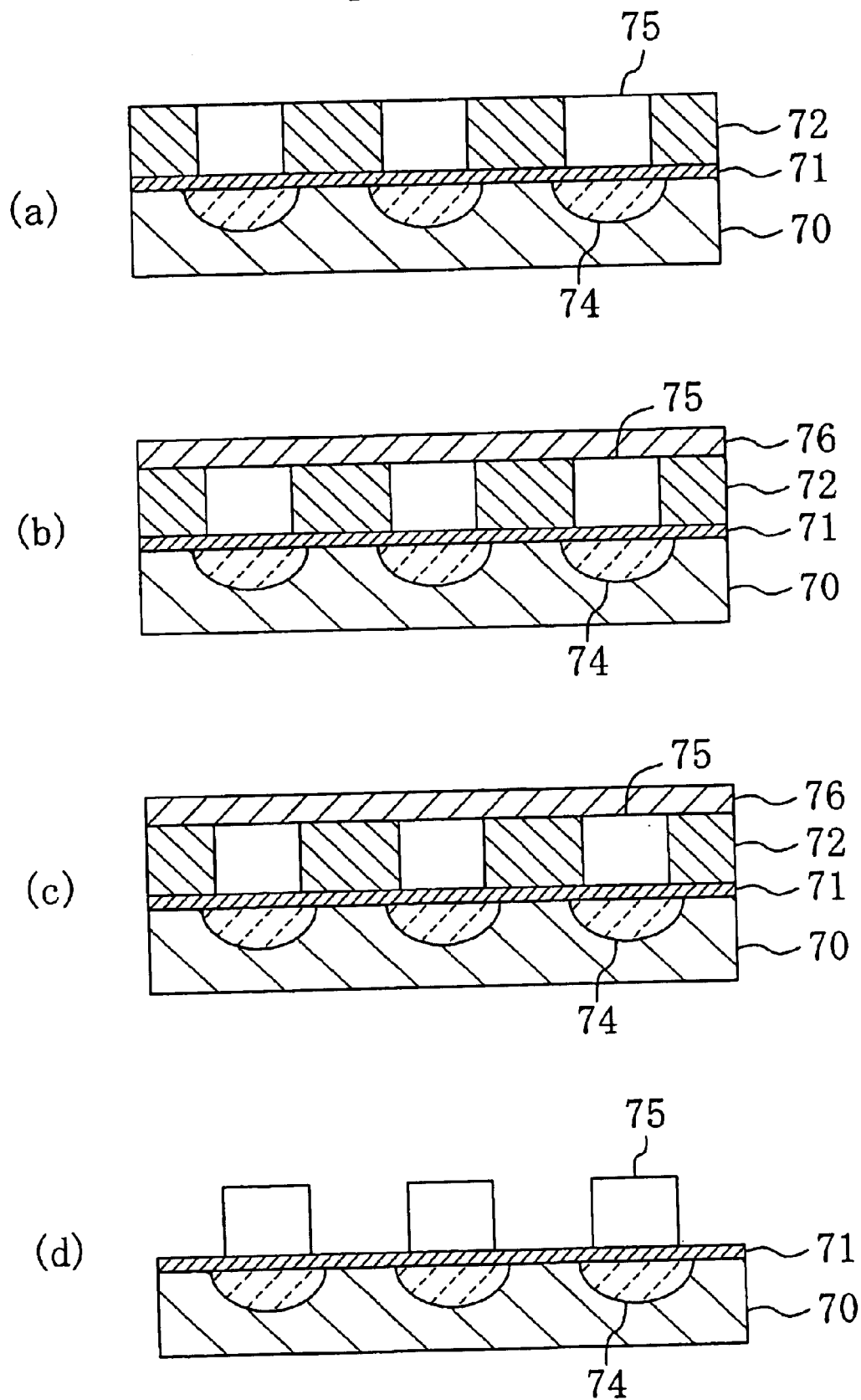
FIGS. 27(a) through 27(d) are cross-sectional views for showing other procedures in the method for fabricating a semiconductor memory according to Embodiment 7.

Next, as shown in FIG. 27(a), after depositing a silicon oxide film over the semiconductor substrate 70, the silicon oxide film is subjected to, for example, the CMP or etch back, so as to remove a portion of the silicon oxide film present on the pattern of the first polysilicon film 72. Thus, a first buried insulating film 75 is formed between the patterns of the first polysilicon film 72 and on the high concentration impurity diffusion layer 74. In this case, the top faces of the pattern of the first polysilicon film 72 and the first buried insulating film 75 are at substantially the same level.

Then, as shown in FIG. 27(b), a second polysilicon film 76 doped with, for example, $1 \times 10^{20}$ cm$^{-3}$ through $1 \times 10^{21}$ cm$^{-3}$ of phosphorus and having a thickness of 50 nm through 200 nm is deposited on the pattern of the first polysilicon film 72 and the first buried insulating film 75.

Next, as shown in FIGS. 27(c) and 27(d), the second polysilicon film 76 and the pattern of the first polysilicon film 72 are selectively etched by using, as a mask, a second resist pattern (omitted in the drawings) extending along the word line direction. It is noted that FIG. 27(c) shows the cross-sectional structure taken on line XXXA—XXXA of FIG. 29 and FIG. 27(d) shows the cross-sectional structure taken on line XXXB—XXXB of FIG. 29.

Figure 28:
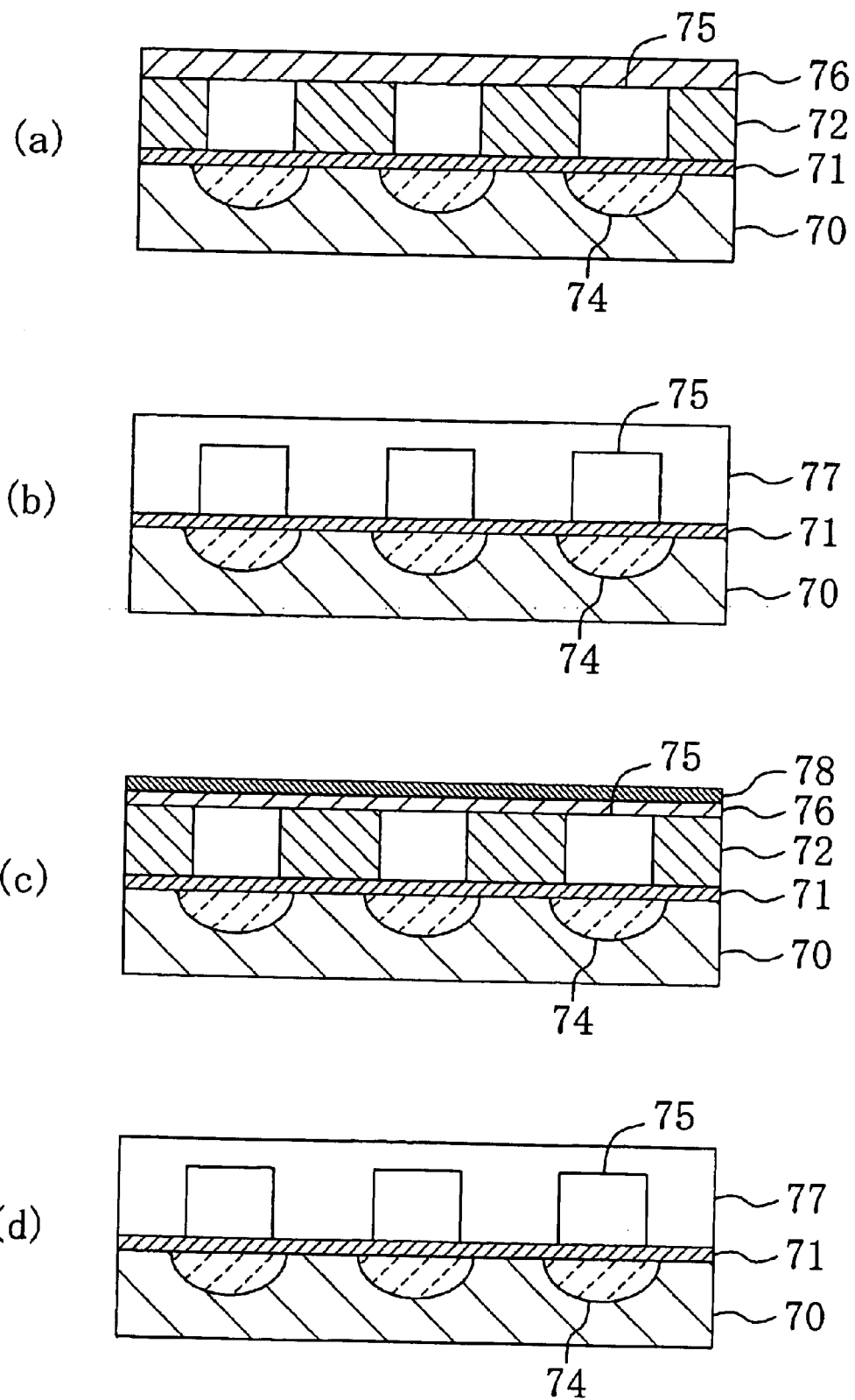
FIGS. 28(a) through 28(d) are cross-sectional view for showing other procedures in the method for fabricating a semiconductor memory according to Embodiment 7.

Then, as shown in FIGS. 28(a) and 28(b), after depositing a silicon oxide film over the semiconductor substrate 70, the silicon oxide film is subjected to, for example, the CMP or etch back, so as to form a second buried insulating film 77 by removing a portion of the silicon oxide film present on the pattern of the second polysilicon film 76. The second buried insulating film 77 completely covers the first buried insulating film 75, and the top face of the second buried insulating film 77 is at substantially the same level as the top face of the pattern of the second polysilicon film 76. It is noted that FIG. 28(a) shows the cross-sectional structure taken on line XXXA—XXXA of FIG. 29 and FIG. 28(b) shows the cross-sectional structure taken on line XXXB—XXXB of FIG. 29.

Next, as shown in FIGS. 28(c) and 28(d), after depositing a cobalt film over the semiconductor substrate 70, the annealing is performed, so as to form a silicide layer 78 in a surface portion of the pattern of the second polysilicon film 76. Thus, as shown in FIGS. 29 and 30(a) through 30(d), a gate electrode made of a pattern of the second polysilicon film 76 having the silicide layer 78 in the surface portion thereof and a pattern of the first polysilicon film 72 is formed.

Although the first resist pattern 73 is used as the mask for forming the high concentration impurity diffusion layer 74 in Embodiment 7, the pattern of the first polysilicon film 72 may be used instead with the first resist pattern 73 removed.

Also, although a polysilicon film doped with an impurity is deposited as each of the first polysilicon film 72 and the second polysilicon film 76 in Embodiment 7, instead, a polysilicon film not doped with an impurity can be first deposited so as to be doped with an impurity afterward.

Furthermore, each of the first polysilicon film 72 and the second polysilicon film 76 of Embodiment 7 may be replaced with an amorphous silicon film.

Furthermore, although the silicide layer 78 is formed by depositing the cobalt film, the cobalt film may be replaced with a titanium film, a nickel film or a platinum film.

Moreover, although an n-type memory device is formed in Embodiment 7, a p-type memory device may be formed instead.

(Embodiment 8)

A semiconductor memory and a method for fabricating the same according to Embodiment 8 of the invention will now be described with reference to FIGS. 31(*a*) through 31(*c*), 32(*a*) through 32(*c*), 33(*a*) through 33(*d*), 34 and 35(*a*) through 35(*d*). FIG. 35(*a*) shows the cross-sectional structure taken on line XXXVA—XXXVA of FIG. 34, FIG. 35(*b*) shows the cross-sectional structure taken on line XXXVB—XXXVB of FIG. 34, FIG. 35(*c*) shows the cross-sectional structure taken on line XXXVC—XXXVC of FIG. 34 and FIG. 35(*d*) shows the cross-sectional structure taken on line XXXVD—XXXVD of FIG. 34.

Figure 31:
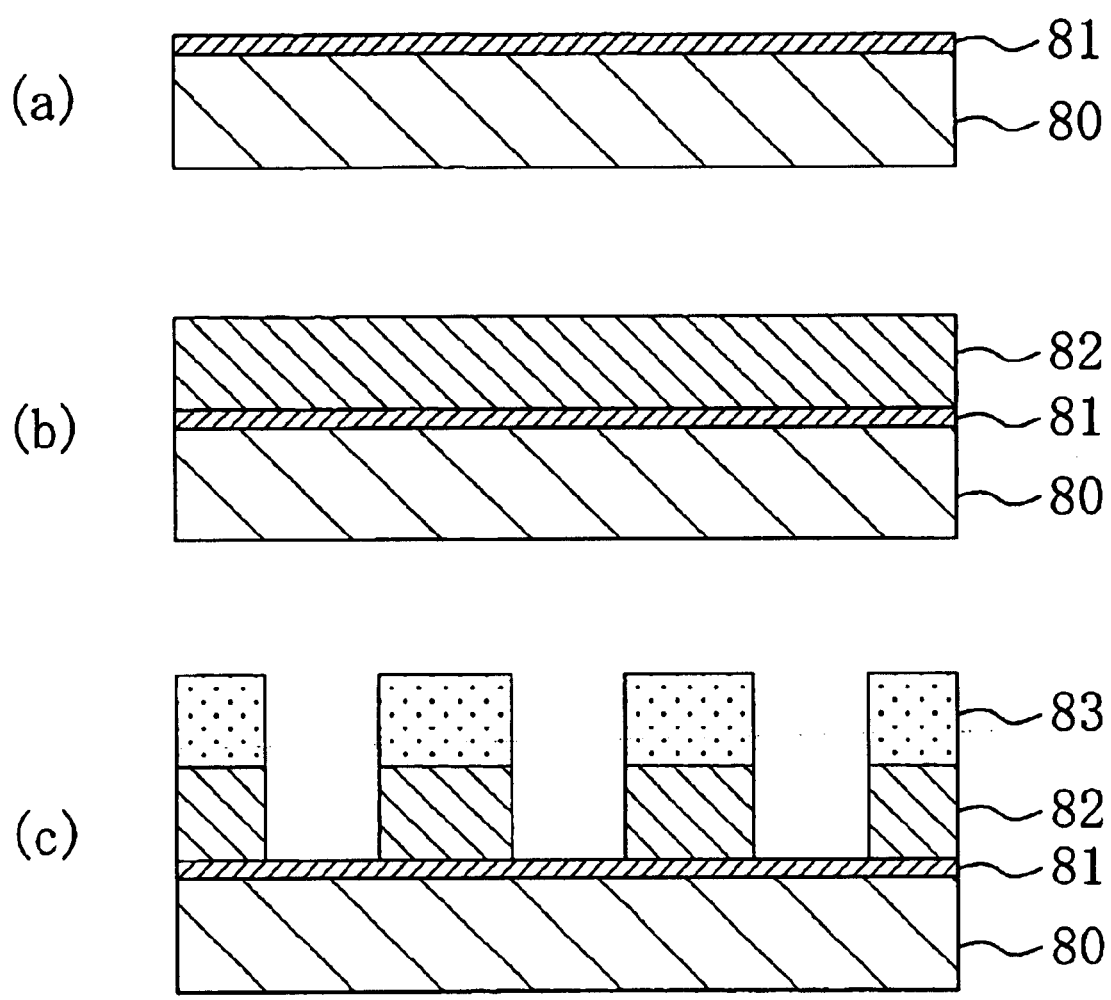
FIGS. 31(a) through 31(c) are cross-sectional views for showing procedures in a method for fabricating a semiconductor memory according to Embodiment 8.

First, as shown in FIG. 31(*a*), a trapping film 81 that is made of a multilayer film composed of, for example, a silicon oxide film, a silicon nitride film and a silicon oxide film and has a thickness of 30 nm in total is deposited in a memory device formation region on a semiconductor substrate 80 of a silicon substrate. Then, as shown in FIG. 31(*b*), a polysilicon film 82 that is doped with, for example, $1 \times 10^{20}$ cm$^{-3}$ through $1 \times 10^{21}$ cm$^{-3}$ of phosphorus and has a thickness of 150 nm through 300 nm is deposited on the trapping film 81.

Next, as shown in FIG. 31(*c*), the polysilicon film 82 is selectively etched by using, as a mask, a first resist pattern 83 extending along the bit line direction, so as to pattern the polysilicon film 82.

Figure 32:
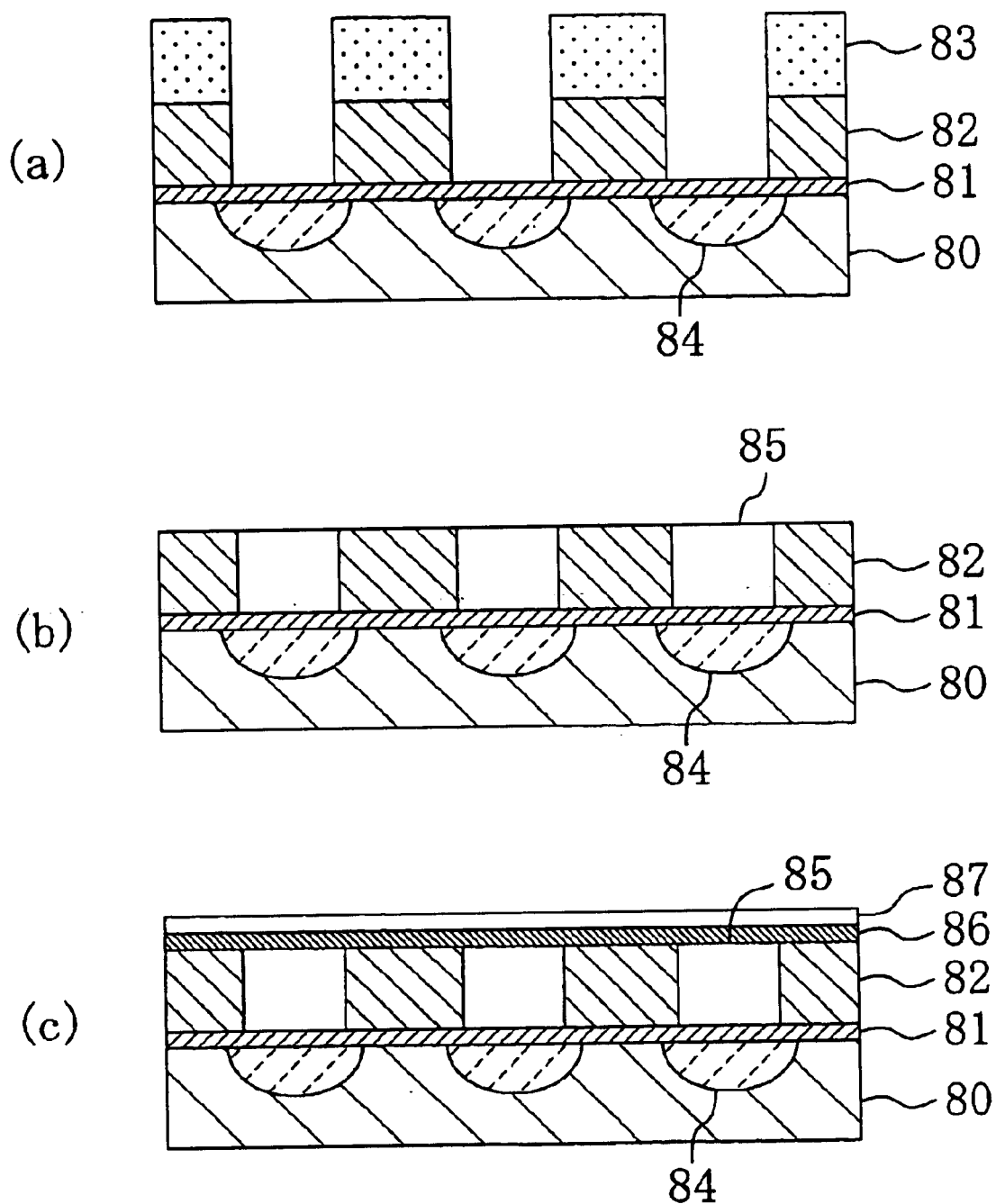
FIGS. 32(a) through 32(c) are cross-sectional views for showing other procedures in the method for fabricating a semiconductor memory according to Embodiment 8.

Then, as shown in FIG. 32(*a*), ions of an n-type impurity are implanted into the semiconductor substrate 80 at, for example, $1 \times 10^{15}$ cm$^{-2}$ through $1 \times 10^{16}$ cm$^{-2}$ by using the first resist pattern 83 as a mask, so as to form an n-type high concentration impurity diffusion layer 84 working as a bit line.

Next, as shown in FIG. 32(*b*), after depositing a silicon oxide film over the semiconductor substrate 80, the silicon oxide film is subjected to, for example, the CMP or etch back, so as to remove a portion of the silicon oxide film present on the pattern of the first polysilicon film 82. Thus, a buried insulating film 85 is formed between the patterns of the first polysilicon film 82 and on the high concentration impurity diffusion layer 84. In this case, the top faces of the pattern of the first polysilicon film 82 and the buried insulating film 85 are at substantially the same level.

Then, as shown in FIG. 32(*c*), a metal film 86 of, for example, a tungsten film with a thickness of 150 nm and a covering insulating film 87 of, for example, a silicon nitride film with a thickness of 100 nm are successively deposited over the semiconductor substrate 80.

Figure 33:
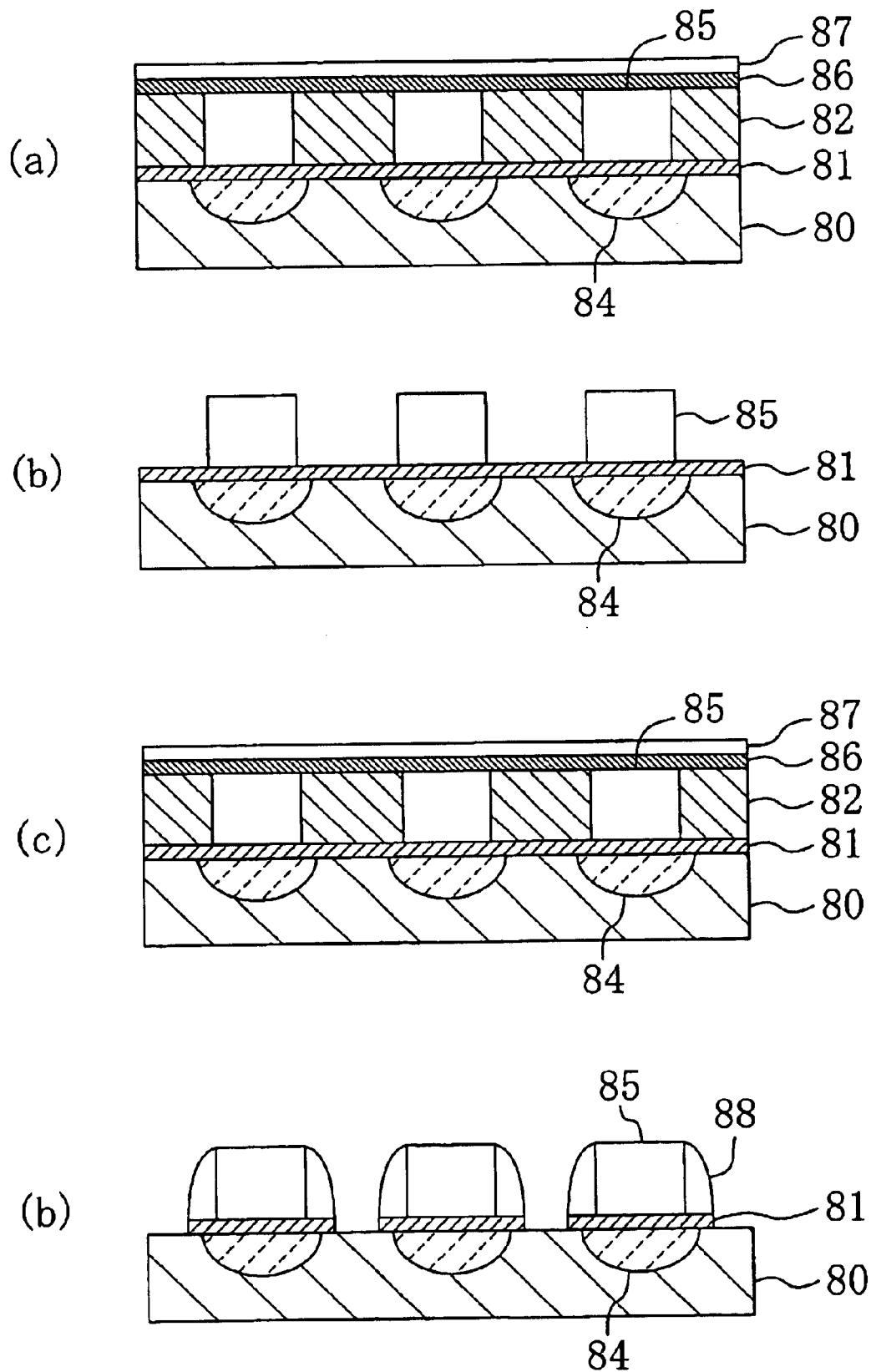
FIGS. 33(a) through 33(d) are cross-sectional views for showing other procedures in the method for fabricating a semiconductor memory according to Embodiment 8.

Next, as shown in FIGS. 33(*a*) and 33(*b*), the covering insulating film 87, the metal film 86 and the pattern of the polysilicon film 82 are selectively etched by using, as a mask, a second resist pattern (omitted in the drawings) extending along the word line direction. It is noted that FIG. 33(*a*) shows the cross-sectional structure taken on line XXXVA—XXXVA of FIG. 34 and FIG. 33(*b*) shows the cross-sectional structure taken on line XXXVB—XXXVB of FIG. 34.

Then, as shown in FIGS. 33(*c*) and 33(*d*), after depositing a silicon oxide film over the semiconductor substrate 80, the silicon oxide film is etched back, so as to form a sidewall insulating film 88 on the side faces of the buried insulating film 85 and the side faces of the patterns of the covering insulating film 87, the metal film 86 and the polysilicon film 82 (see FIGS. 35(*c*) and 35(*d*)). It is noted that FIG. 33(*c*) shows the cross-sectional structure taken on line XXXVA—XXXVA of FIG. 34 and FIG. 33(*d*) shows the cross-sectional structure taken on line XXXVB—XXXVB of FIG. 34.

Figure 34:
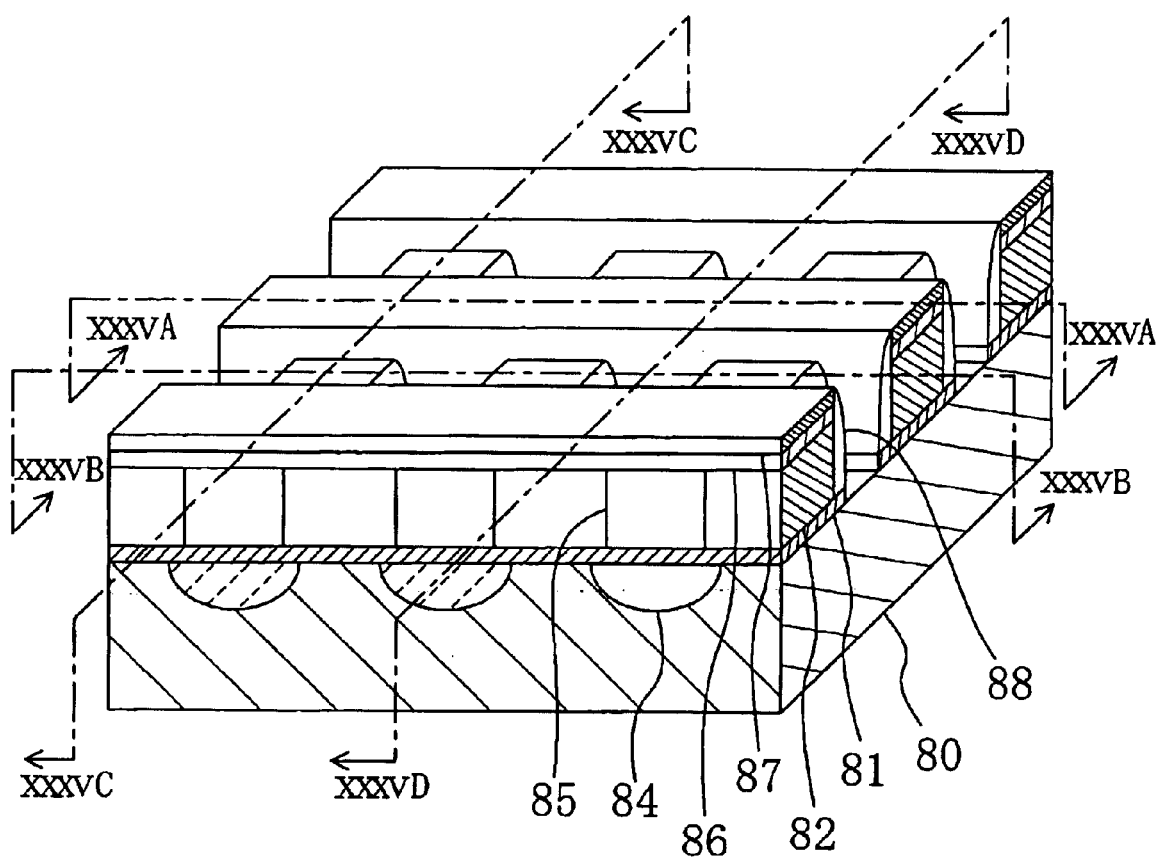
FIG. 34 is a perspective cross-sectional view of a semiconductor memory according to Embodiment 8.
Figure 35:
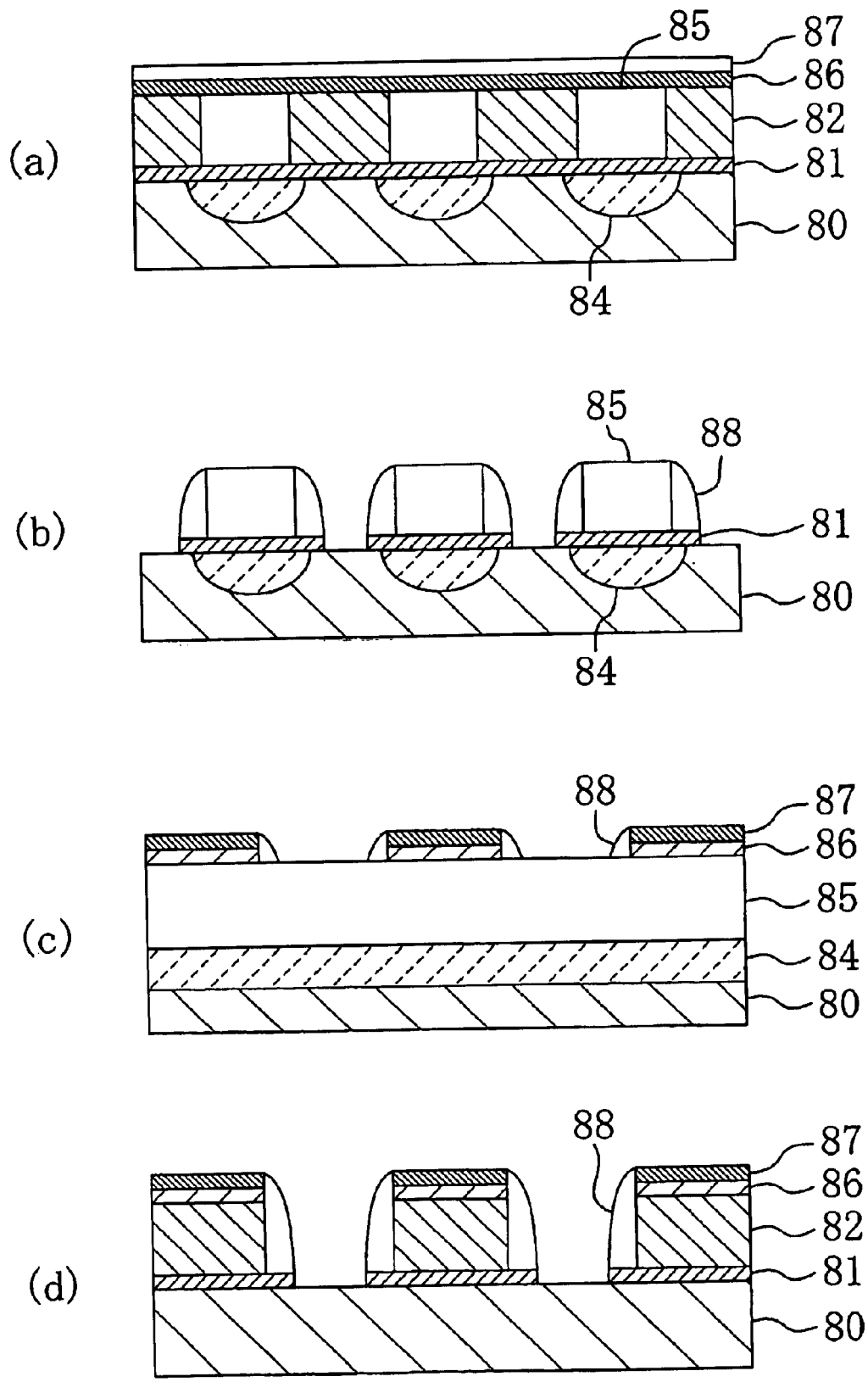
FIG. 35(a) is a cross-sectional view taken on line XXXVA—XXXVA of FIG. 34.
FIG. 35(b) is a cross-sectional view taken on line XXXVB—XXXVB of FIG. 34.
FIG. 35(c) is a cross-sectional view taken on line XXXVC—XXXVC of FIG. 34
FIG. 35(d) is a cross-sectional view taken on line XXXVD—XXXVD of FIG. 34.

In this manner, as shown in FIGS. 34 and 35(*a*) through 35(*d*), the side face of the pattern of the metal film 86 is covered with the sidewall insulating film 88 and the high concentration impurity diffusion layer 84 is covered with the buried insulating film 85 and the sidewall insulating film 88. Also, a gate electrode made of a pattern of the polysilicon film 82 and a pattern of the metal film 86 is formed.

According to Embodiment 8, since the covering insulating film 87 is formed on the metal film 86, the metal film 86 is minimally peeled off from the polysilicon film 82.

Although the first resist pattern 83 is used as the mask for forming the high concentration impurity diffusion layer 84 in Embodiment 8, the pattern of the polysilicon film 82 may be used instead with the first resist pattern 83 removed.

Also, although a polysilicon film doped with an impurity is deposited as the polysilicon film 82 in Embodiment 8, instead, a polysilicon film not doped with an impurity can be first deposited so as to be doped with an impurity afterward.

Furthermore, the polysilicon film 82 of Embodiment 8 may be replaced with an amorphous silicon film.

Also, although the metal film 88 of a tungsten film is deposited in Embodiment 8, the tungsten film may be replaced with a titanium film or a silicide film.

Moreover, although an n-type memory device is formed in Embodiment 8, a p-type memory device may be formed instead.

(Embodiment 9)

Figure 38:
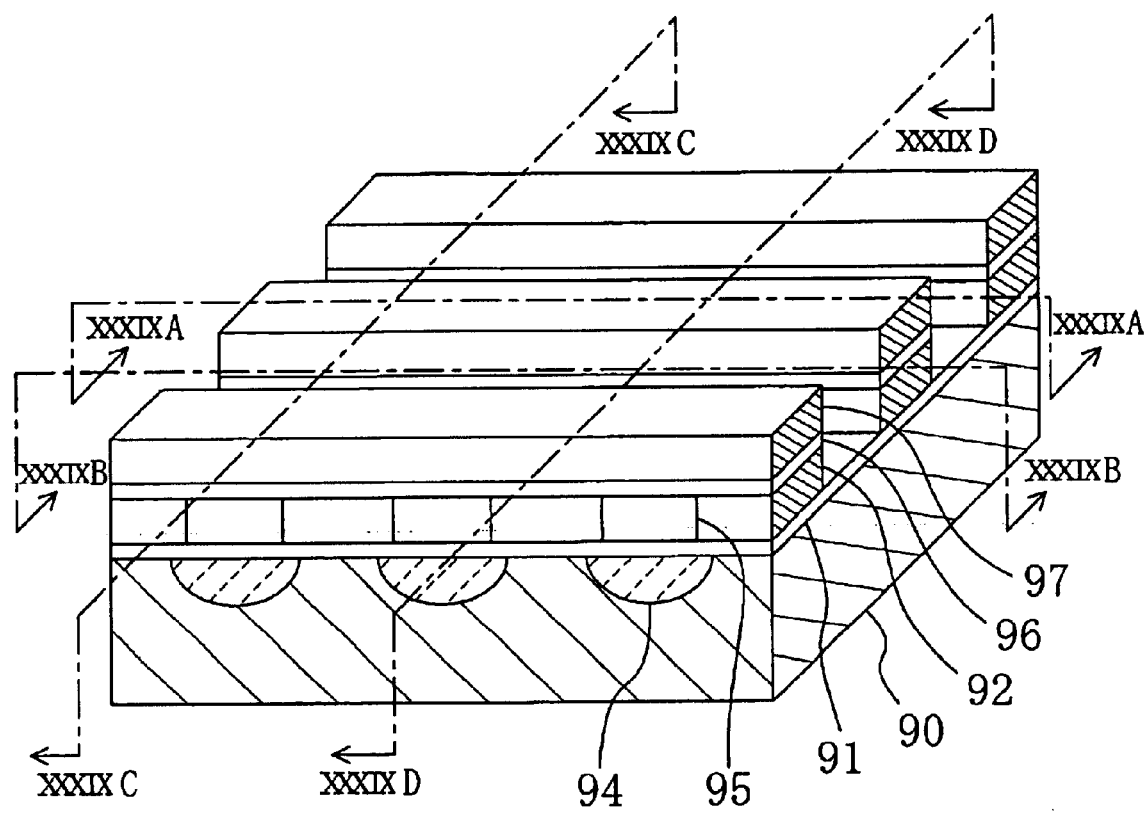
FIG. 38 is a perspective cross-sectional view of a semiconductor memory according to Embodiment 9.

A semiconductor memory and a method for fabricating the same according to Embodiment 9 of the invention will now be described with reference to FIGS. 36(*a*) through 36(*d*), 37(*a*) through 37(*c*), 38 and 39(*a*) through 39(*d*). FIG. 39(*a*) shows the cross-sectional structure taken on line XXXIXA—XXXIXA of FIG. 38, FIG. 39(*b*) shows the cross-sectional structure taken on line XXXIXB—XXXIXB of FIG. 38, FIG. 39(*c*) shows the cross-sectional structure taken on line XXXIXC—XXXIXC of FIG. 38 and FIG. 39(*d*) shows the cross-sectional structure taken on line XXXIXD—XXXIXD of FIG. 38.

Figure 36:
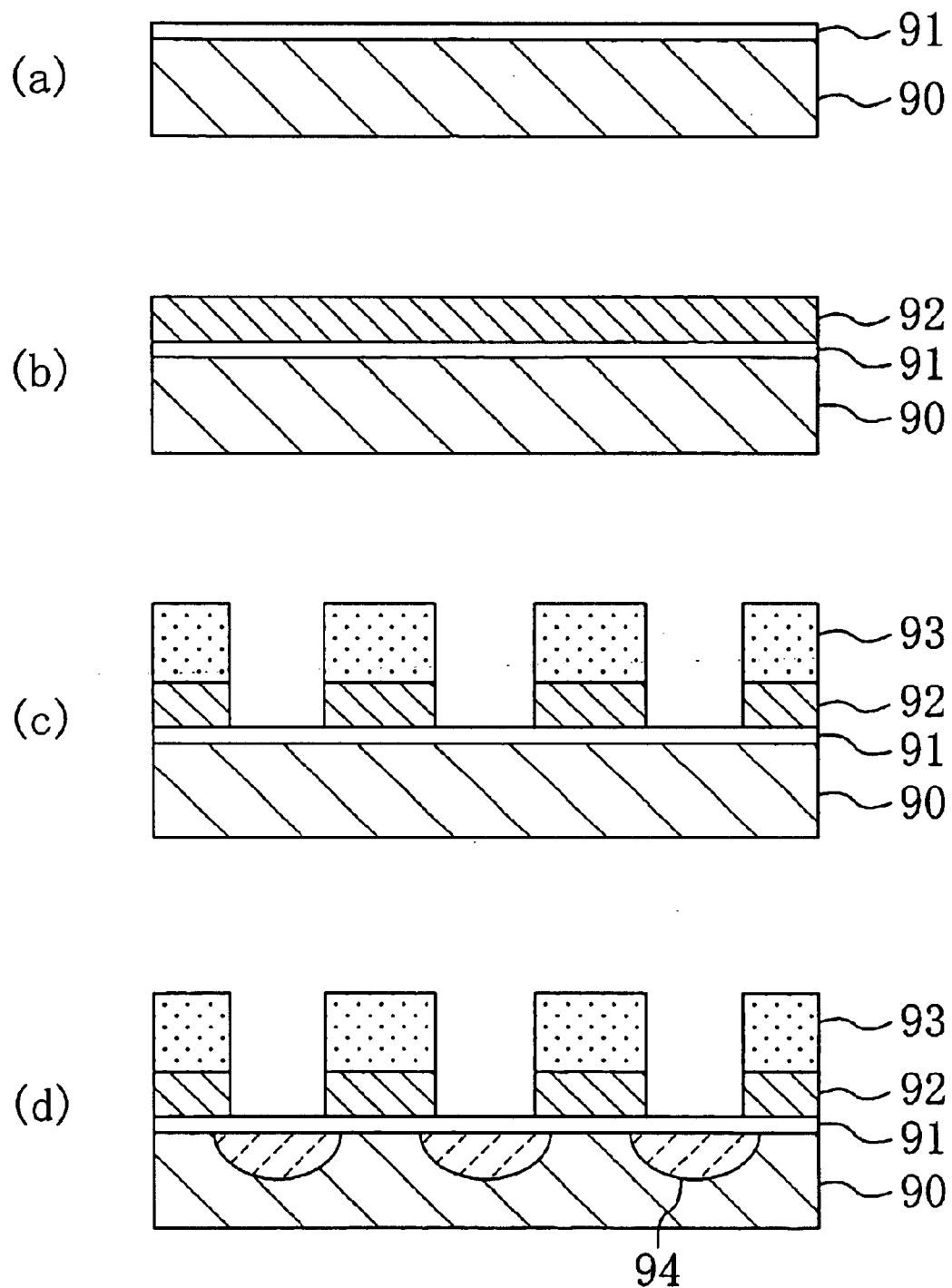
FIGS. 36(a) through 36(d) are cross-sectional views for showing procedures in a method for fabricating a semiconductor memory according to Embodiment 9.

First, as shown in FIG. 36(*a*), a tunnel insulating film 91 of, for example, a silicon oxide film with a thickness of 6 nm through 15 nm is formed in a memory device formation region on a semiconductor substrate 90 of a silicon substrate. Then, as shown in FIG. 36(*b*); a first polysilicon film 92 that is doped with, for example, $1 \times 10^{20}$ cm$^{-3}$ through $1 \times 10^{21}$ cm$^{-3}$ of phosphorus and has a thickness of 150 nm through 300 nm is deposited on the tunnel insulating film 91.

Next, as shown in FIG. 36(*c*), the first polysilicon film 92 is selectively etched by using, as a mask, a first resist pattern 93 extending along the bit line direction, so as to pattern the first polysilicon film 92.

Then, as shown in FIG. 36(*d*), ions of an n-type impurity are implanted into the semiconductor substrate 90 at, for example, $1 \times 10^{15}$ cm$^{-2}$ through $1 \times 10^{16}$ cm$^{-2}$ by using the first resist pattern 93 as a mask, so as to form an n-type high concentration impurity diffusion layer 94 working as a bit line.

Figure 37:
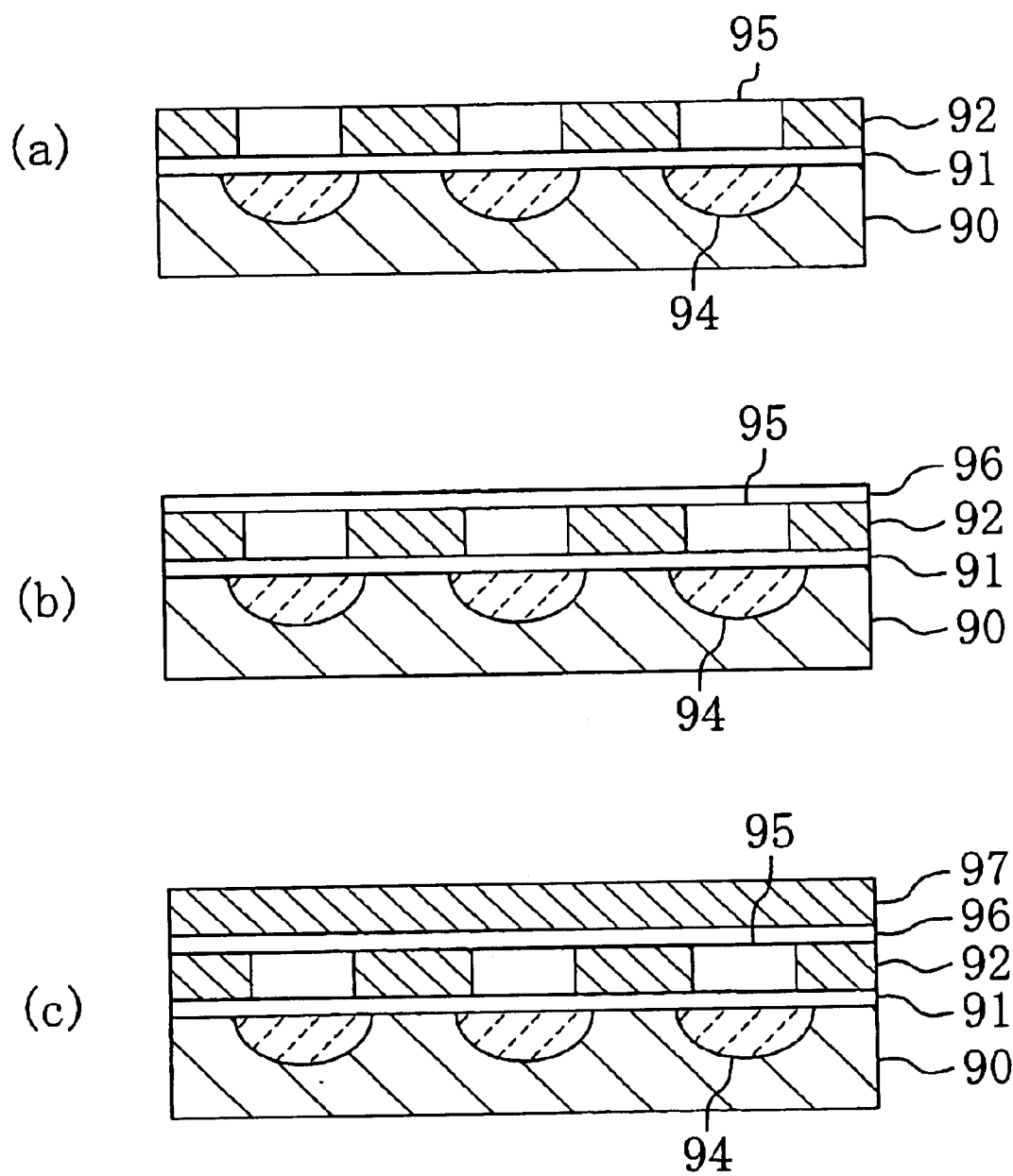
FIGS. 37(a) through 37(c) are cross-sectional views for showing other procedures in the method for fabricating a semiconductor memory according to Embodiment 9.

Next, as shown in FIG. 37(*a*), after depositing a silicon oxide film over the semiconductor substrate 90, the silicon oxide film is subjected to, for example, the CMP or etch back, so as to remove a portion of the silicon oxide film present on the pattern of the first polysilicon film 92. Thus, a buried insulating film 95 is formed between the patterns of the first polysilicon film 92 and on the high concentration impurity diffusion layer 94. In this case, the top faces of the pattern of the first polysilicon film 92 and the buried insulating film 95 are at substantially the same level.

Then, as shown in FIG. 37(b), after depositing an inter-electrode insulating film 96 made of a multilayer film composed of, for example, a silicon oxide film, a silicon nitride film and a silicon oxide film on the pattern of the first polysilicon film 92 and the buried insulating film 95, a second polysilicon film 97 doped with, for example, $1\times10^{20}$ cm$^{-3}$ through $1\times10^{21}$ cm$^{-3}$ of phosphorus and having a thickness of 50 nm through 200 nm is deposited on the inter-electrode insulating film 96.

Next, the second polysilicon film 97, the inter-electrode insulating film 96 and the pattern of the first polysilicon film 92 are selectively etched by using a second resist pattern (omitted in the drawings) extending along the word line direction as a mask. Thus, as shown in FIGS. 38 and 39(a) through 39(d), a memory device composed of a gate electrode made of a pattern of the second polysilicon film 97, a pattern of the inter-electrode insulating film 96 and a floating electrode made of a pattern of the first polysilicon film 92 is formed.

According to Embodiment 9, the buried insulating film 95 extending along the bit line direction is provided above the high concentration impurity diffusion layer 94 working as a bit line, and the patterns of the first polysilicon film 92 included in the respective floating electrodes are isolated from one another by the buried insulating film 95. Therefore, there is no need to provide a LOCOS isolation region between memory devices each composed of a floating electrode, an inter-electrode insulating film and a gate electrode. Although the patterns of the first polysilicon film 92 are isolated from one another by the buried insulating film 95, the patterns of the first polysilicon film 92 are electrically connected to one another through the second polysilicon film 97, and hence, there is no particular problem.

Accordingly, refinement of a semiconductor memory can be realized by Embodiment 9.

Although a silicon oxide film is used as the tunnel insulating film 91 in Embodiment 9, a nitrided silicon oxide film may be used instead.

Although the first resist pattern 93 is used as the mask for forming the high concentration impurity diffusion layer 94 in Embodiment 9, the pattern of the first polysilicon film 92 may be used instead with the first resist pattern 93 removed.

Also, although a polysilicon film doped with an impurity is deposited as each of the first polysilicon film 92 and the second polysilicon film 97 in Embodiment 9, instead, a polysilicon film not doped with an impurity can be first deposited so as to be doped with an impurity afterward.

Furthermore, each of the first polysilicon film 92 and the second polysilicon film 97 of Embodiment 9 may be replaced with an amorphous silicon film.

Moreover, although an n-type memory device is formed in Embodiment 9, a p-type memory device may be formed instead.

Embodiment 9 is different from Embodiment 1 in the structure of the gate electrode alone and is the same as Embodiment 1 in the structure of the impurity diffusion layer working as a bit line and the structure of the buried insulating film. Therefore, the same effect as that attained by Embodiment 1 can be attained by Embodiment 9.

Although not described in detail, the gate electrode of each of Embodiments 2 through 8 can be formed in a similar structure to that described in Embodiment 9. Thus, the same effect as that attained by each of Embodiments 2 through 8 can be attained.

(Embodiment 10)

A semiconductor memory and a method for fabricating the same according to Embodiment 10 of the invention will now be described with reference to FIGS. 40(a) through 40(d), 41(a) through 41(c), 42(a) through 42(c) and 43(a) through 43(c). In each of these drawings, a left hand side part shows a gate electrode portion of a memory device formation region, a center part shows a portion between gate electrodes of the memory device formation region and a right hand side part shows a logic circuit region.

Figure 40:
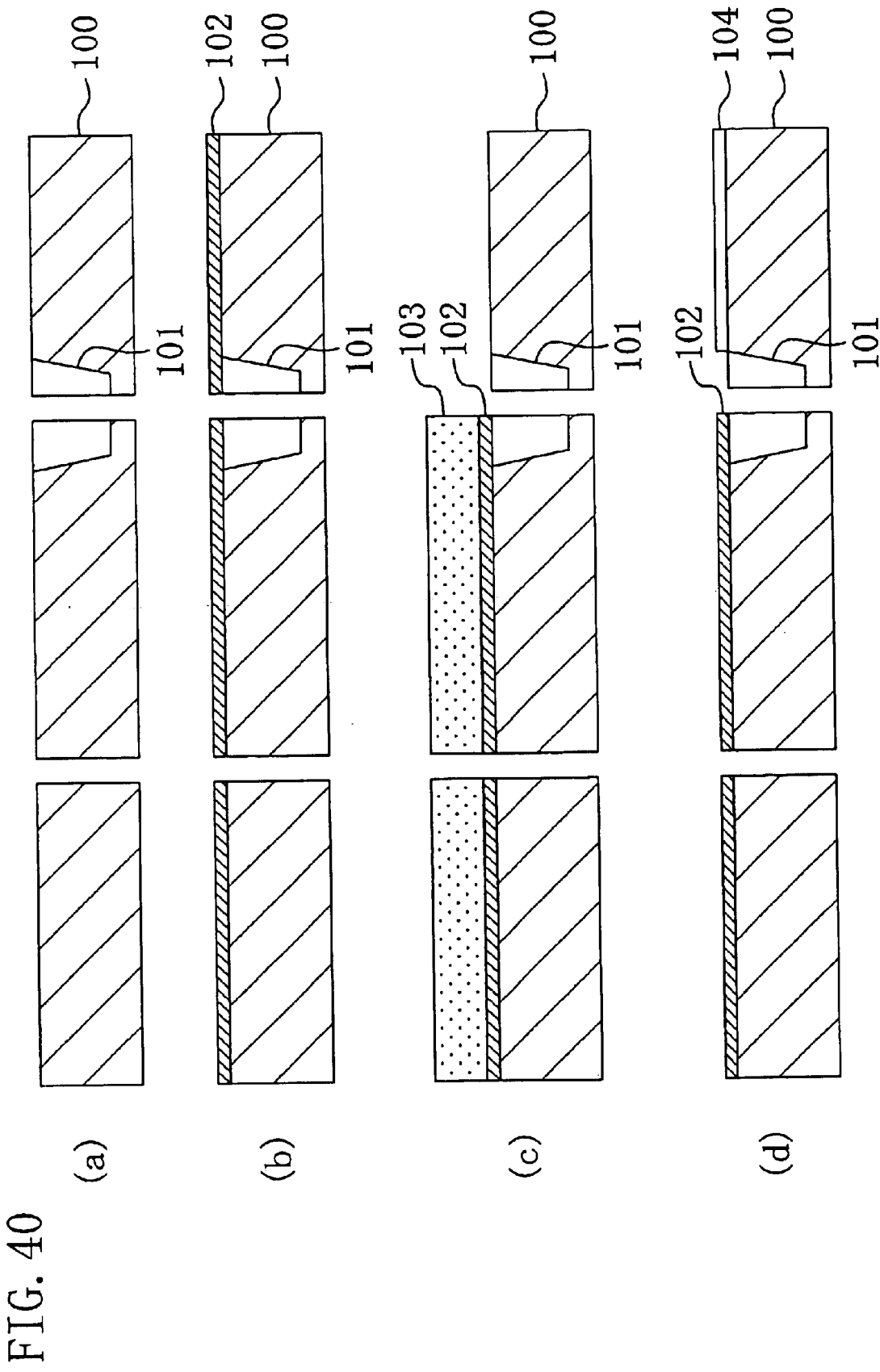
FIGS. 40(a) through 40(d) are cross-sectional views for showing procedures in a method for fabricating a semiconductor memory according to Embodiment 10.

First, as shown in FIG. 40(a), a trench isolation region 101 is formed in a semiconductor substrate 100 of a silicon substrate. Thereafter, as shown in FIG. 40(b), a trapping film 102 made of a multilayer film composed of, for example, a silicon oxide film, a silicon nitride film and a silicon oxide film and having a thickness of 30 nm in total is deposited over the semiconductor substrate 100.

Next, as shown in FIG. 40(c), the trapping film 102 is selectively etched by using a first resist pattern 103 as a mask, so as to remove a portion of the trapping film 102 present in the logic circuit region. Thereafter, as shown in FIG. 40(d), a surface portion of the semiconductor substrate 100 is oxidized so as to form a gate insulating film 104 with a thickness of, for example, 2 nm through 25 nm in the surface portion of the semiconductor substrate 100 in the logic circuit region.

Figure 41:
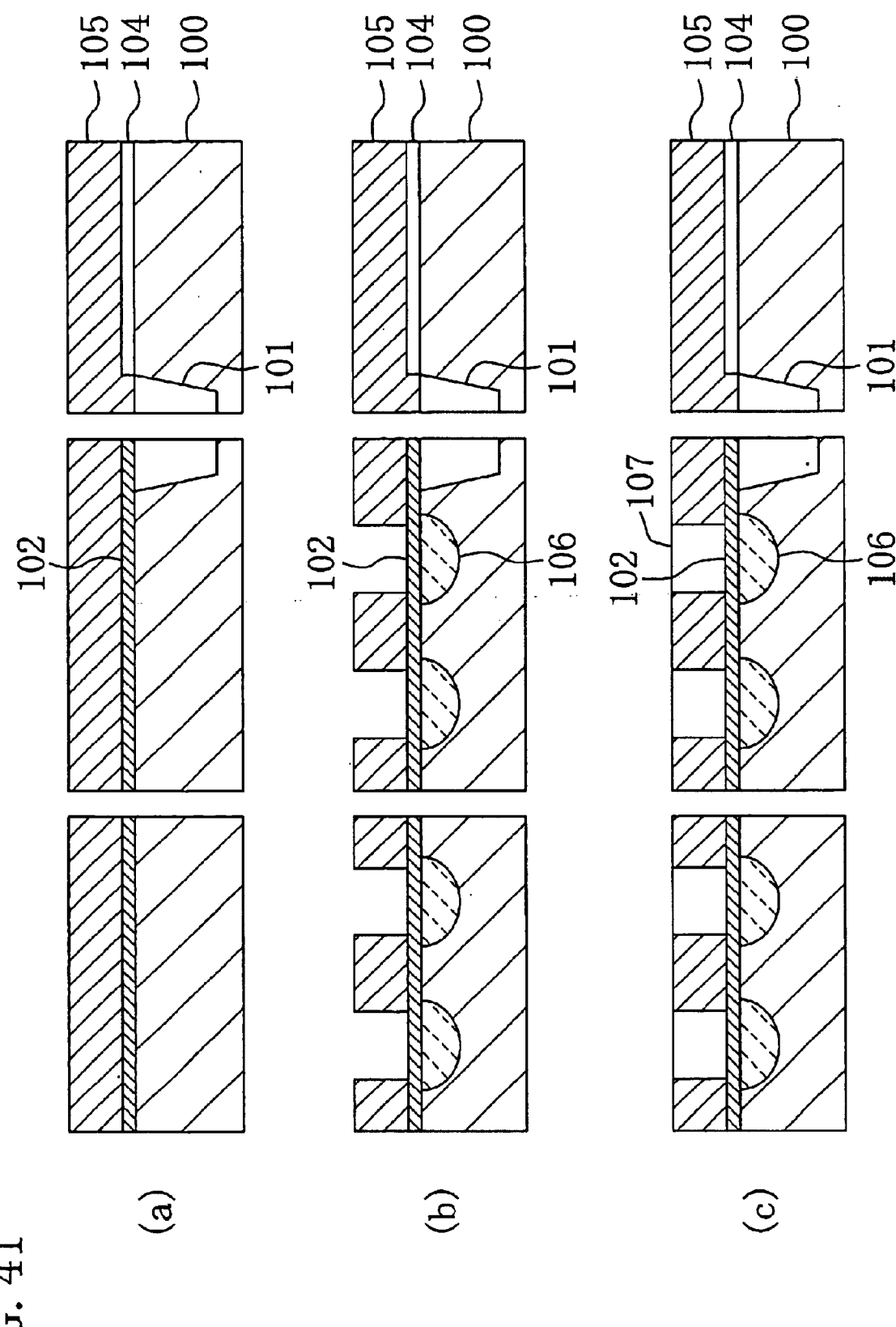
FIGS. 41(a) through 41(c) are cross-sectional views for showing other procedures in the method for fabricating a semiconductor memory according to Embodiment 10

Then, as shown in FIG. 41(a), a first polysilicon film 105 doped with, for example $1\times10^{20}$ cm$^{-3}$ through $1\times10^{21}$ cm$^{-3}$ of phosphorus and having a thickness of 150 nm through 300 nm is deposited over the semiconductor substrate 100.

Next, as shown in FIG. 41(b), the first polysilicon film 105 is selectively etched by using a second resist pattern (omitted in the drawings) as a mask, so as to pattern the first polysilicon film 105. Thereafter, ions of an n-type impurity are implanted into the semiconductor substrate 100 at, for example, $1\times10^{15}$ cm$^{-2}$ through $1\times10^{16}$ cm$^{-2}$ by using the pattern of the first polysilicon film 105 as a mask, so as to form, in the memory device formation region, an n-type high concentration impurity diffusion layer 106 working as a bit line.

Then, as shown in FIG. 41(c), after depositing a silicon oxide film over the semiconductor substrate 100, the silicon oxide film is subjected to, for example, the CMP or etch back, so as to remove a portion of the silicon oxide film present on the pattern of the first polysilicon film 105. Thus, a buried insulating film 107 is formed between the patterns of the first polysilicon film 105 and on the high concentration impurity diffusion layer 106. In this case, the top faces of the pattern of the first polysilicon film 105 and the buried insulating film 107 are at substantially the same level.

Figure 42:
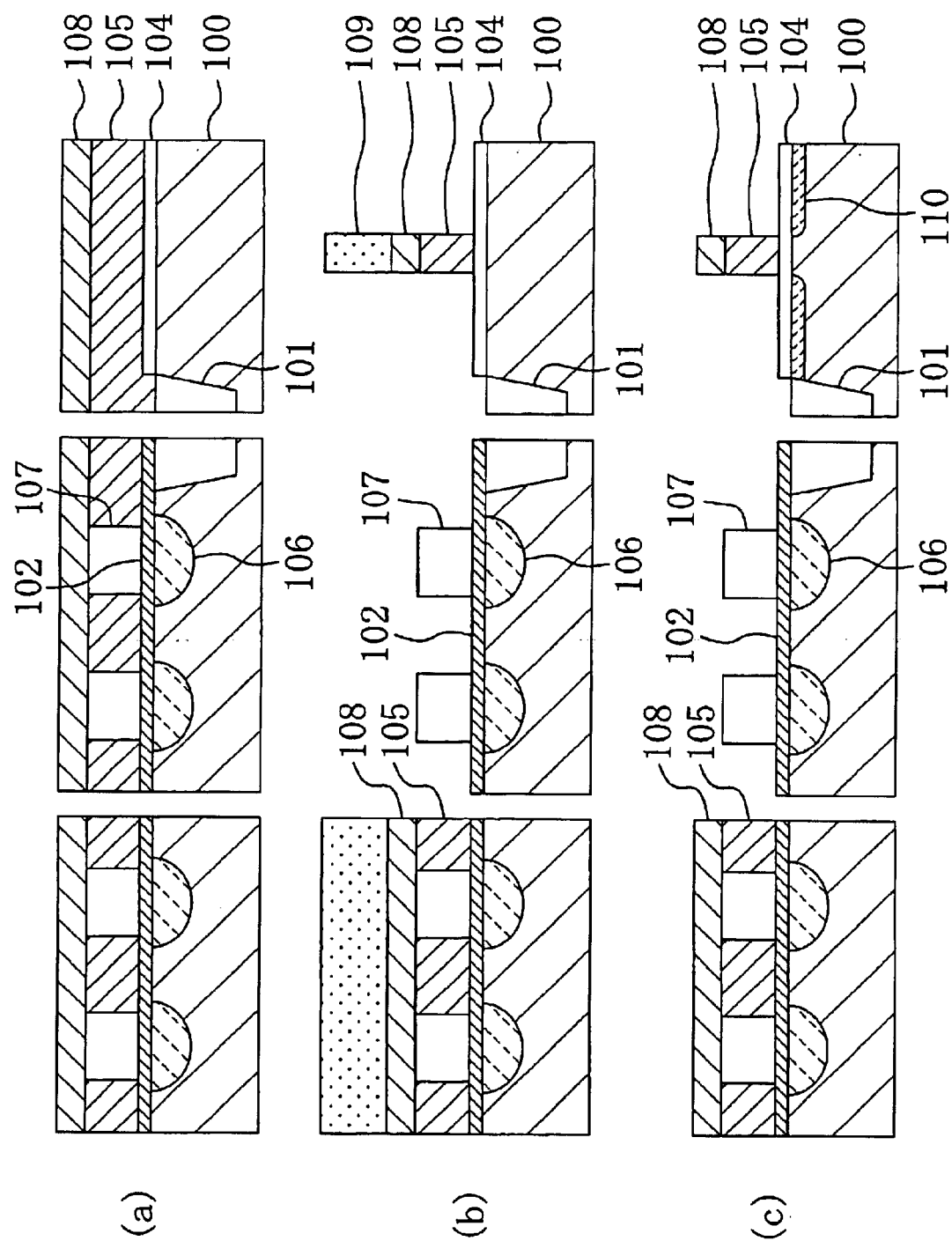
FIGS. 42(a) through 42(c) are cross-sectional views for showing other procedures in the method for fabricating a semiconductor memory according to Embodiment 10.

Next, as shown in FIG. 42(a), a second polysilicon film 108 doped with, for example, $1\times10^{20}$ cm$^{-3}$ through $1\times10^{21}$ cm$^{-3}$ of phosphorus and having a thickness of 50 nm through 200 nm is deposited on the pattern of the first polysilicon film 105 and the buried insulating film 107.

Then, as shown in FIG. 42(b), the second polysilicon film 108 and the pattern of the first polysilicon film 105 are selectively etched by using a third resist pattern 109 as a mask. Thus, a first gate electrode made of a pattern of the second polysilicon film 108 and a pattern of the first polysilicon film 105 is formed in the memory device formation region, and a second gate electrode made of a pattern of the second polysilicon film 108 and a pattern of the first polysilicon film 105 is formed in the logic circuit region.

Next, as shown in FIG. 42(c), impurity ions are implanted into the semiconductor substrate 100 by using the second gate electrode as a mask in the logic circuit region, so as to form a low concentration impurity diffusion layer 110.

Figure 43:
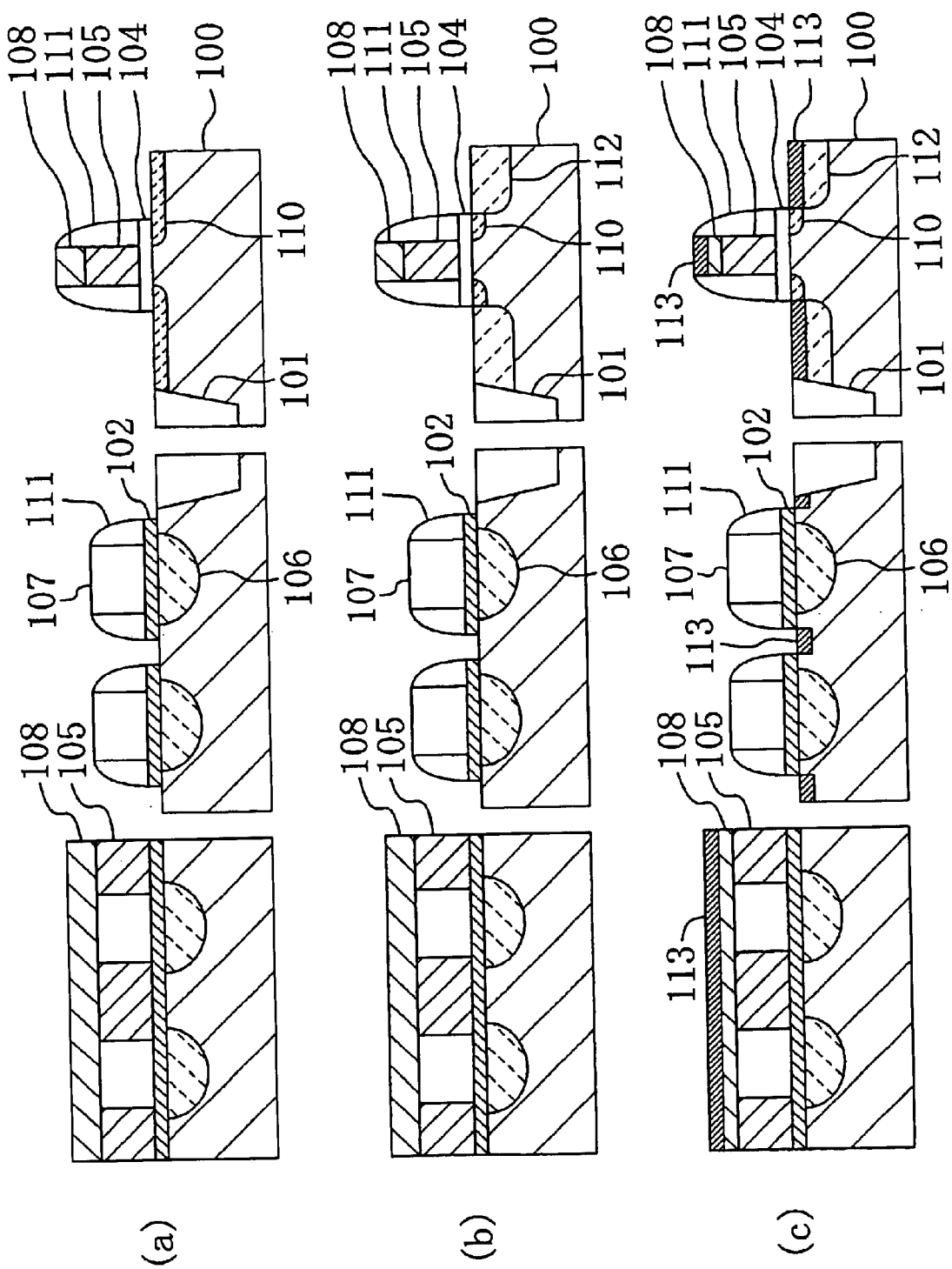
FIGS. 43(a) through 43(c) are cross-sectional views for showing other procedures in the method for fabricating a semiconductor memory according to Embodiment 10.

Then, as shown in FIG. 43(*a*), after depositing a silicon oxide film with a thickness of, for example, 50 nm through 200 nm over the semiconductor substrate 100, the silicon oxide film is etched back. Thus, a sidewall insulating film 111 is formed on the side face of the buried insulating film 107 in the memory device region, and the sidewall insulating film 111 is formed on the side face of the second gate electrode in the logic circuit region. Thereafter, the gate insulating film 104 is selectively etched by using the second gate electrode and the sidewall insulating film 111 as a mask in the logic circuit region, so as to pattern the gate insulating film 104. In this case, the trapping film 102 is patterned in the memory device region.

Next, as shown in FIG. 43(*b*), impurity ions are selectively implanted into the semiconductor substrate 100 by using the second gate electrode and the sidewall insulating film 111 as a mask in the logic circuit region, so as to form high concentration impurity diffusion layers 112 working as source and drain regions.

Then, as shown in FIG. 43(*c*), after depositing a cobalt film over the semiconductor substrate 100, the annealing is performed, so as to form a silicide layer 113 in a surface portion of the first gate electrode in the memory device region and form the silicide layer 113 in a surface portion of the second gate electrode in the logic circuit region. Thus, a semiconductor device according to Embodiment 10 is obtained.

According to Embodiment 10, the first electrode included in a memory device and the second gate electrode of a transistor included in a logic circuit are formed in the same procedure, and therefore, the number of procedures can be reduced.

Also, since the silicide layer 113 formed in the surface portion of the first gate electrode and the silicide layer 113 formed in the surface portion of the second gate electrode can be formed in the same procedure, the number of procedures can be reduced.

Furthermore, since the sidewall insulating film 111 formed on the side face of the buried insulating film 107 in the memory device region and the sidewall insulating film 111 formed on the side face of the second gate electrode of the transistor included in the logic circuit can be formed in the same procedure, the number of procedures can be reduced.

Although a polysilicon film doped with an impurity is deposited as each of the first polysilicon film 105 and the second polysilicon film 108 in Embodiment 10, instead, a polysilicon film not doped with an impurity can be first deposited to be doped with an impurity afterward.

Furthermore, each of the first polysilicon film 105 and the second polysilicon film 108 of Embodiment 10 may be replaced with an amorphous silicon film.

Moreover, although an n-type memory device is formed in Embodiment 10, a p-type memory device may be formed instead.

(Embodiment 11)

A semiconductor memory and a method for fabricating the same according to Embodiment 11 of the invention will now be described with reference to FIGS. 44(*a*) through 44(*d*), 45(*a*) through 45(*c*), 46(*a*) through 46(*c*), 47(*a*) through 47(*c*), 48(*a*) and 48(*b*). In each of these drawings, a left hand side part shows a gate electrode portion of a memory device formation region, a center part shows a portion between gate electrodes of the memory device formation region and a right hand side part shows a logic circuit region.

Figure 44:
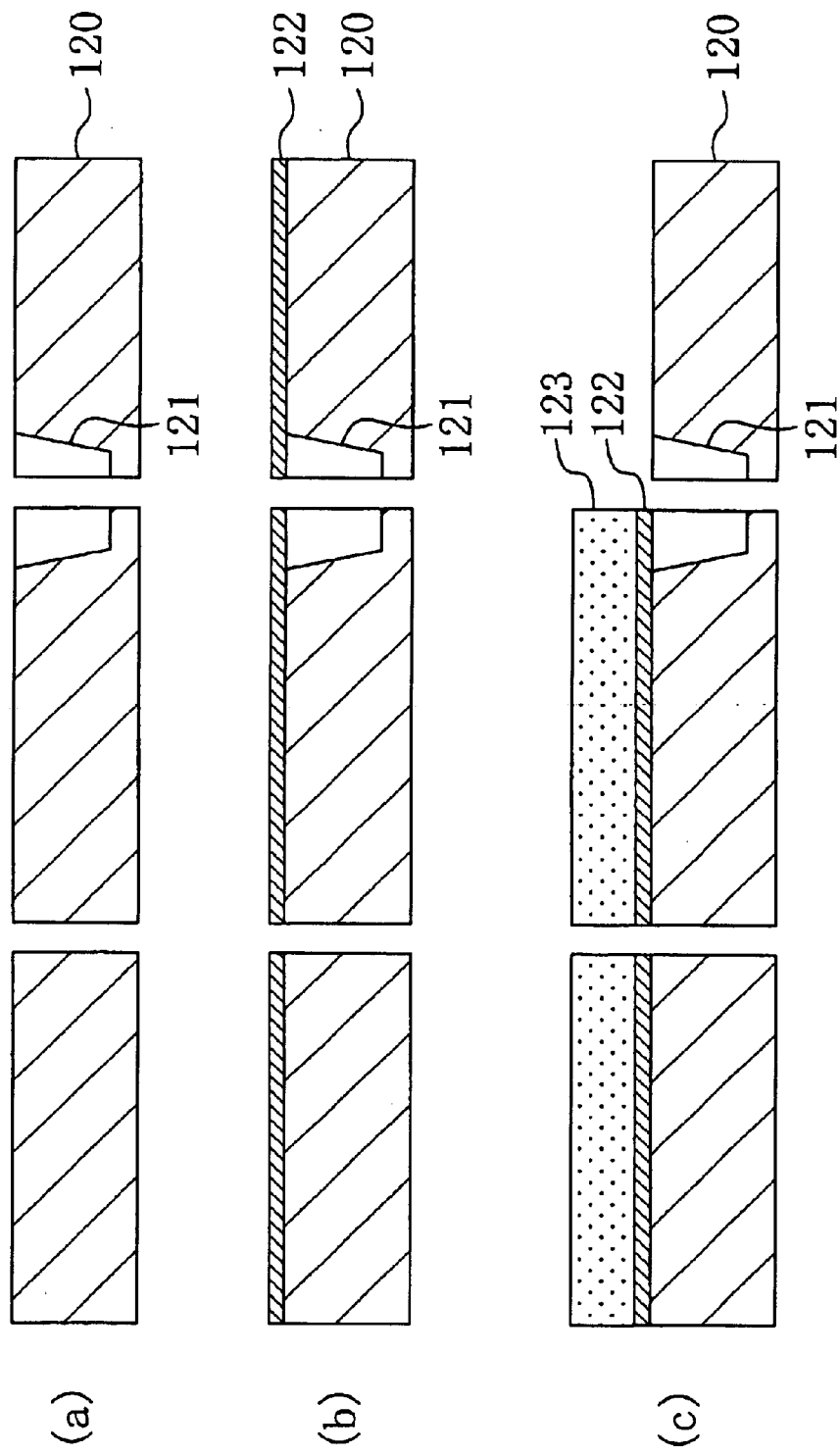
FIGS. 44(a) through 44(c) are cross-sectional views for showing procedures in a method for fabricating a semiconductor memory according to Embodiment 11.

First, as shown in FIG. 44(*a*), a trench isolation region 121 is formed in a semiconductor substrate 120 of a silicon substrate. Thereafter, as shown in FIG. 44(*b*), a trapping film 122 made of a multilayer film composed of, for example, a silicon oxide film, a silicon nitride film and a silicon oxide film and having a thickness of 30 nm in total is deposited over the semiconductor substrate 120.

Next, as shown in FIG. 44(*c*), the trapping film 122 is selectively etched by using a first resist pattern 123 as a mask, so as to remove a portion of the trapping film 122 present in the logic circuit region. Thereafter, as shown in FIG. 45(*a*), a surface portion of the semiconductor substrate 120 is oxidized so as to form a gate insulating film 124 with a thickness of, for example, 2 nm through 25 nm in the surface portion of the semiconductor substrate 120 in the logic circuit region.

Figure 45:
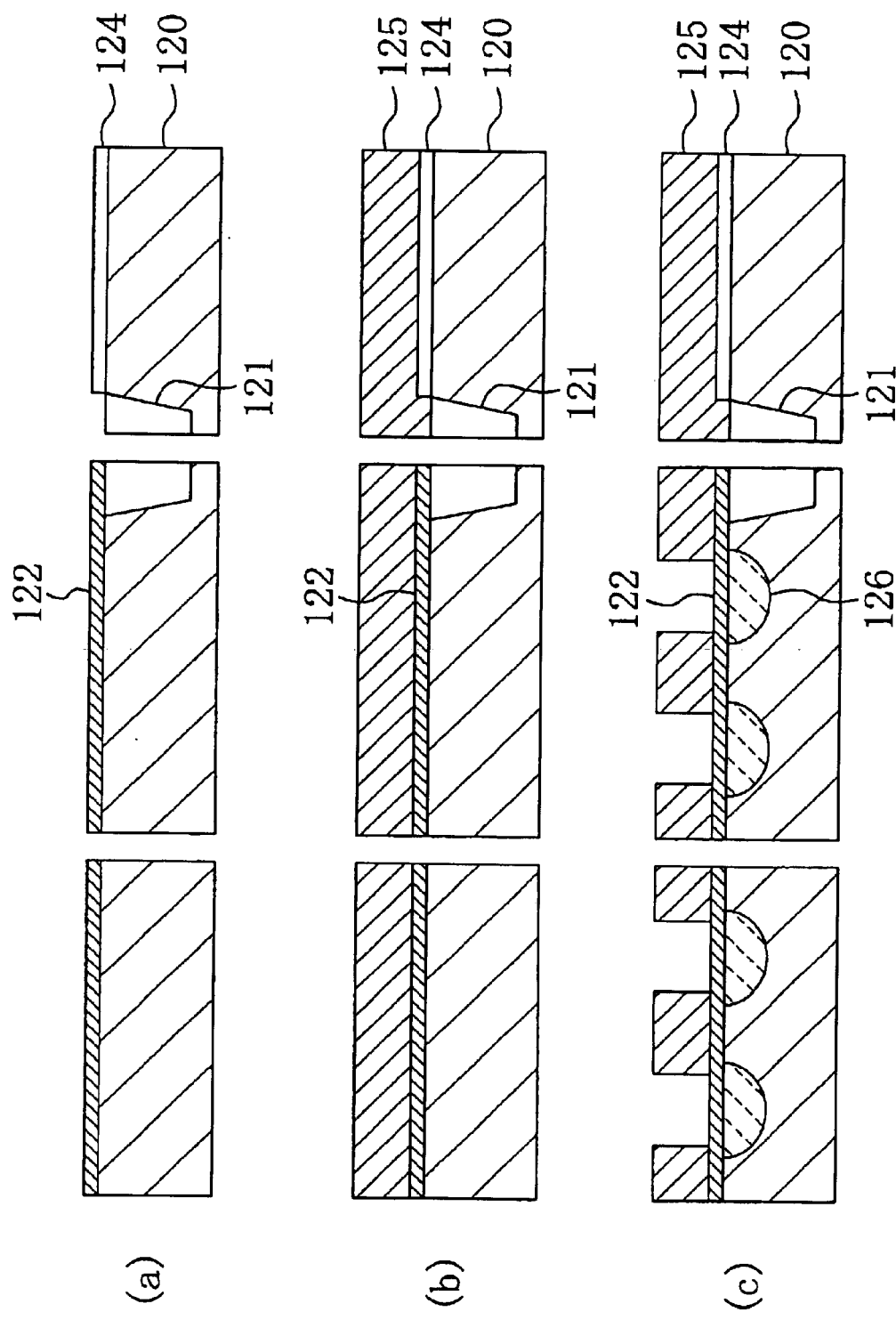
FIGS. 45(a) through 45(c) are cross-sectional views for showing other procedures in the method for fabricating a semiconductor memory according to Embodiment 11.

Then, as shown in FIG. 45(*b*), a polysilicon film 125 doped with, for example, $1 \times 10^{20}$ cm$^{-3}$ through $1 \times 10^{21}$ cm$^{-3}$ of phosphorus and having a thickness of 150 nm through 300 nm is deposited over the semiconductor substrate 120.

Next, as shown in FIG. 45(*c*), the polysilicon film 125 is selectively etched by using a second resist pattern (omitted in the drawings) as a mask, so as to pattern the polysilicon film 125. Thereafter, ions of an n-type impurity are implanted into the semiconductor substrate 120 at, for example, $1 \times 10^{15}$ cm$^{-2}$ through $1 \times 10^{16}$ cm$^{-2}$ by using the pattern of the polysilicon film 125 as a mask, so as to form, in the memory device formation region, an n-type high concentration impurity diffusion layer 126 working as a bit line.

Figure 46:
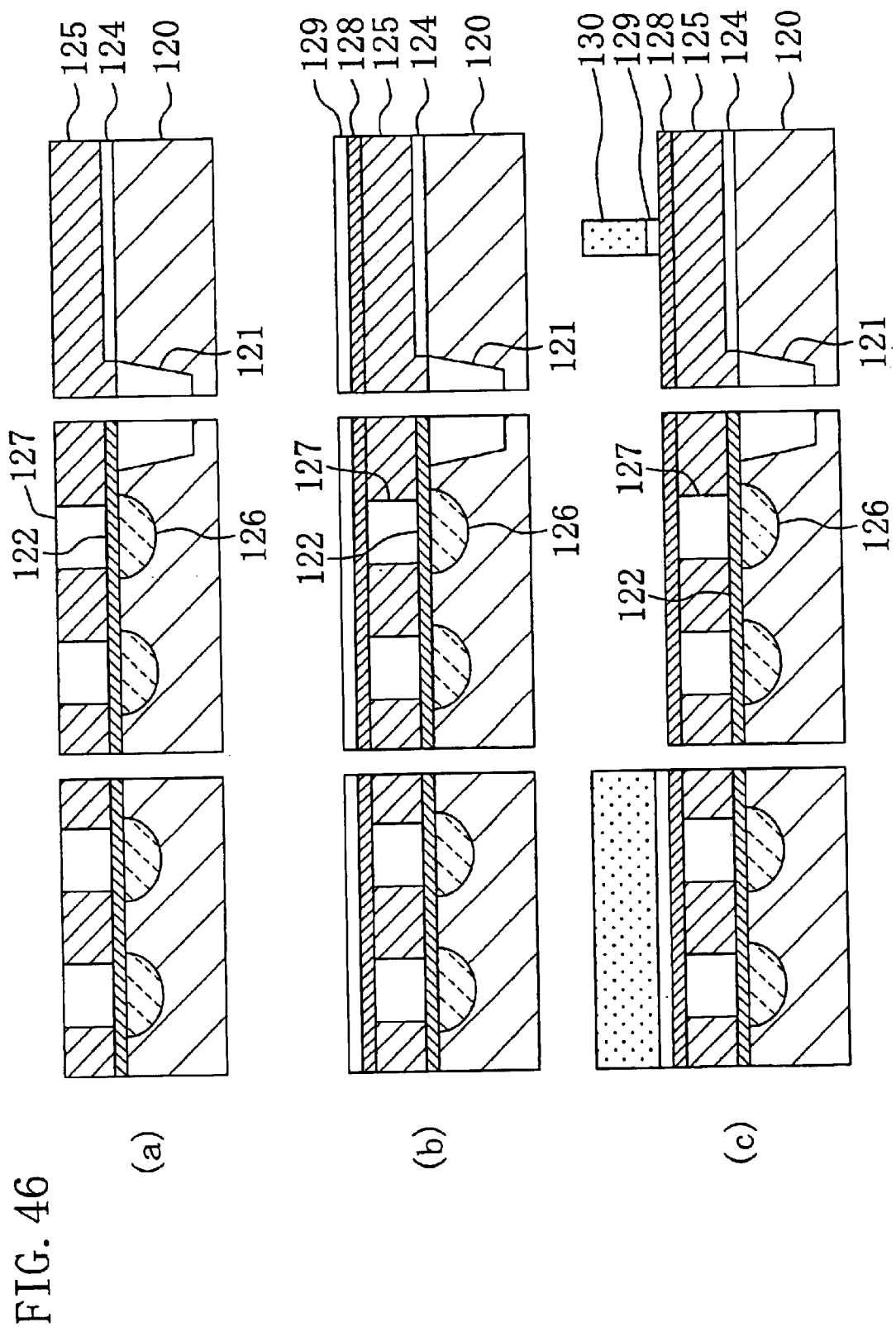
FIGS. 46(a) through 46(c) are cross-sectional views for showing other procedures in the method for fabricating a semiconductor memory according to Embodiment 11.

Then, as shown in FIG. 46(*a*), after depositing a silicon oxide film over the semiconductor substrate 120, the silicon oxide film is subjected to, for example, the CMP or etch back, so as to remove a portion of the silicon oxide film present on the pattern of the polysilicon film 125. Thus, a buried insulating film 127 is formed between the patterns of the polysilicon film 125 and on the high concentration impurity diffusion layer 126. In this case, the top faces of the pattern of the polysilicon film 125 and the buried insulating film 127 are at substantially the same level.

Next, as shown in FIG. 46(*b*), a metal film 128 of, for example, a tungsten film with a thickness of 150 nm and a covering insulating film 129 of, for example, a silicon nitride film with a thickness of 100 nm are successively deposited over the semiconductor substrate 120.

Then, as shown in FIG. 46(*c*), the covering insulating film 129, the metal film 128 and the pattern of the polysilicon film 125 are selectively etched by using a third resist pattern 130 as a mask. Thus, a first gate electrode made of a pattern of the metal film 128 and a pattern of the polysilicon film 125 is formed in the memory device formation region, and a second gate electrode made of a pattern of the metal film 128 and a pattern of the polysilicon film 125 is formed in the logic circuit region.

Figure 47:
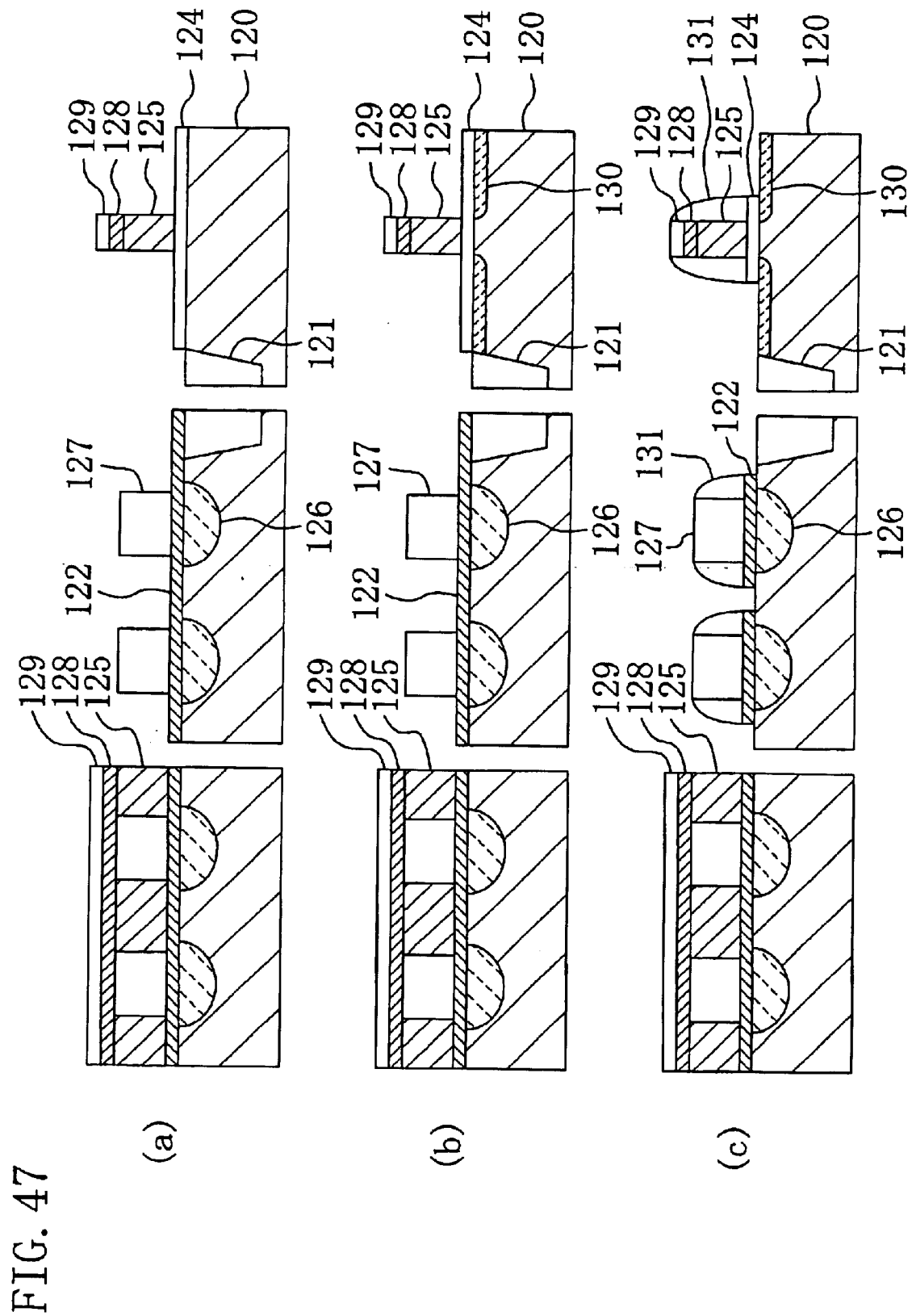
FIGS. 47(a) through 47(c) are cross-sectional views for showing other procedures in the method for fabricating a semiconductor memory according to Embodiment 11.

Next, as shown in FIG. 47(*b*), impurity ions are implanted into the semiconductor substrate 120 by using the second gate electrode as a mask in the logic circuit region, so as to form a low concentration impurity diffusion layer 130.

Then, as shown in FIG. 47(*c*), after depositing a silicon oxide film with a thickness of, for example, 50 nm through 200 nm over the semiconductor substrate 120, the silicon oxide film is etched back. Thus, a sidewall insulating film 131 is formed on the side face of the buried insulating film 127 in the memory device region, and the sidewall insulating film 131 is formed on the side face of the second gate electrode in the logic circuit region. Thereafter, the gate insulating film 124 is selectively etched by using the second gate electrode and the sidewall insulating film 131 as a mask in the logic circuit region, so as to pattern the gate insulating film 124. In this case, the trapping film 122 is patterned in the memory device region.

Figure 48:
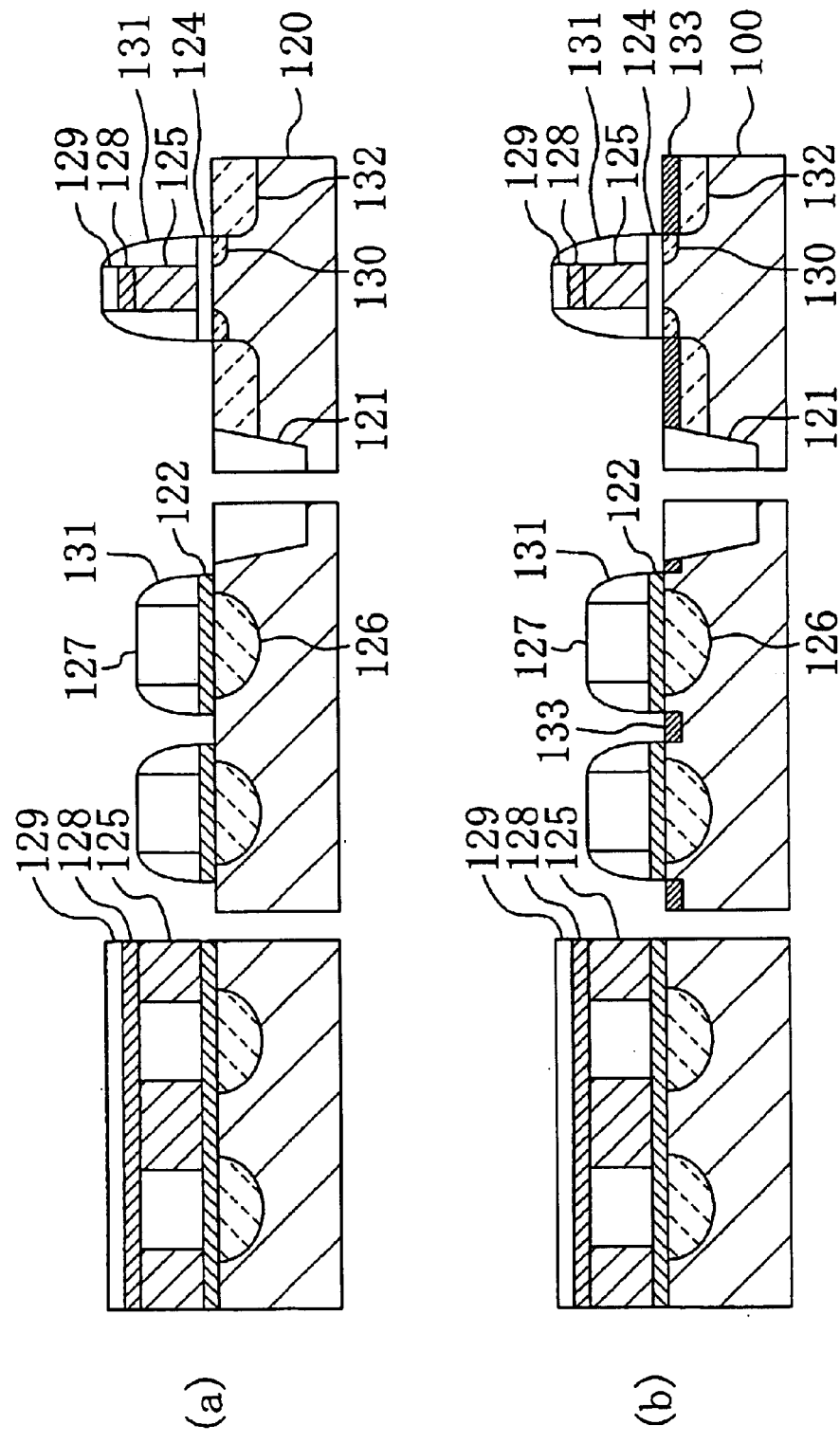
FIGS. 48(a) and 48(b) are cross-sectional views for showing other procedures in the method for fabricating a semiconductor memory according to Embodiment 11.

Next, as shown in FIG. 48(a), impurity ions are selectively implanted into the semiconductor substrate 120 by using the second gate electrode and the sidewall insulating film 131 as a mask in the logic circuit region, so as to form high concentration impurity diffusion layers 132 working as source and drain regions.

Then, as shown in FIG. 48(b), after depositing a cobalt film over the semiconductor substrate 120, the annealing is performed, so as to form a silicide layer 133 in a surface portion of the high concentration impurity diffusion layers 132. Thus, a semiconductor device according to Embodiment 11 is obtained. In this case, the silicide layer 133 is formed also between the gate electrodes in the memory device region.

According to Embodiment 11, the first electrode with a polymetal structure included in the memory device and the second gate electrode with a polymetal structure of a transistor included in the logic circuit are formed in the same procedure, and therefore, the number of procedures can be reduced.

Although a polysilicon film doped with an impurity is deposited as the polysilicon film 125 in Embodiment 11, instead, a polysilicon film not doped with an impurity can be first deposited to be doped with an impurity afterward.

Furthermore, the polysilicon film 125 of Embodiment 11 may be replaced with an amorphous silicon film.

Moreover, although an n-type memory device is formed in Embodiment 11, a p-type memory device may be formed instead.

(Embodiment 12)

A semiconductor memory and a method for fabricating the same according to Embodiment 12 of the invention will now be described with reference to FIGS. 49(a) through 40(c), 50(a) through 50(c), 51(a) through 51(c), 52(a) through 52(c) and 53(a) through 53(c). In each of these drawings, a left hand side part shows a gate electrode portion of a memory device formation region, a center part shows a portion between gate electrodes of the memory device formation region and a right hand side part shows a logic circuit region.

Figure 49:
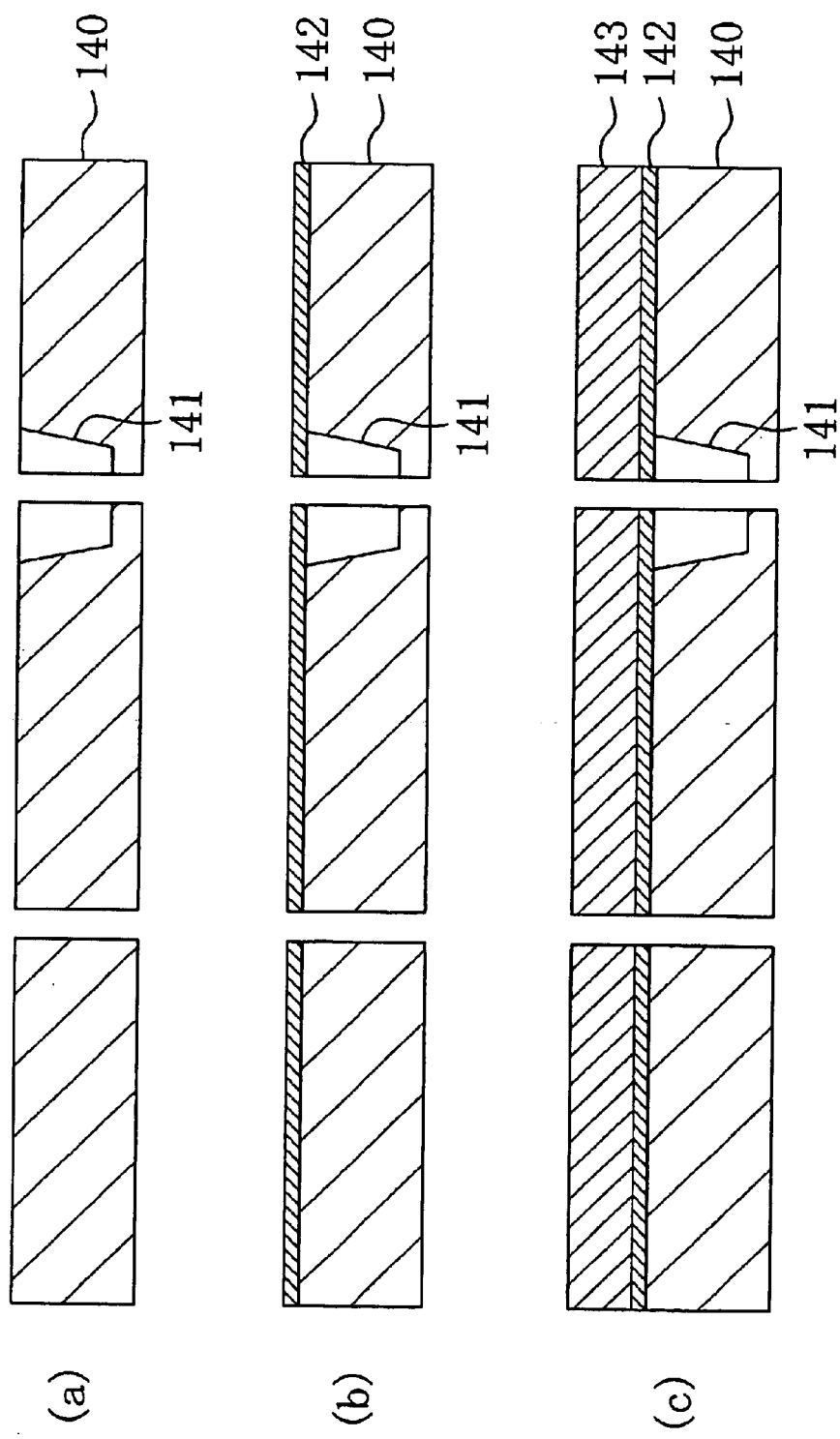
FIGS. 49(a) through 49(c) are cross-sectional views for showing procedures in a method for fabricating a semiconductor memory according to Embodiment 12.

First, as shown in FIG. 49(a), a trench isolation region 141 is formed in a semiconductor substrate 140 of a silicon substrate. Thereafter, as shown in FIG. 49(b), a trapping film 142 made of a multilayer film composed of, for example, a silicon oxide film, a silicon nitride film and a silicon oxide film and having a thickness of 30 nm in total is deposited over the semiconductor substrate 140.

Then, as shown in FIG. 49(c), a first polysilicon film 143 doped with, for example, $1\times10^{20}$ cm$^{-3}$ through $1\times10^{21}$ cm$^{-3}$ of phosphorus and having a thickness of 150 nm through 300 nm is deposited over the semiconductor substrate 140.

Figure 50:
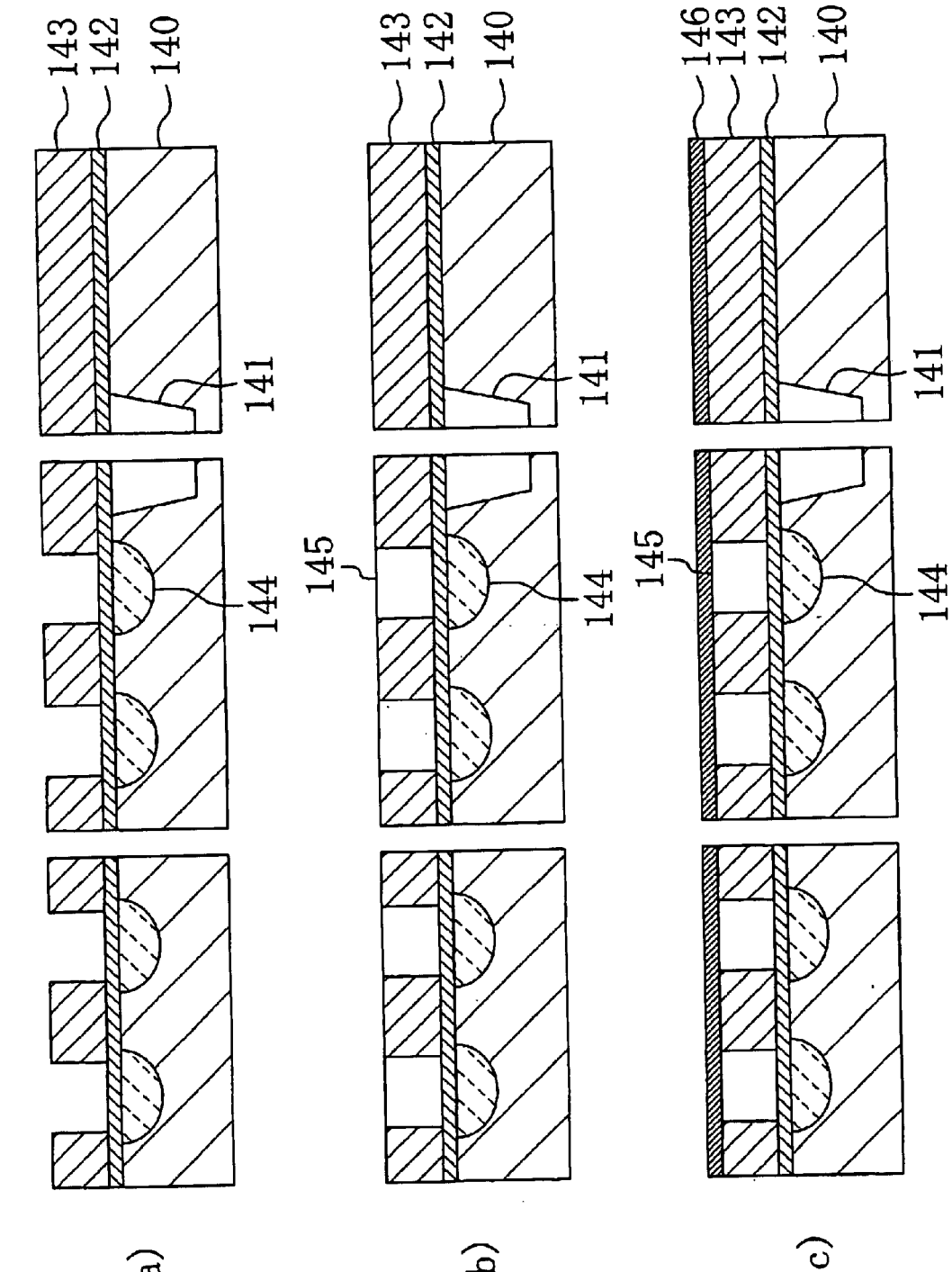
FIGS. 50(a) through 50(c) are cross-sectional views for showing other procedures in the method for fabricating a semiconductor memory according to Embodiment 12.

Next, as shown in FIG. 50(a), the first polysilicon film 143 is selectively etched by using a mask (omitted in the drawings), so as to pattern the first polysilicon film 143. Thereafter, ions of an n-type impurity are implanted into the semiconductor substrate 140 at, for example, $1\times10^{15}$ cm$^{-2}$ through $1\times10^{16}$ cm$^{-2}$ by using the pattern of the first polysilicon film 143 as a mask, so as to form, in the memory device formation region, an n-type high concentration impurity diffusion layer 144 working as a bit line.

Then, as shown in FIG. 50(b), after depositing a silicon oxide film over the semiconductor substrate 140, the silicon oxide film is subjected to, for example, the CMP or etch back, so as to remove a portion of the silicon oxide film present on the pattern of the first polysilicon film 143. Thus, a buried insulating film 145 is formed between the patterns of the first polysilicon film 143 and on the high concentration impurity diffusion layer 144. In this case, the top faces of the pattern of the first polysilicon film 143 and the buried insulating film 144 are at substantially the same level.

Next, as shown in FIG. 50(c), a protection film 146 of, for example, a silicon nitride film with a thickness of 100 nm is deposited on the pattern of the first polysilicon film 143 and the buried insulating film 145.

Figure 51:
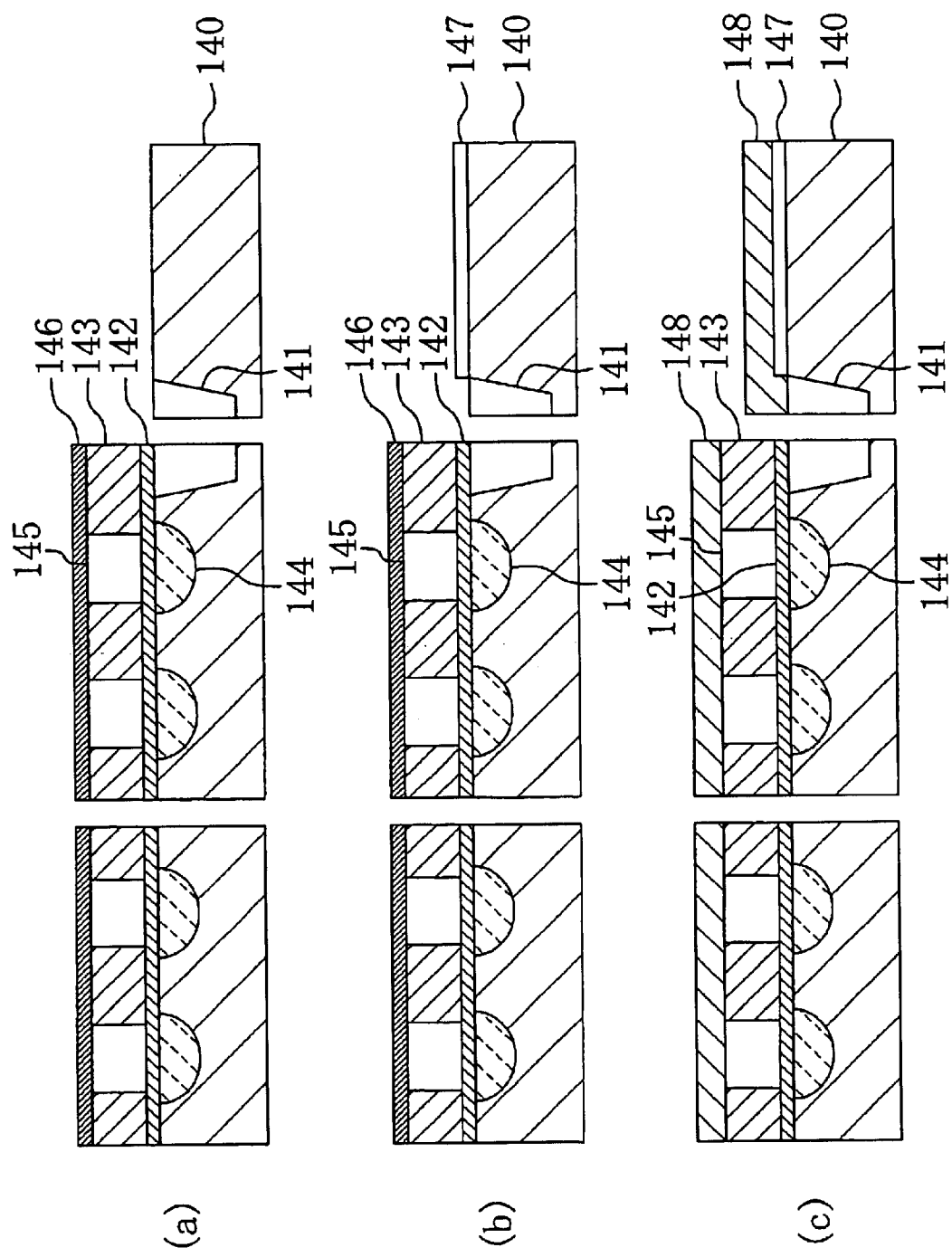
FIGS. 51(a) through 51(c) are cross-sectional views for showing procedures in a method for fabricating a semiconductor memory according to Embodiment 12.

Then, as shown in FIG. 51(a), the protection film 146, the patterns of the first polysilicon film 143 and the trapping film 142 are successively removed in the logic circuit region. Thereafter, as shown in FIG. 51(b), a surface portion of the semiconductor substrate 140 is oxidized, so as to form a gate insulating film 147 with a thickness of, for example, 2 nm through 25 nm.

Next, as shown in FIG. 51(c), a second polysilicon film 148 doped with, for example, $1\times10^{20}$ cm$^{-3}$ through $1\times10^{21}$ cm$^{-3}$ of phosphorus and having a thickness of 50 nm through 200 nm is deposited over the semiconductor substrate 140.

Figure 52:
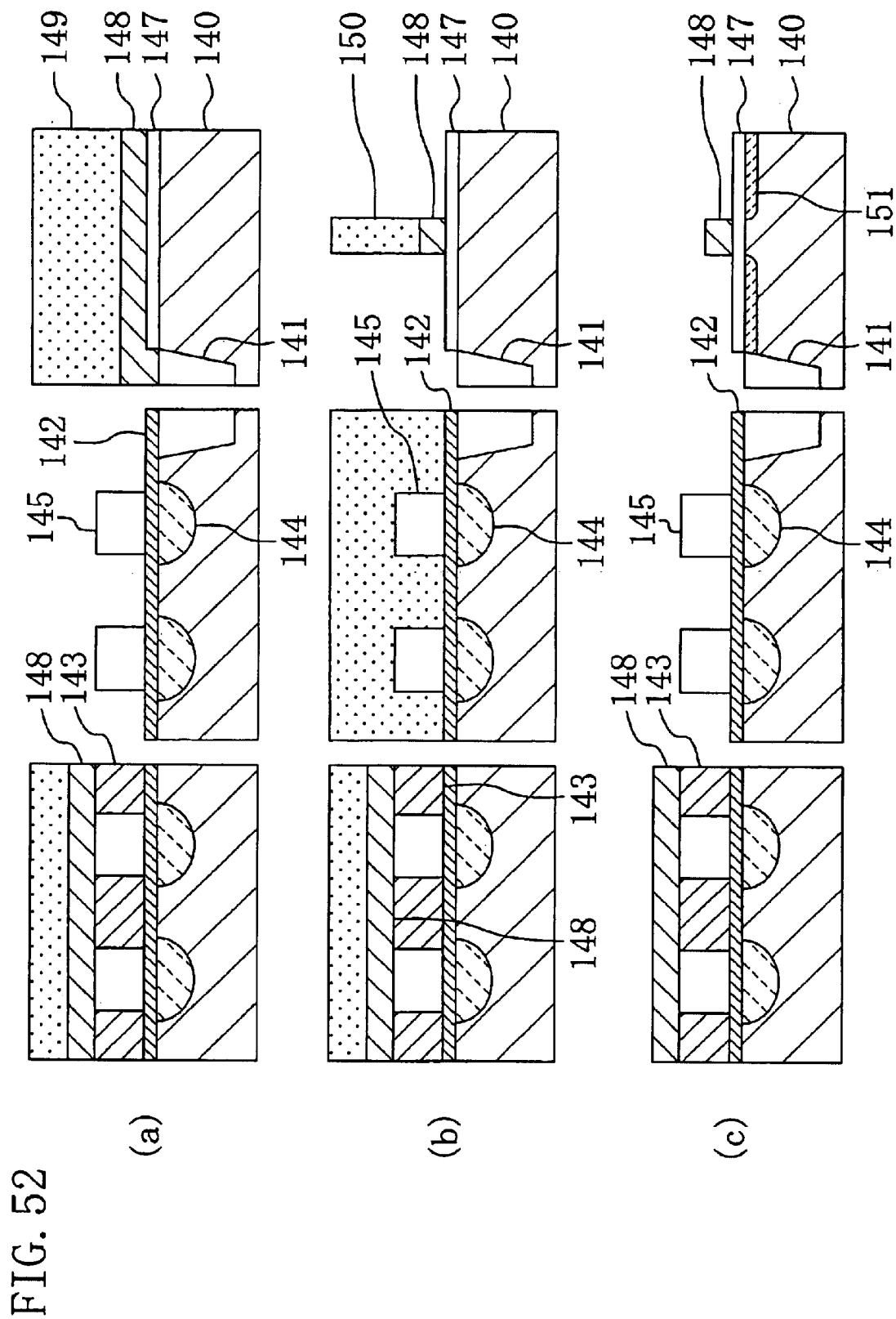
FIGS. 52(a) through 52(c) are cross-sectional views for showing other procedures in the method for fabricating a semiconductor memory according to Embodiment 12.

Then, as shown in FIG. 52(a), the second polysilicon film 148 and the pattern of the first polysilicon film 143 are selectively etched by using a first resist pattern 149 as a mask. Thus, a first gate electrode made of a pattern of the second polysilicon film 148 and a pattern of the first polysilicon film 143 is formed in the memory device region.

Next, as shown in FIG. 52(b), the second polysilicon film 147 is selectively etched by using a second resist pattern 150 as a mask. Thus, a second gate electrode made of a pattern of the second polysilicon film 148 is formed in the logic circuit region.

Then, as shown in FIG. 52(c), after removing the second resist pattern 150, impurity ions are implanted into the semiconductor substrate 140 by using the second gate electrode as a mask in the logic circuit region, so as to form a low concentration impurity diffusion layer 151.

Figure 53:
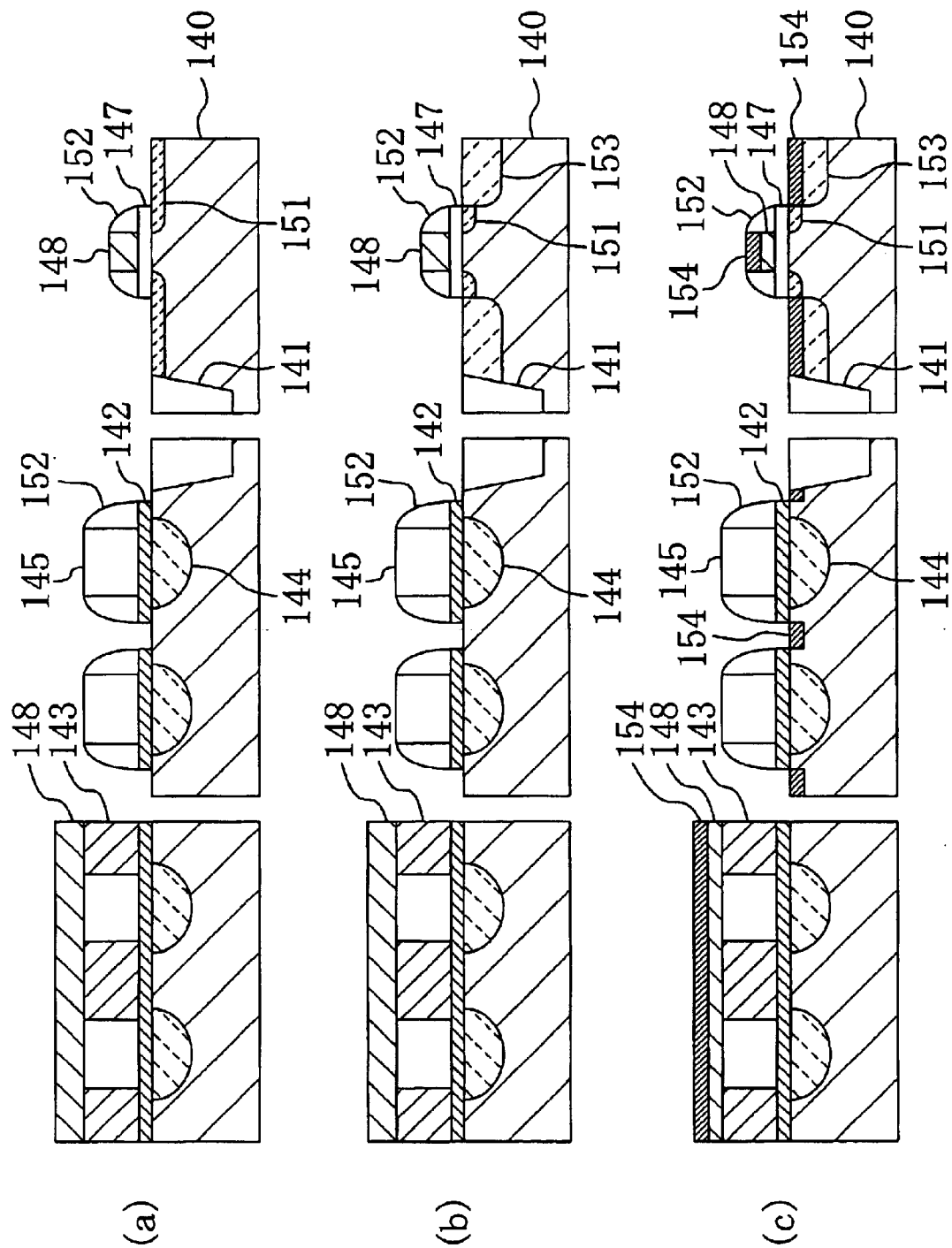
FIGS. 53(a) through 53(c) are cross-sectional views for showing other procedures in the method for fabricating a semiconductor memory according to Embodiment 12.

Then, as shown in FIG. 53(a), after depositing a silicon oxide film with a thickness of, for example, 50 nm through 200 nm over the semiconductor substrate 140, the silicon oxide film is etched back. Thus, a sidewall insulating film 152 is formed on the side face of the buried insulating film 145 in the memory device region, and the sidewall insulating film 152 is formed on the side face of the second gate electrode in the logic circuit region. Thereafter, the gate insulating film 147 is selectively etched by using the second gate electrode and the sidewall insulating film 152 as a mask in the logic circuit region, so as to pattern the gate insulating film 147. In this case, the trapping film 142 is patterned in the memory device region.

Next, as shown in FIG. 53(b), impurity ions are selectively implanted into the semiconductor substrate 140 by using the second gate electrode and the sidewall insulating film 152 as a mask in the logic circuit region, so as to form high concentration impurity diffusion layers 153 working as source and drain regions.

Then, as shown in FIG. 53(c), after depositing a cobalt film over the semiconductor substrate 140, the annealing is performed, so as to form a silicide layer 154 in a surface portion of the first gate electrode in the memory device region and form the silicide layer 154 in a surface portion of the second gate electrode in the logic circuit region. Thus, a semiconductor device according to Embodiment 12 is obtained.

According to Embodiment 12, since the second gate electrode of a transistor included in the logic circuit is made of a pattern of the second polysilicon film 147 alone, the second gate electrode can be refined.

Although a polysilicon film doped with an impurity is deposited as each of the first polysilicon film 143 and the second polysilicon film 147 in Embodiment 12, instead, a polysilicon film not doped with an impurity can be first deposited to be doped with an impurity afterward.

Furthermore, each of the first polysilicon film 143 and the second polysilicon film 147 of Embodiment 12 may be replaced with an amorphous silicon film.

Moreover, although an n-type memory device is formed in Embodiment 12, a p-type memory device may be formed instead.

(Embodiment 13)

A semiconductor memory and a method for fabricating the same according to Embodiment 13 of the invention will now be described with reference to FIGS. 54(a) through 54(c), 55(a) through 55(c), 56(a) through 56(c), 57(a) through 57(c) and 58(a) through 58(c). In each of these drawings, a left hand side part shows a gate electrode portion of a memory device formation region, a center part shows a portion between gate electrodes of the memory device formation region and a right hand side part shows a logic circuit region.

Figure 54:
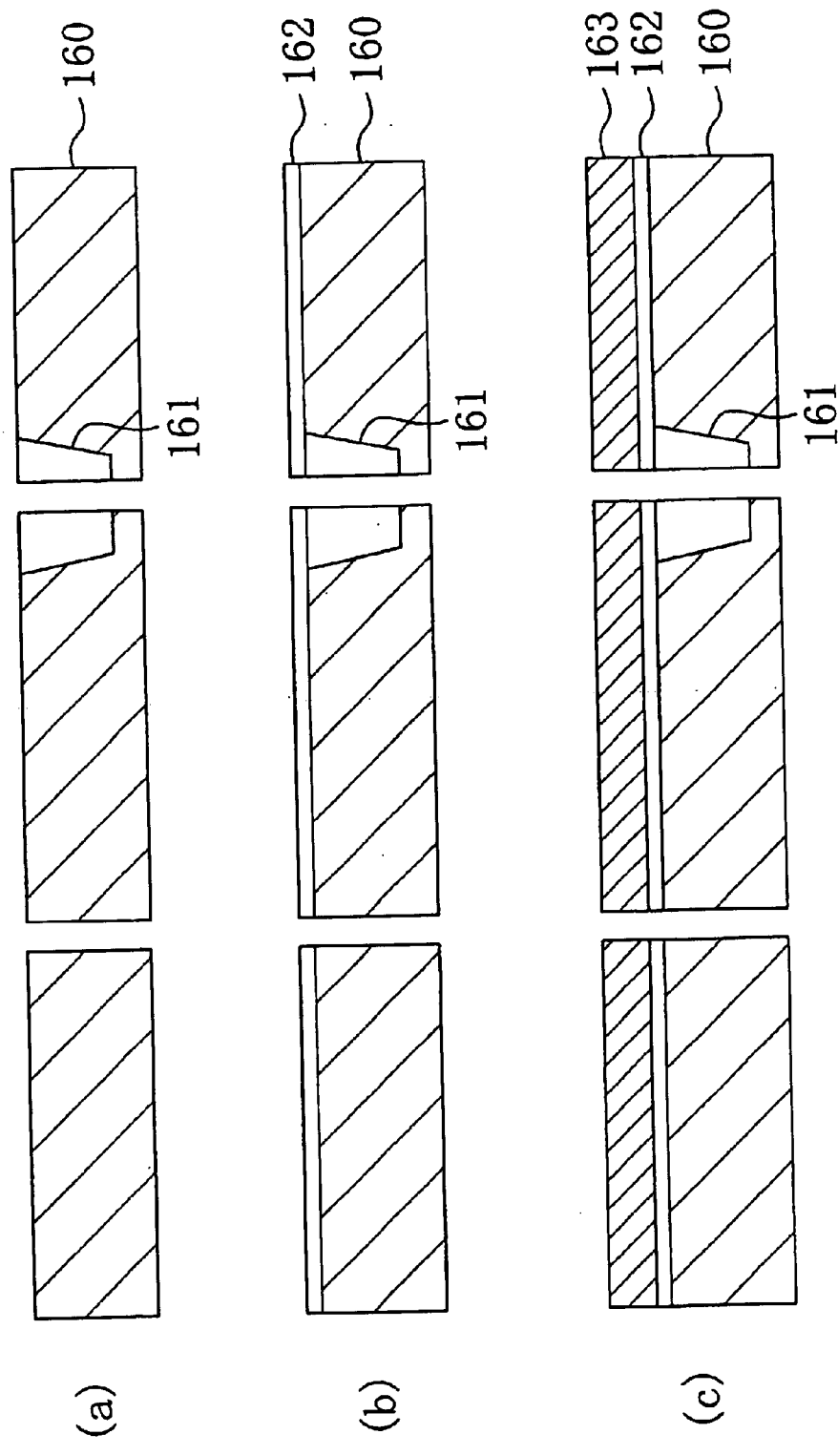
FIGS. 54(a) through 54(c) are cross-sectional views for showing procedures in a method for fabricating a semiconductor memory according to Embodiment 13.

First, as shown in FIG. 54(a), a trench isolation region 161 is formed in a semiconductor substrate 160 of a silicon substrate. Thereafter, as shown in FIG. 54(b), a tunnel insulating film 162 of, for example, a silicon oxide film and having a thickness of 6 nm through 15 nm is deposited over the semiconductor substrate 160.

Next, a first polysilicon film 163 doped with, for example, $1\times10^{20}$ cm$^{-3}$ through $1\times10^{21}$ cm$^{-3}$ of phosphorus and having a thickness of 150 nm through 300 nm is deposited over the semiconductor substrate 160.

Figure 55:
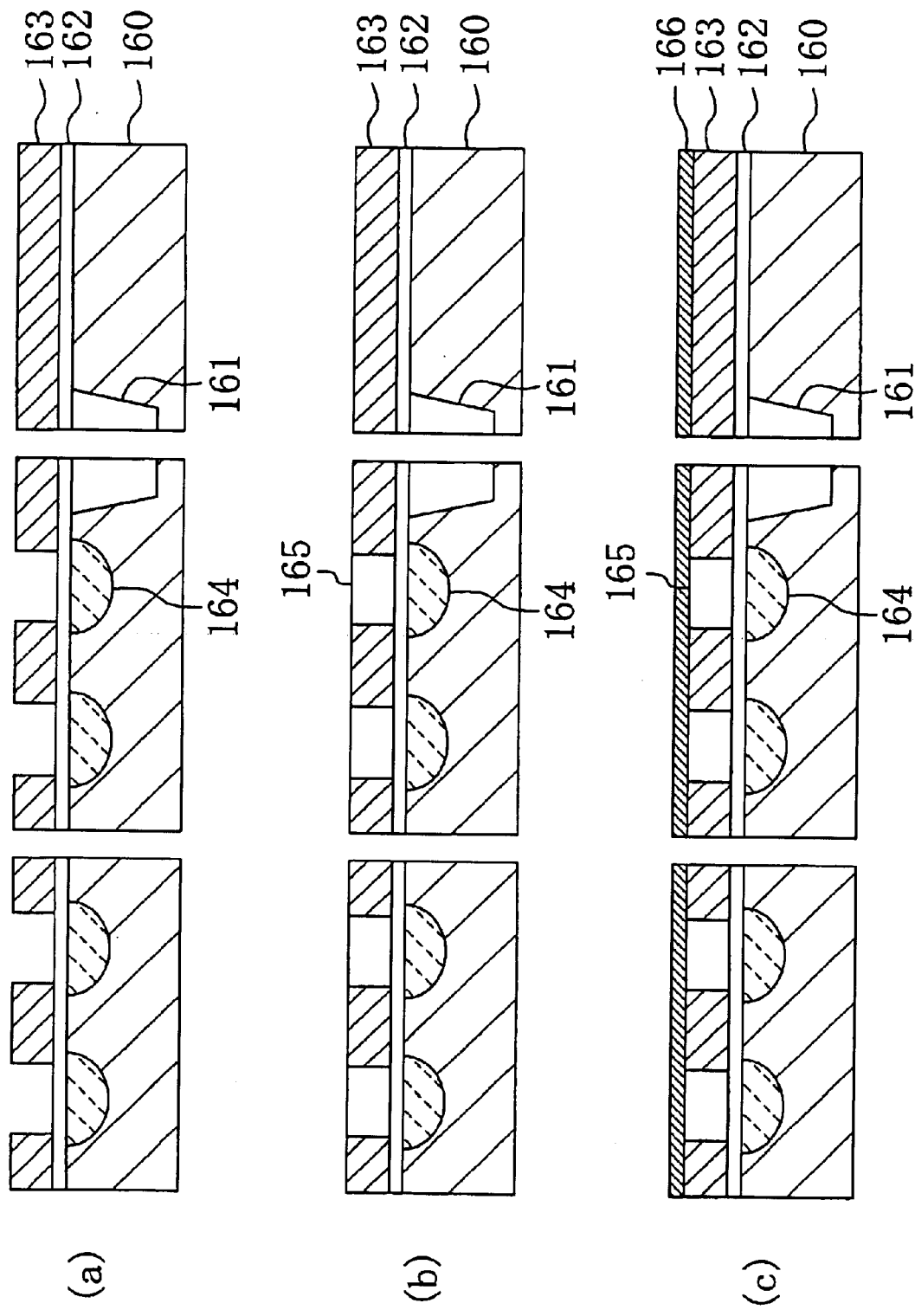
FIGS. 55(a) through 55(c) are cross-sectional views for showing other procedures in the method for fabricating a semiconductor memory according to Embodiment 13.

Next, as shown in FIG. 55(a), after patterning the first polysilicon film 163, ions of an n-type impurity are implanted into the semiconductor substrate 160 at, for example, $1\times10^{15}$ cm$^{-2}$ through $1\times10^{16}$ cm$^{-2}$ by using the pattern of the first polysilicon film 163 as a mask, so as to form, in the memory device formation region, an n-type high concentration impurity diffusion layer 164 working as a bit line.

Then, as shown in FIG. 55(b), after depositing a silicon oxide film over the semiconductor substrate 160, the silicon oxide film is subjected to, for example, the CMP or etch back, so as to remove a portion of the silicon oxide film present on the pattern of the first polysilicon film 163. Thus, a buried insulating film 165 is formed between the patterns of the first polysilicon film 163 and on the high concentration impurity diffusion layer 164. In this case, the top faces of the pattern of the first polysilicon film 163 and the buried insulating film 164 are at substantially the same level.

Next, as shown in FIG. 55(c), an inter-electrode insulating film 166 made of a multilayer film composed of, for example, a silicon oxide film, a silicon nitride film and a silicon oxide film is deposited.

Figure 56:
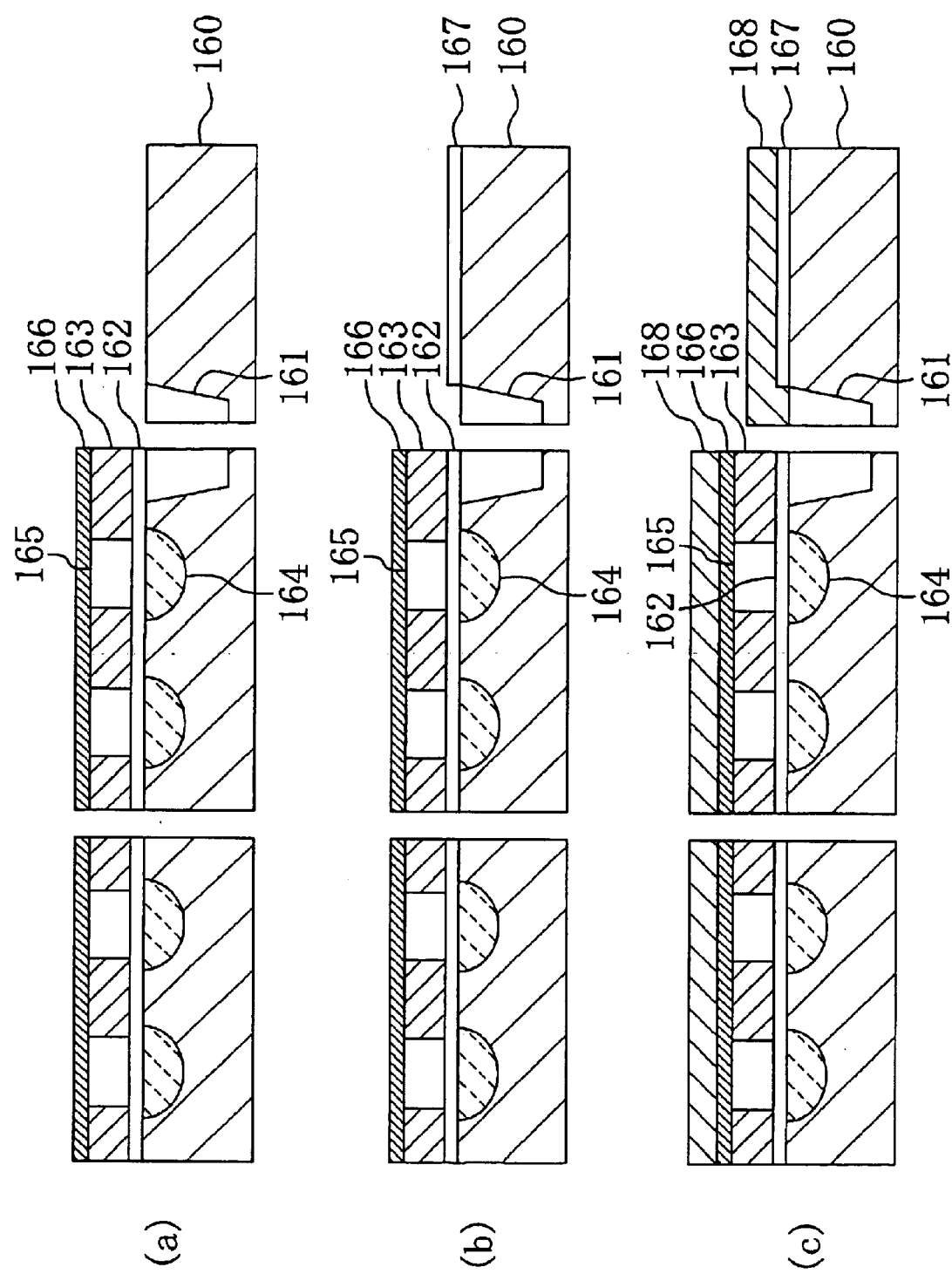
FIGS. 56(a) through 56(c) are cross-sectional views for showing other procedures in the method for fabricating a semiconductor memory according to Embodiment 13.

Then, as shown in FIG. 56(a), the inter-electrode insulating film 166, the pattern of the first polysilicon film 163 and the tunnel insulating film 162 are successively removed in the logic circuit region. Thereafter, as shown in FIG. 56(b), a surface portion of the semiconductor substrate 160 is oxidized, so as to form a gate insulating film 167 with a thickness of, for example, 2 nm through 25 nm.

Next, as shown in FIG. 56(c), a second polysilicon film 168 doped with, for example, $1\times10^{20}$ cm$^{-3}$ through $1\times10^{21}$ cm$^{-3}$ of phosphorus and having a thickness of 50 nm through 200 nm is deposited over the semiconductor substrate 160.

Figure 57:
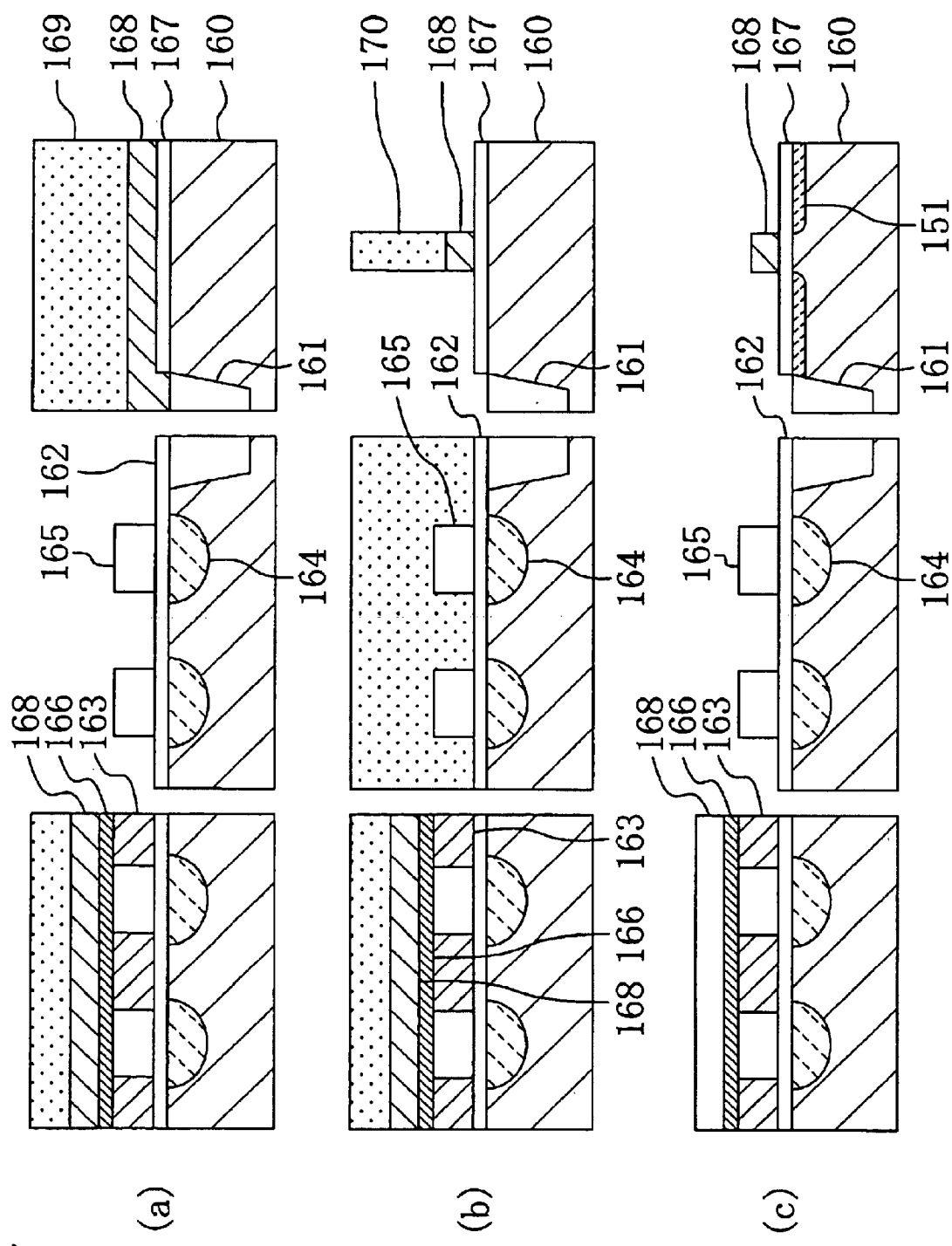
FIGS. 57(a) through 57(c) are cross-sectional views for showing other procedures in the method for fabricating a semiconductor memory according to Embodiment 13.

Then, as shown in FIG. 57(a), the second polysilicon film 168 and the pattern of the first polysilicon film 163 are selectively etched by using a first resist pattern 169 as a mask. Thus, a memory device composed of a first gate electrode made of a pattern of the second polysilicon film 168, a pattern of the inter-electrode insulating film 166 and a floating electrode made of a pattern of the first polysilicon film 163 is formed in the memory device region.

Next, as shown in FIG. 57(b), the second polysilicon film 168 is selectively etched by using a second resist pattern 170 as a mask, so as to form a second gate electrode made of a pattern of the second polysilicon film 168 in the logic circuit region.

Then, as shown in FIG. 57(c), after removing the second resist pattern 170, impurity ions are implanted into the semiconductor substrate 160 by using the second gate electrode as a mask in the logic circuit region, so as to form a low concentration impurity diffusion layer 171.

Figure 58:
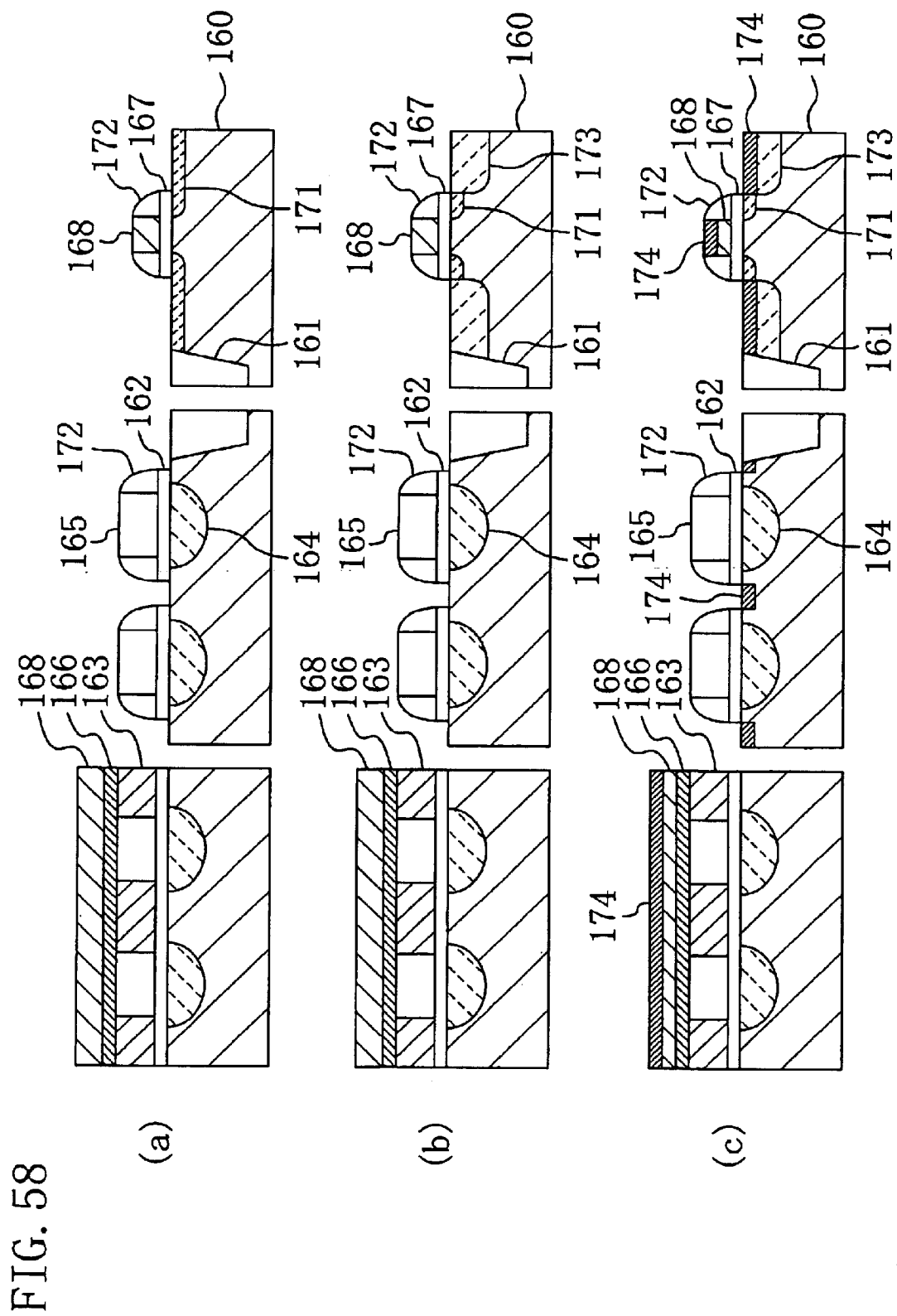
FIGS. 58(a) through 58(c) are cross-sectional views for showing other procedures in the method for fabricating a semiconductor memory according to Embodiment 13.
Figure 59:
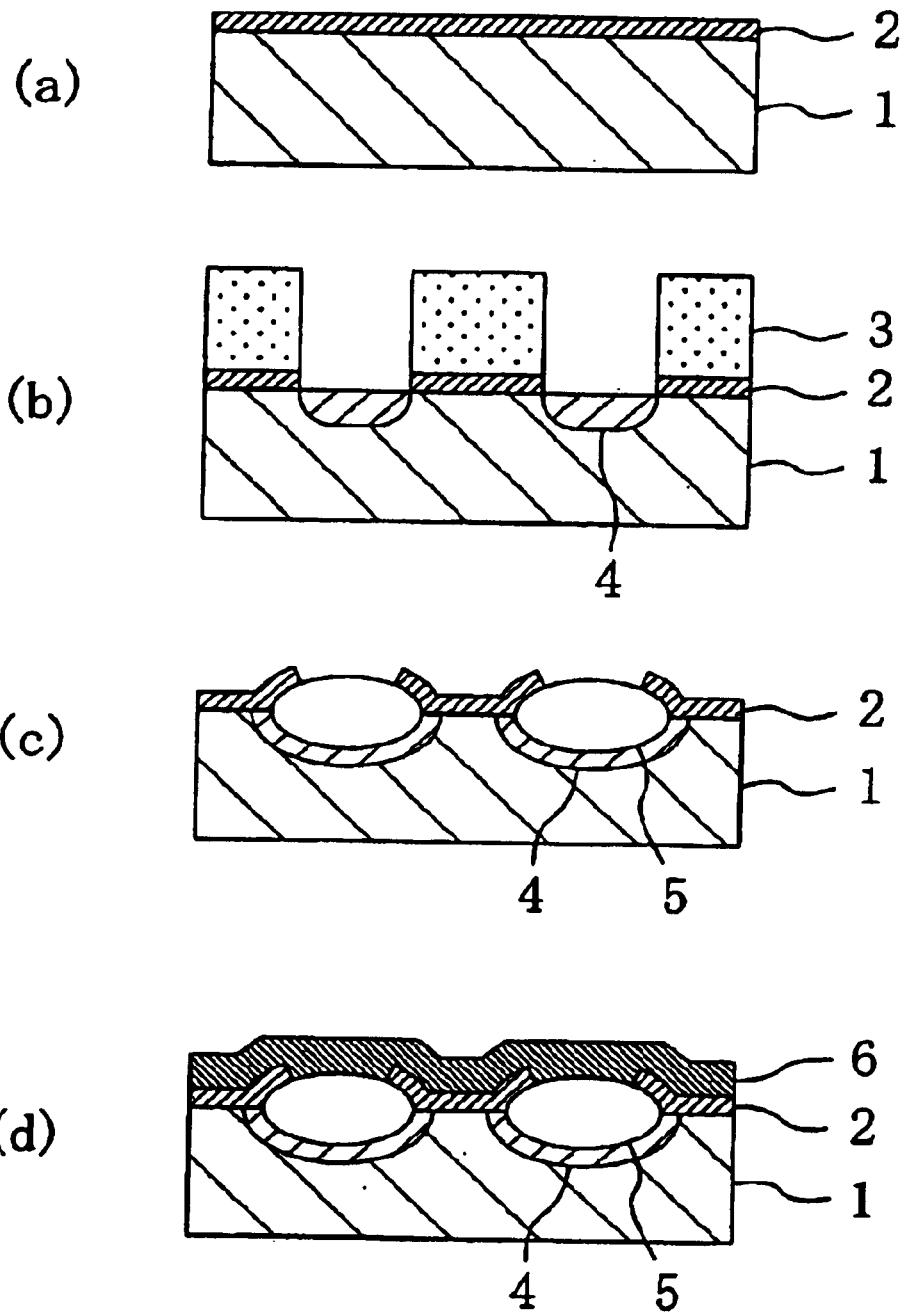
FIGS. 59(a) through 59(d) are cross-sectional views for showing procedures in a conventional method for fabricating a semiconductor memory.
Figure 60:
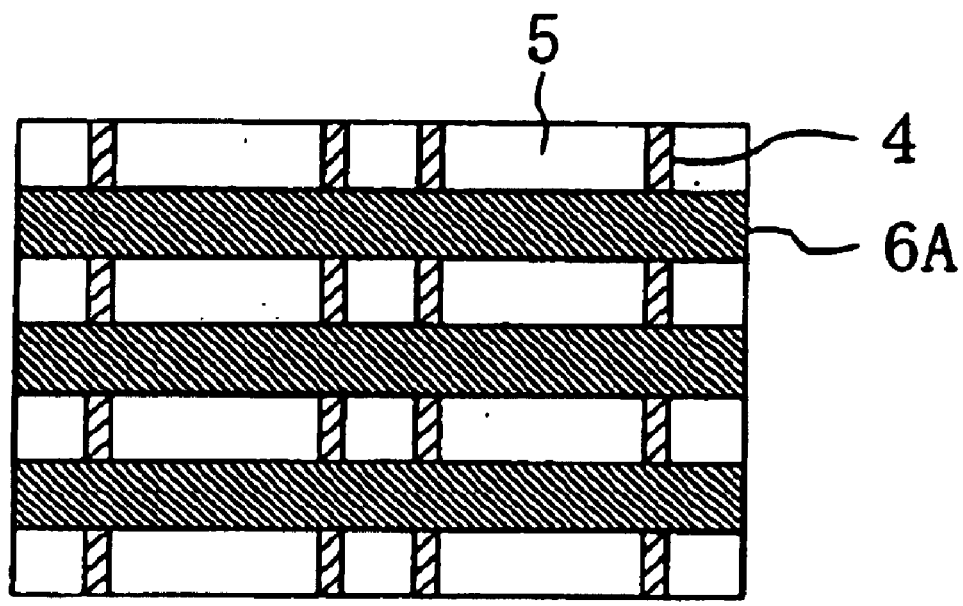
FIG. 60 is a plan view of a conventional semiconductor memory.

Then, as shown in FIG. 58(a), after depositing a silicon oxide film with a thickness of, for example, 50 nm through 200 nm over the semiconductor substrate 170, the silicon oxide film is etched back. Thus, a sidewall insulating film 172 is formed on the side face of the buried insulating film 165 in the memory device region, and the sidewall insulating film 172 is formed on the side face of the second gate electrode in the logic circuit region. Thereafter, the gate insulating film 167 is selectively etched by using the second gate electrode and the sidewall insulating film 172 as a mask in the logic circuit region, so as to pattern the gate insulating film 167. In this case, the tunnel insulating film 162 is patterned in the memory device region.

Next, as shown in FIG. 58(b), impurity ions are selectively implanted into the semiconductor substrate 160 by using the second gate electrode and the sidewall insulating film 172 as a mask in the logic circuit region, so as to form high concentration impurity diffusion layers 173 working as source and drain regions.

Then, as shown in FIG. 58(c), after depositing a cobalt film over the semiconductor substrate 160, the annealing is performed, so as to form a silicide layer 174 in a surface portion of the first gate electrode in the memory device region and form the silicide layer 157 in a surface portion of the second gate electrode in the logic circuit region. Thus, a semiconductor device according to Embodiment 13 is obtained.

Although a polysilicon film doped with an impurity is deposited as each of the first polysilicon film 163 and the second polysilicon film 167 in Embodiment 13, instead; a polysilicon film not doped with an impurity can be first deposited to be doped with an impurity afterward.

Furthermore, each of the first polysilicon film 163 and the second polysilicon film 167 of Embodiment 13 may be replaced with an amorphous silicon film.

Moreover, although an n-type memory device is formed in Embodiment 13, a p-type memory device may be formed instead.

According to Embodiment 13, since the first gate electrode included in the memory device and the second gate electrode of a transistor included in the logic circuit can be formed in substantially the same procedure, the number of procedures can be reduced. In this case, since the second gate electrode is made of a pattern of the second polysilicon film 167 alone, the second gate electrode can be refined.

Furthermore, since the silicide layer 174 formed in the surface portion of the first gate electrode and the silicide layer 174 formed in the surface portion of the second gate electrode can be formed in the same procedure, the number of procedures can be reduced.

Moreover, since the sidewall insulating film 172 formed on the side face of the buried insulating film 165 in the memory device region and the sidewall insulating film 172 formed on the side face of the second gate electrode of the transistor included in the logic circuit can be formed in the same procedure, the number of procedures can be reduced.

As an embodiment using a memory device composed of a floating electrode, an inter-electrode insulating film and a gate electrode, merely Embodiment 9 corresponding to Embodiment 1 and Embodiment 13 corresponding to Embodiment 12 are herein described. Apart from these embodiments, embodiments respectively corresponding to Embodiments 2, 3, 4, 5, 6 and 7 can be naturally practiced.

In the case where Embodiment 2 is modified to correspond to an embodiment using a floating electrode, an inter-electrode insulating film and a gate electrode, a tunnel insulating film is formed instead of the trapping film 21 and an inter-electrode insulating film is deposited below the second polysilicon film 26.

In the case where Embodiment 3 is modified to correspond to an embodiment using a floating electrode, an inter-electrode insulating film and a gate electrode, a tunnel insulating film is formed instead of the trapping film 31 and an inter-electrode insulating film is deposited below the second polysilicon film 38.

In the case where Embodiment 4 is modified to correspond to an embodiment using a floating electrode, an inter-electrode insulating film and a gate electrode, a tunnel insulating film is formed instead of the trapping film 41 and an inter-electrode insulating film is deposited below the second polysilicon film 49.

In the case where Embodiment 5 is modified to correspond to an embodiment using a floating electrode, an inter-electrode insulating film and a gate electrode, a tunnel insulating film is formed instead of the trapping film 51 and an inter-electrode insulating film is deposited below the second polysilicon film 58.

In the case where Embodiment 6 is modified to correspond to an embodiment using a floating electrode, an inter-electrode insulating film and a gate electrode, a tunnel insulating film is formed instead of the trapping film 61 and an inter-electrode insulating film is deposited below the second polysilicon film 66.

In the case where Embodiment 7 is modified to correspond to an embodiment using a floating electrode, an inter-electrode insulating film and a gate electrode, a tunnel insulating film is formed instead of the trapping film 71 and an inter-electrode insulating film is deposited below the second polysilicon film 76.

INDUSTRIAL APPLICABILITY

According to first through third semiconductor memories and first through sixth methods for fabricating a semiconductor memory of this invention, a semiconductor memory can be refined and the resistance of a bit line can be lowered as well as the salicide processing can be performed on a gate electrode.

What is claimed is:

1. A semiconductor memory comprising a plurality of memory devices, each one of said plurality of memory devices composed of a pair of impurity diffusion layers spaced from each other and formed in surface portions of a semiconductor substrates, a trapping film formed on said semiconductor substrate and in a region between said pair of impurity diffusion layers, and a gate electrode formed on said trapping film, wherein one of said pair of impurity diffusion layers constituting each one of said plurality of memory devices is shared by two adjacent memory devices of said plurality of memory devices; and an insulating film is formed filling a region between said gate electrodes of said two adjacent memory devices so that said insulating film covers the top of said impurity diffusion layer shared by said two adjacent memory devices.

2. A semiconductor memory comprising:

a plurality of impurity diffusion layers formed in surface portions of a semiconductor substrate in a shape of stripes and working as bit lines;

a plurality of buried insulating films formed above said plurality of impurity diffusion layers on said semiconductor substrate and extending along a bit line direction; and gate electrodes of memory devices formed on said semiconductor substrate and extending along a word line direction, wherein said gate electrodes include a plurality of first conducting films, which are formed between said plurality of buried insulating films on said semiconductor substrate with a trapping film formed below said gate electrodes and have top faces thereof at substantially the same level as top faces of said plurality of buried insulating films, and a second conducting film formed over said plurality of buried insulating films and said plurality of first conducting films for electrically connecting said plurality of first conducting films to one another.

3. The semiconductor memory of claim 1 or 2, wherein said trapping film is made of a multilayer film composed of a silicon oxide film, a silicon nitride film and a silicon oxide film successively deposited on said semiconductor substrate.

4. A semiconductor memory comprising:

a plurality of impurity diffusion layers formed in surface portions of a semiconductor substrate in a shape of stripes and working as bit lines;

a plurality of buried insulating films formed above said plurality of impurity diffusion layers on said semiconductor substrate and extending along a bit line direction;

a plurality of floating electrodes made of first conducting films that are formed between said plurality of buried insulating films on said semiconductor substrate with a tunnel insulating film formed below and have top faces substantially at the same level as top faces of said plurality of buried insulating films;

an inter-electrode insulating film formed over said plurality of buried insulating films and said plurality of floating electrodes and extending along a word line direction; and gate electrodes of memory devices made of a second conducting film that is formed on said inter-electrode insulating film and extends along the word line direction.

5. The semiconductor memory of claim 2 or 4, further comprising sidewall insulating films formed on side faces of said first conducting films.

6. The semiconductor memory of claim 5, further comprising metal films formed between said plurality of impurity diffusion layers and said plurality of buried insulating films and between every pair of said sidewall insulating films opposing each other.

7. The semiconductor memory of claim 2 or 4, wherein each of said plurality of impurity diffusion layers includes a high concentration impurity diffusion layer formed at a center and low concentration impurity diffusion layers formed on both sides of said high concentration impurity diffusion layer.

8. The semiconductor memory of claim 2 or 4, wherein a silicide layer is formed in a surface portion of said second conducting film.

9. The semiconductor memory of claim 8, further comprising sidewall insulating films formed on side faces of said plurality of buried insulating films.

10. The semiconductor memory of claim 8, further comprising insulating films buried between said plurality of buried insulating films.

11. The semiconductor memory of claim 2 or 4, wherein said second conducting film is a metal film.

12. The semiconductor memory of claim 2 or 4, wherein a transistor included in a logic circuit is provided on said semiconductor substrate, and a gate electrode of said transistor has a multilayer structure composed of one of said plurality of first conducting films and said second conducting film.

13. The semiconductor memory of claim 12, wherein a silicide layer is formed in a surface portion of said second conducting film.

14. The semiconductor memory of claim 12, wherein said second conducting film is a metal film.

15. The semiconductor memory of claim 2 or 4, wherein a transistor included in a logic circuit is provided on said semiconductor substrate, and a gate electrode of said transistor is made of said second conducting film alone.

* * * * *